US005870520A

United States Patent [19]
Lee et al.

[11] Patent Number: 5,870,520
[45] Date of Patent: Feb. 9, 1999

[54] FLASH DISASTER RECOVERY ROM AND UTILITY TO REPROGRAM MULTIPLE ROMS

[75] Inventors: Min Eig Lee, Stevensville; Jiming Sun, St. Joseph, both of Mich.

[73] Assignee: Packard Bell NEC, Sacramento, Calif.

[21] Appl. No.: 615,637

[22] Filed: Mar. 13, 1996

Related U.S. Application Data

[63] Continuation of Ser. No. 469,206, Jun. 6, 1995, which is a continuation of Ser. No. 995,803, Dec. 23, 1992, abandoned.

[51] Int. Cl.$^6$ ...................................................... G06F 11/00
[52] U.S. Cl. ................................ 395/182.04; 315/182.11; 311/40.2; 311/10.2
[58] Field of Search ........................ 395/182.03, 182.04, 395/182.05, 651, 652; 371/10.2, 10.3, 40.2

[56] References Cited

U.S. PATENT DOCUMENTS

| | | | |
|---|---|---|---|
| 5,077,737 | 12/1991 | Leger et al. | 371/10.1 |
| 5,109,505 | 4/1992 | Kihara | 395/575 |
| 5,111,457 | 5/1992 | Rabjohns et al. | 371/10.1 |
| 5,136,713 | 8/1992 | Bealkowski et al. | 395/700 |
| 5,159,671 | 10/1992 | Iwami | 395/250 |
| 5,200,959 | 4/1993 | Gross et al. | 371/21.6 |
| 5,210,875 | 5/1993 | Bealkowski et al. | 395/652 |
| 5,230,052 | 7/1993 | Dayan et al. | 395/700 |
| 5,268,870 | 12/1993 | Harari | 365/218 |
| 5,297,148 | 3/1994 | Harari et al. | 371/10.2 |
| 5,327,531 | 7/1994 | Bealkowski et al. | 395/164 |
| 5,432,927 | 7/1995 | Grote et al. | 395/652 |
| 5,659,748 | 8/1997 | Kennedy | 395/652 |

OTHER PUBLICATIONS

"Memory Products 1992," Intel Corporation, 1991, pp. 3–1 through 3–356 and 4–1 through 4–240.
"Z–Note User's Guide," Zenith Data Systems Corporation, 1992, Appendix A, pp. A–1 through A–14.
Application Note AP–325, *Guide to Flash Memory Programming*, Intel Corporation, May 1989.
Application Note AP–343, *Solutions for High Density Applications Using Intel Flash Memory*, Intel Corporation, Sep. 1991.
Application Data, *28F020 2048K(256KX8) CMOS Flash Memory*, Intel Corporation, 1991.
Application Data, :*MCOO4FLKA 4–M Byte Flash Memory Card*, Intel Corporation, Oct. 1991.
Application Data, *Am28F010 131,072x 8–Bit CMOS Flash Memory*, Advanced Micro Devices, Mar. 1991, pp. 4–70 through 4–100.
Application Data, *CAT28F010/CAT28F0101 \Megabit CMOS Flash Memory*, Catalyst Semiconductor Corporation, 1992, pp. 8–37 to 8–53.
Levy, Interfacing Microsoft's Flash File System Using Memory Under MS–DOS, Circuit Cellar Ink, *The Computer Applications Journal*, Issue 21, Jun./Jul. 1991, pp. 44–51.
Levy, Designing With Flash Memory Is There A New Alternative To EEPROM And SRAM, Circuit Cellar Ink, *The Computer Applications Journal*, Dec. 90/Jan. 91, pp. 50–58.
Johnson, Microsoft Pushes Flash Memory Standard, *Info World Magazine*, vol. 14, Issue 19, May 11, 1992.

*Primary Examiner*—Robert W. Beausoliel, Jr.
*Assistant Examiner*—Pierre Eddy Elisea
*Attorney, Agent, or Firm*—Fitch, Even, Tabin & Flannery

[57] ABSTRACT

A memory system includes a flash ROM for storing the instructions for the BIOS, as well as a flash recovery ROM and a utility for programming both flash ROMs. The memory system also provides for flash disaster recovery in order to enable reprogramming of the BIOS ROM during a condition when the data in the BIOS ROM is found to be corrupt. In particular, the flash recovery ROM is provided with a hardware protected block. Sufficient BIOS instructions (e.g., initialization functions) are provided in the protected area of the flash recovery ROM in order to enable the BIOS ROM to be reprogrammed by way of a flash recovery utility when the BIOS ROM becomes corrupt.

29 Claims, 9 Drawing Sheets

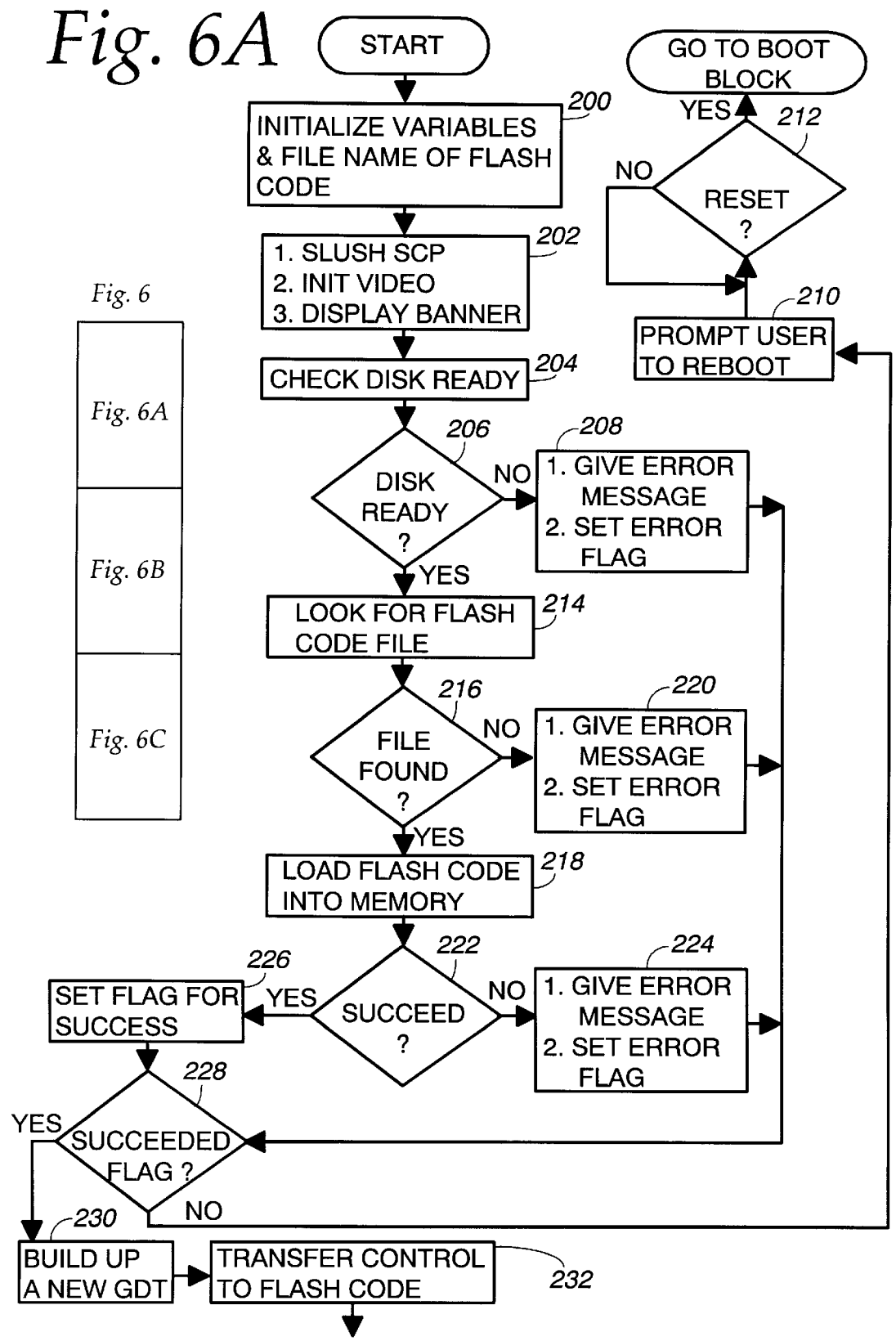

FLASH DISASTER RECOVERY ROM AND UTILITY TO REPROGRAM MULTIPLE ROMS

This application is a continuation of Ser. No. 08/469,206 filed on Jun. 6, 1995, which is a continuation of application Ser. No. 07/995,803 filed Dec. 23, 1992, now abandoned.

CROSS-REFERENCE TO RELATED APPLICATIONS

The present application is related to U.S. patent application Ser. No. 07/885,805 entitled "FLASH ROM PROGRAMMER" filed May 15, 1992 by Clark Buxton and assigned to the same assignee as the assignee of the present application.

BACKGROUND OF THE INVENTION

1. Field of the Invention

The present invention relates to a memory system for a computer which includes flash read-only-memory (ROM) for storing programming instructions for the basic input/output system (BIOS) and, more particularly, to a flash memory system which includes a utility which allows multiple types of flash memory devices to be programmed with a single utility program, and also provides disaster recovery to enable the flash ROM to be reprogrammed in the event that the data in the flash ROM becomes corrupted.

2. Description of the Prior Art

IBM-compatible personal computers normally contain a set of routines on a ROM chip within the computer, known as the basic input/output system (BIOS). These BIOS routines primarily control the input/output functions of the computer's peripheral devices, such as the display, keyboard and disc drives. In particular, these BIOS routines act as an interface to translate various software commands for the peripheral devices from the various application programs and disc operating system (DOS) to commands that are compatible with the hardware. In addition, the BIOS includes routines contain information or perform tasks that are fundamental to other aspects of the computer's operation, such as keeping track of the date and the time of day, for example for identifying the time of creation of a file in a file allocation table (FAT).

Occasionally, the BIOS needs to be updated for various reasons. For example, early BIOS versions did not support 3½-inch floppy disc drives. Thus, older personal computers later equipped with 3½-inch disc drives required a BIOS change. There are other situations which could require a BIOS update. For example, existing computer systems may include a version of BIOS that does not support a compact disc ROM or newer graphic standards. When the computer is upgraded as such, it is necessary for the BIOS ROM, normally connected to the motherboard inside the computer housing, to be replaced with a new ROM that contains the updated BIOS. Thus, for such BIOS updating, it is necessary that the computer case be opened and the motherboard removed. Once the motherboard is removed, the ROM chip which contains the BIOS is then replaced with the new ROM chip which contains the updated version of the BIOS. The motherboard is then replaced and the computer case is closed. As such, replacement of the BIOS chip is rather cumbersome and often is done by a computer technician, which can be relatively expensive.

In an effort to facilitate updating the BIOS in a personal computer, there is a trend toward storing the BIOS on a flash ROM. Such flash ROM BIOS systems offer several known advantages over existing systems. Firstly, flash ROMs allow for block erase and relatively quicker programming than known electrically erasable read-only memories (EEPROM). Secondly, flash ROMs allow the BIOS to be updated in a portable personal computer rather quickly and efficiently. However, such flash ROMs are known to become corrupt due to various sources including power surges. Thus, in any computer system which utilizes flash ROM for BIOS, it is necessary to provide what is known as flash disaster recovery. Flash disaster recovery relates to the ability to reprogram the BIOS in the flash ROM once the flash ROM has been determined to be corrupt. One system for providing flash disaster recovery for a computer system which utilizes flash ROM for BIOS is disclosed in U.S. application patent Ser. No. 07/885,805, filed on May 15, 1992 entitled "FLASH ROM PROGRAMMER", assigned to the same assignee as the assignee of the present application. In that system, a special purpose hardware interface is provided which allows for mode switching of a standard parallel port from a standard peripheral interface, such as a printer interface, to a special purpose interface to enable the BIOS to be loaded from an external ROM or another computer connected to the parallel port. Although such a system provides for flash disaster recovery, it may not be beneficial for end users who do not have the resources to reprogram the flash ROM by way of the parallel port.

Another known use for flash ROM memory is in socalled solid state disc systems. In such systems, a flash ROM is used in place of or along with a floppy or hard disc. In one known application, the flash memory solid state disc is interfaced to application programs by way of a software interface, such as MicroSoft's Flash File System. However, the Flash File System requires a hardware dependent low level software driver. Thus, in applications that require multiple types of flash memory, additional software drivers are required which increases the software overhead of the system.

SUMMARY

It is an object of the present invention to solve various problems of the prior art.

It is another object of the present invention to provide a memory system for a computer which provides a flash ROM for the system BIOS.

It is yet another object of the present invention to provide a flash ROM memory system which includes means for allowing recovery from a flash disaster.

It is yet another object of the present invention to provide a system which allows for programming of multiple types of flash ROM memory.

BRIEF DESCRIPTION OF THE DRAWINGS

These and other objects of the present invention will be readily understood with reference to the following specification and accompanying drawing, wherein:

FIG. 6A is a flow diagram of a loader utility which forms a portion of the flash recovery utility in accordance with the present invention.

DETAILED DESCRIPTION OF THE PREFERRED EMBODIMENT

The present invention relates to a memory system for an IBM-compatible type personal computer. The memory system includes a flash read-only memory (ROM) for the basic input/output system (BIOS) and a flash recovery ROM. The flash recovery ROM, along with a flash recovery utility allows the BIOS ROM to be updated in the event the data therein becomes corrupt.

The use of a flash ROM for the BIOS allows for block erasure and in-circuit reprogramming of the BIOS in order to facilitate BIOS updates in personal computers. In particular, as will be discussed in more detail below, the system in accordance with the present invention enables the BIOS to be updated by way of a floppy disc. As such, the BIOS can be rather quickly and easily updated by an end user without the need to open the computer case; thus, obviating the need for a computer service technician.

In the event that the flash ROM containing the BIOS becomes corrupt, the flash recovery ROM is provided. The flash recovery ROM is provided with a hardware protected memory area that is virtually secure from corruption that includes program instructions for checking the validity of both flash ROMs (e.g., checksum) as well as sufficient BIOS functions (e.g., initialization functions) to enable the corrupt flash ROM containing the BIOS instructions to be reprogrammed by way of the flash disaster recovery utility. The recovery flash ROM is updated by way of a floppy disc in a similar manner as the BIOS flash ROM.

Figure 1:
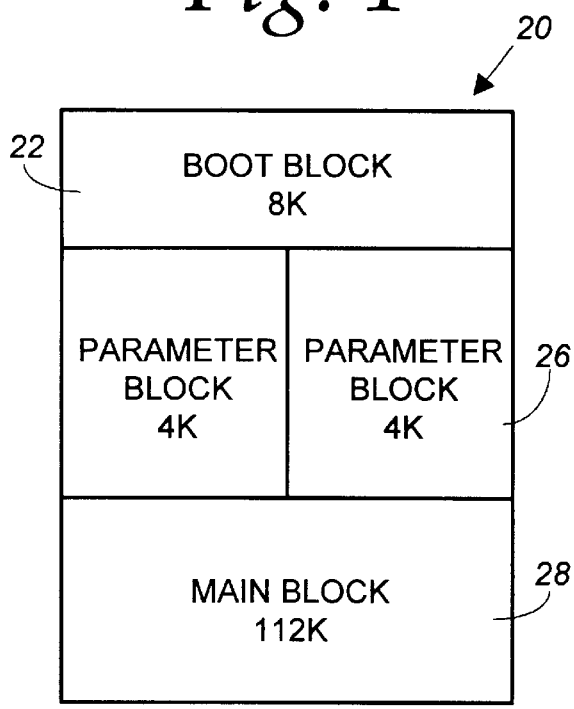
FIG. 1 is memory map of a flash recovery ROM which forms a portion of the present invention.
Figure 2:
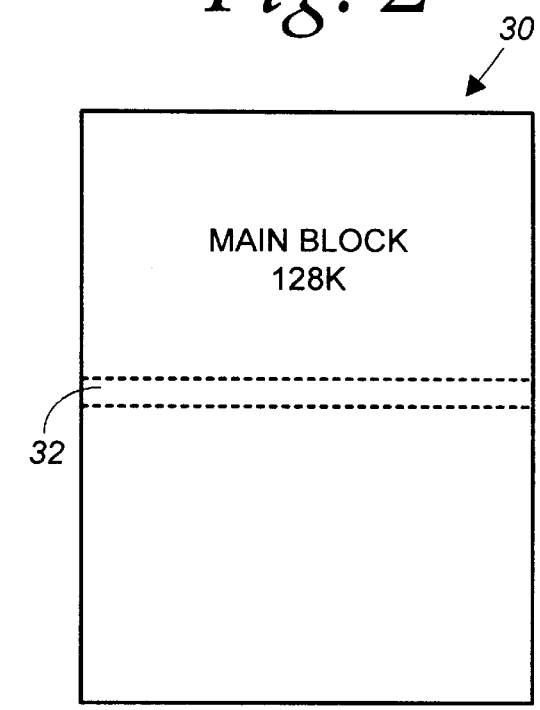
FIG. 2 is similar to FIG. 1 and illustrates a memory map of a BIOS ROM in accordance with the present invention.

The flash recovery ROM may be an Intel-type 28F001BX, for example. As shown in FIG. 1, the flash recovery ROM, generally identified with the reference numeral 20, includes an 8K byte hardware protected area 22, two parameter 4K byte block areas 24 and 26 and a 112K byte main block area 28. A memory map of an Intel-type 28F001BX is illustrated in FIG. 1, as disclosed in publication "MEMORY PRODUCTS 1992", by Intel copyright 1991, hereby incorporated by reference.

As indicated in FIG. 1, the protected area 22 is used as a boot block 22 for various BIOS functions discussed below, such as initializations functions, that are separated from the BIOS flash ROM to enable the boot block 22 to reprogram the BIOS flash ROM 30 in the event it becomes corrupt. In addition, the boot block is provided with a utility for performing checksums of both the flash recovery ROM 20 and the BIOS ROM 30.

The parameter blocks 24 and 26 are used for various purposes. For example, the parameter blocks 24 and 26, which are unprotected, may be used for less crucial functions, such as international language symbols which may be used, for example, in international sales applications.

The main block 28, which may be 112K, also unprotected, may be used for various utility programs, such as a battery management utility for monitoring and controlling battery power consumption for portable personal computers. The main block 28, as well as the parameter blocks 24 and 26, may be updated by a floppy disc in the same manner as the boot block 22.

An Intel-type 28F010 may be used as a BIOS ROM 30. However, although specific types and numbers of Intel flash ROMs are described and illustrated for the flash recovery ROM 20 and BIOS ROM 30, it should be clear that the present invention is not so limited.

The BIOS ROM 30 may be used for all of the BIOS functions except for the functions separated out and contained in the boot block 22 of the flash recovery ROM 20 as discussed above. In addition to BIOS functions, the BIOS ROM may include a flash programming utility program 32 in accordance with the present invention. As such, the flash programming utility 32 can be rather quickly and easily updated by way of a floppy disc by the end user.

An important aspect of the invention relates to the ability of the flash programming utility 32 to erase and reprogram multiple types of flash ROM (e.g., 20 and 30) with a single utility. As such, updating of the flash recovery ROM 20 and the BIOS ROM 30 is relatively quicker than other flash ROM programming utilities which are hardware-specific and thus only allow for programming of a single specific type of flash ROM. Moreover, since the flash programming utility system 32 is installed on the BIOS ROM 30, it may be updated by way of a floppy disc to enable additional or other types of flash ROM to be utilized.

Figure 3:
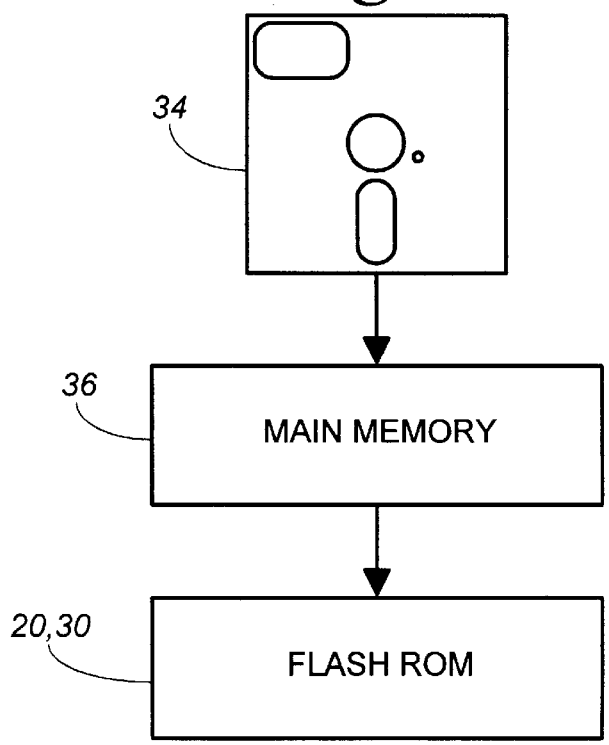
FIG. 3 is a simplified block diagram illustrating the memory transfer from a floppy disc to a flash ROM in accordance with the present invention.
Figure 4A:
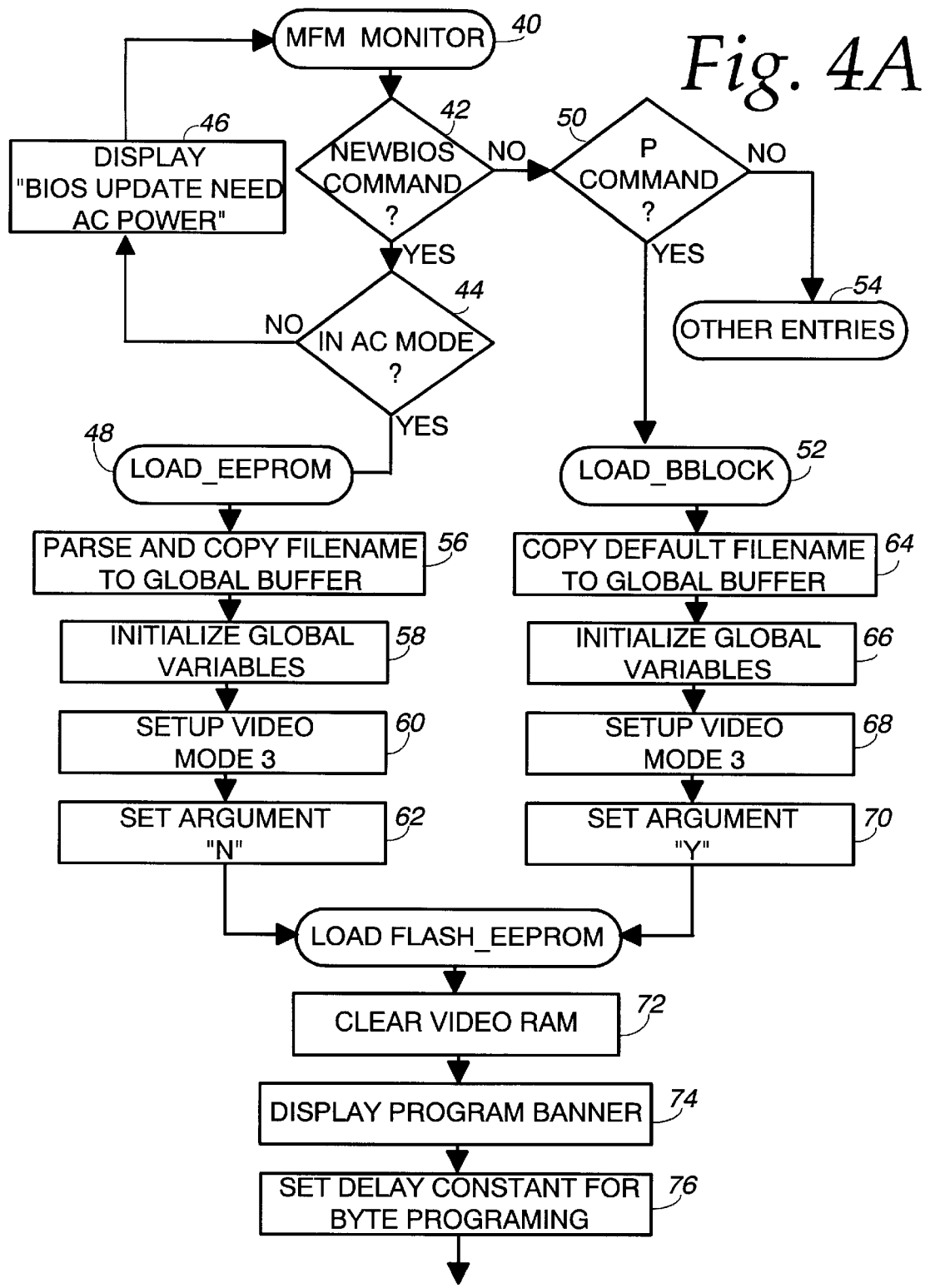
FIGS. 4A–4D are flow diagrams of the flash programming utility in accordance with the present invention.
Figure 4B:
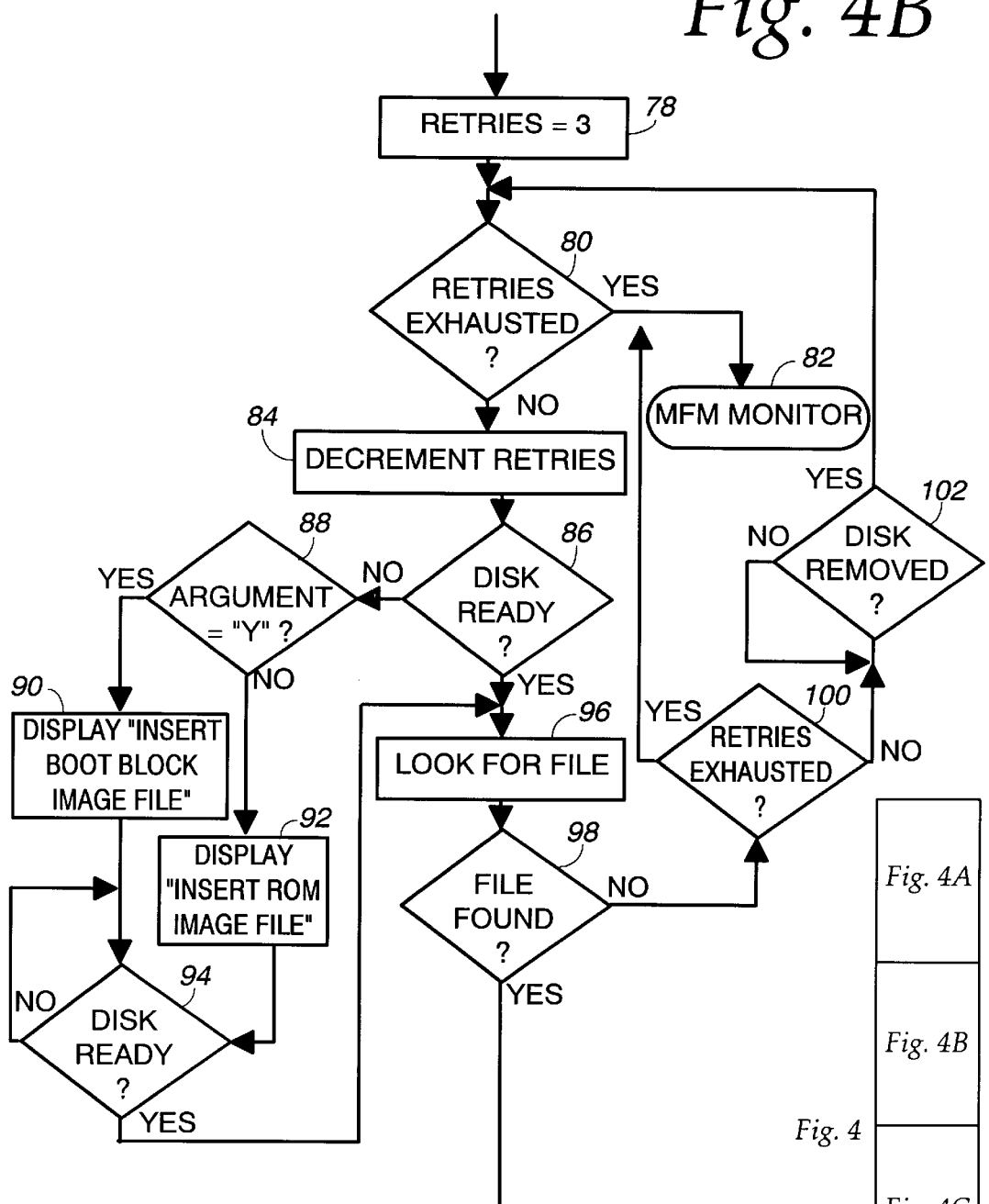
Figure 4C:
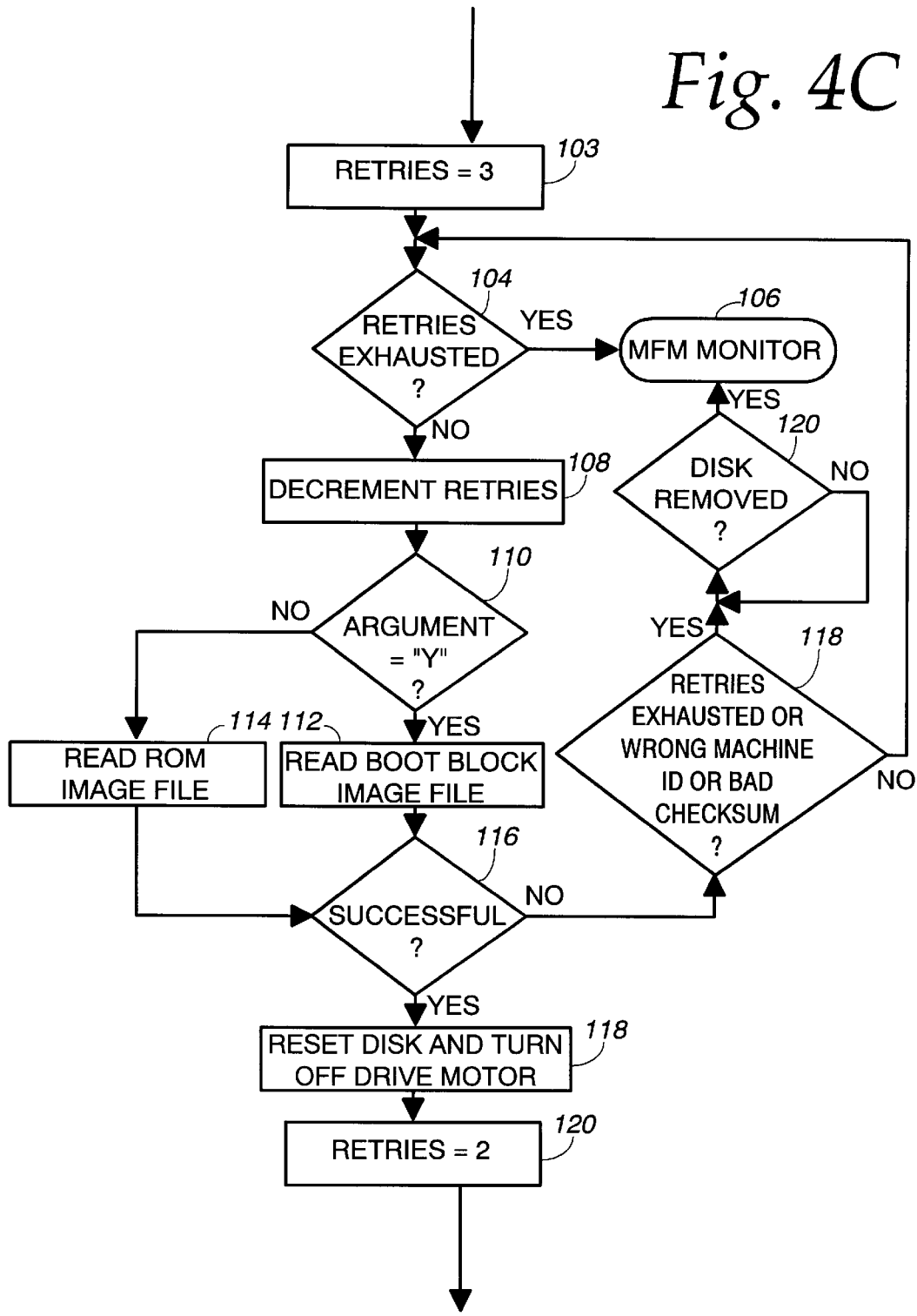
Figure 4D:
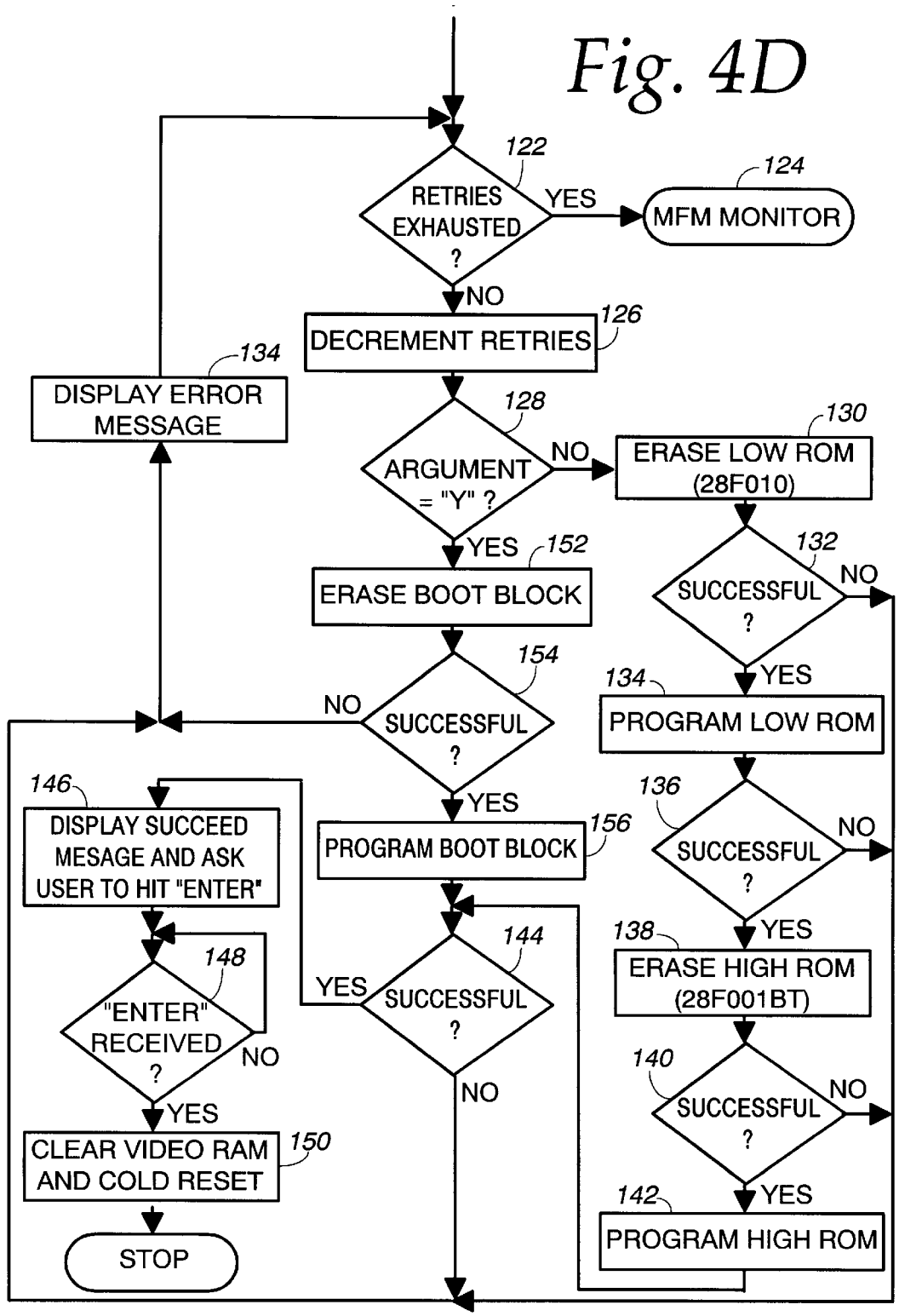
Figure 5:
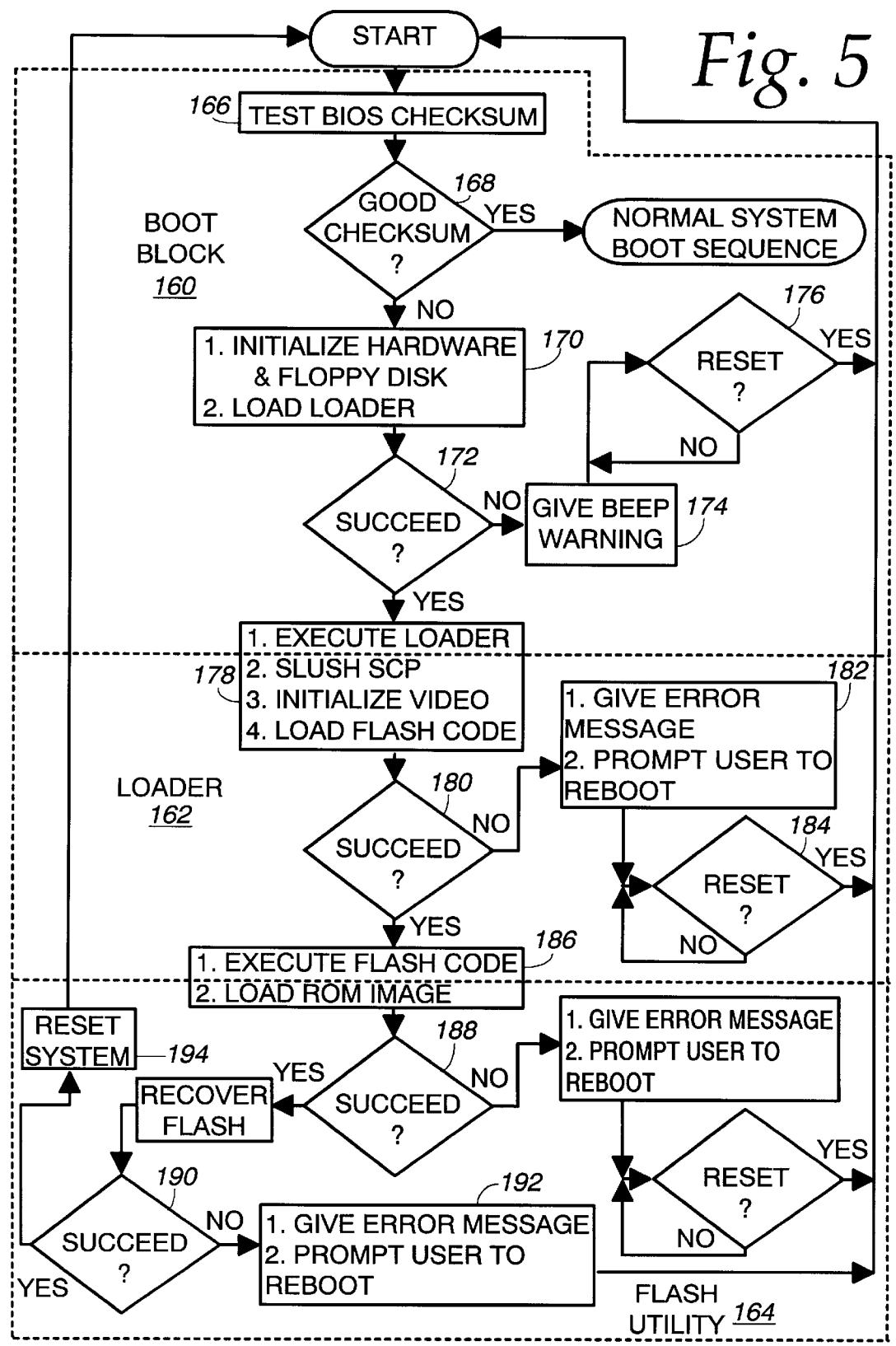
FIG. 5 is a system block diagram of a flash recovery utility in accordance with the present invention.

The flash programming utility in accordance with the present invention is illustrated in flow chart format in FIGS. 3 and 4, while a flash recovery utility is illustrated in FIGS. 5 and 6. A copy of the source code for the flash programming utility 32 is included in Appendix 1. It should be noted that portions of the source code files in Appendices 1 and 2 are provided with multiple versions. For example, the flash programming utility can be provided in a DOS based version which enables the BIOS ROM code to be updated from DOS. Another version (e.g., Appendix 1), is provided as a BIOS-based version. This version is installed in a ROM (not shown) during manufacturing installation. Thereafter, the system is updated by way of a floppy disc by the end user by way of the BIOS-based version.

A simplified block diagram illustrating the sequence of memory transfer of the flash programming utility system in accordance with the present invention is illustrated in FIG. 3. Updates for the flash recovery ROM 20 as well as the BIOS ROM 30 are provided in the form of image files on a floppy disc 34. Since flash ROMs are block erased, the updated portion, as well as the unchanged portion of the boot block 22 or the BIOS ROM 30, is included on an image file on the floppy disc 34. In the case of the flash recovery ROM 20, the memory is segmented into the four blocks 22, 24, 26 and 28 as discussed above. Thus, any of the particular blocks 22, 24, 26 and 28 can be updated at one time. On the other hand, the BIOS flash ROM 30 contains a single 128 kilobyte main block. Thus, this block is updated at one time.

For simplicity, the flash programming utility is illustrated and discussed for updating the boot block 22 in the flash recovery ROM 20 as well as the main block of the BIOS ROM 30. As will be discussed in more detail below, various commands are used for updating the main block of the BIOS ROM 30, the main block 28, the two parameter blocks 24 and 26 and the boot block 22 of the flash recovery ROM 20. It will be understood by those of ordinary skill in the art that other commands could be used to update the parameter blocks 24 and 26 as well as the main block 28 of the flash recovery ROM 20.

Referring to FIG. 3, the particular block to be updated (e.g., boot block 22 or BIOS ROM 30 main block) are disposed on an image file on the floppy disc 34. Initially, the image file is transferred to main memory 36. Once the image file is transferred to the main memory 36, a checksum of the image file is performed in order to ascertain the validity of the file. This is done to avoid unnecessarily programming the flash ROM. The program instructions for performing the checksum are contained in the flash utility. If the checksum of the image file is determined to be valid, the image file is transferred to the particular flash ROM 20 or 30. As indicated above, an important aspect of the flash programming utility is that it can be used with multiple types of flash ROM.

Referring to FIG. 4, the flash programming utility may be entered from a monitor program (identified as MPM) primarily used to monitor and decode various keyboard (not shown) entries. In Zenith Data System (ZDS) computers, the monitor program may be entered by simultaneously depressing the keys CTL-ALT-INSERT after the DOS prompt. The ZDS monitor program is described in "Z-NOTE USER'S GUIDE" by Zenith Data Systems Corporation, Copyright 1992, hereby incorporated by reference. In non-ZDS computers slight modifications would have to be made to the DEBUG program in order to enter the utility program in accordance with the present invention. Such DEBUG modifications are well within the ordinary skill in the art and do not form a part of the present invention.

Once in the monitor program, the flash programming utility in accordance with the present invention is accessed by typing specific commands by way of the keyboard. For example, a NEWBIOS command is used to update the main block of the BIOS flash ROM 30, the main block 28 and the two parameter blocks 24 and 26 of the flash recovery ROM 20. A P command is used to load the boot block 22 of the flash recovery ROM 20. Thus, once in the monitor program, identified with the reference numeral 40, the system awaits a command from the keyboard. The commands are decoded in order to determine whether a NEWBIOS or P command has been entered. In particular, the system checks for a NEWBIOS command in step 42. In applications for portable personal computers, if a NEWBIOS command has been entered at the keyboard, the system checks to determine if the computer is in an AC mode in step 44 in order to conserve battery power. In particular, as mentioned above, the entire BIOS flash ROM 30 is block erased and updated at one time. Thus, in the case of, for example, an Intel 28F010, an entire 128 kilobytes is erased at once. Thus, in such an application, the system checks in step 44 to determine if the computer system is in an AC mode to avoid a flash disaster which may occur as a result of an interrupted BIOS update process due to a drain of the battery. If a NEWBIOS command has been entered and the system is not in an AC mode of operation, a user message is displayed in step 46; BIOS UPDATE NEED AC POWER. Once the computer system is determined to be in the AC mode, the system loads the update from an image file on the floppy disc 34 into main memory 36 and eventually into the main block of the BIOS ROM 30 by way of a LOAD_EEPROM function 48.

As mentioned above, in order to update the boot block 22 of the flash recovery ROM 20, the P command is utilized. In particular, if the system determines that a NEWBIOS command has not been input in step 42, it checks in step 50 whether a P command has been entered. If a P command has been entered, the system proceeds to the LOAD_BBLOCK function in step 52. If neither a NEWBIOS nor a P command have been input as determined in step 50, the system may proceed to other entries as identified with the reference numeral 54.

The LOAD_EEPROM and LOAD_BBLOCK functions 48 and 52 are illustrated in FIG. 4A. If the NEWBIOS command was entered at the keyboard in step 42, the target file name (e.g., boot block or BIOS) is parsed and copied to a global buffer in step 56. In addition, buffer space for the image file is requested. After the file name is parsed and copied to the global buffer, the global variables (e.g., disc drive parameters) are initialized in step 58. Once the global variables are initialized in step 58, Video Mode 3 is set up in step 60 to display text in a color mode. Video Mode 3 may be set with interrupt 10H. Subsequent to step 60, the argument for the LOAD_FLASH_EEPROM function is set in step 62.

If the NEWBIOS command was entered, the argument of the LOAD_FLASH_EEPROM function is set to the character N. If the P command has been entered, the argument of the LOAD_FLASH_EEPROM function is set to the character Y as will be discussed below. If the P command was selected, the LOAD_BBLOCK function 52 will be executed. The P command relates to update of the boot block 22 in the flash recovery ROM 20. The LOAD_BBLOCK function 52 is initiated by copying the file name for the boot block to the global buffer in step 64. Subsequently, the global variables are initialized in step 66 and Video Mode 3 is set up in step 68.

The arguments N and Y are used to control the operation of the LOAD_FLASH_EEPROM function. In particular, the argument N is used to indicate that the BIOS flash ROM 30 is to be updated, while the argument Y is used to indicated that the boot block 22 of the flash recovery ROM 20 is to be updated.

Once the argument of the function LOAD_FLASH_EEPROM is set by the LOAD_EEPROM or LOAD_BBLOCK functions 48 and 52, respectively, the video RAM is cleared in step 72 to enable a program banner to be displayed in step 74. The program banner may be the title of the program, for example, FLASH EEPROM PROGRAMMING UTILITY. After the program banner is displayed in step 74, the delay constant is set for byte programming in step 76. This delay constant is set to erase and program the flash devices properly.

After the delay constant is set, the number of retries is set at three in step 78 for determining if the floppy disc containing the flash ROM update has been inserted in the appropriate drive. The system checks whether the retries are exhausted in step 80. If the retries are exhausted, the system returns to the monitor program in step 82. If the retries are not exhausted, the number of retries is decremented in step 84. After the number of retries is decremented in step 84, the system next checks in step 86 to determine if the disc has been inserted in the appropriate drive in step 86. If not, the system checks the argument of the LOAD_FLASH_EEPROM function in order to display the appropriate user message. More particularly, the argument of the LOAD_FLASH_EEPROM function is checked in step 88. If the argument is determined to be the character Y, the user message INSERT BOOT BLOCK IMAGE FILE is displayed in step 90. If the argument of the LOAD_FLASH_EEPROM function is not the character Y, the user message INSERT ROM IMAGE FILE is displayed in step 92. After the appropriate user message is displayed in either step 90 or 92, the system again checks in step 94 to determine if a disc has been inserted in the appropriate drive in step 94. If a disc has not been inserted after the user messages have been displayed, the system will loop back to step 94 and wait for the disc insertion. Once a disc has been inserted in the appropriate drive, the system checks the disc for the appropriate file in step 96. In particular, the system determines in step 98 whether the disc contains appropriate file by comparing the file names on the disc with the target file name stored in the global buffer. If the file is not found, the system checks in step 100 to determine if the number of retries has been exhausted. If so, the system returns to the monitor program 82. If not, the system checks in step 102 to determine if the disc has been removed. If so, the system returns to step 80.

Three retries are set in step 103 for reading the appropriate image file. If the desired image file is found on the floppy disc, the system checks in step 104 whether the retries have been exhausted. If so, the system returns to the monitor program in step 106. If not, the retries are decremented in step 108 and the argument of the LOAD_FLASH_EEPROM function is checked in step 110 in order to read the appropriate image file into the main memory 36. In particular, if the argument of the LOAD_FLASH_EEPROM function has been set to Y, the boot block image file is read into main memory in step 112. If not, the BIOS image file is read into main memory in step 114.

Once the appropriate image file has been read into main memory 36, the system checks to determine if that operation was successful in step 116. In addition, the system does a checksum of the image file to determine if it is valid. The system also checks in step 118 the machine identification code. This is done in order to determine if the floppy disc has the proper BIOS image file for the machine in order to avoid unnecessarily programming the BIOS flash ROM 30. The system also checks in step 118 whether the retries for reading either the BIOS image file or the boot block image file have been exhausted. If the retries have been exhausted or the floppy disc contains the incorrect BIOS file for the particular machine or the BIOS image file is determined to be corrupt as a result of the checksum, the system may display a user message prompting the user to remove the floppy disc as part of step 118. Subsequently, the system waits until the disc is removed from the drive in step 120. Once the floppy disc is removed from the drive, system control returns to the monitor program in step 106.

If the reading of the BIOS image file or boot block image file into the main memory 36 was successful in step 116, the floppy disc drive is reset and the drive motor is turned off in step 118. The system then sets the number of retries for two for programming the BIOS ROM 30 and the flash recovery ROM 20 in step 120. In step 122, the system checks to determine if the number of retries has been exhausted. If so, program control is returned to the monitor program in step 124. If not, the number of retries is decremented in step 126. Subsequently, the system checks the argument of the LOAD_FLASH_EEPROM function in step 128. If the argument of the LOAD_FLASH_EEPROM function was set for Y, this means that a P command was entered, indicating programming of the boot block 22 of the flash recovery ROM 20. If not, the system proceeds to erase the BIOS ROM 30 in step 130. The system then checks in step 132 to determine if the erasure was successful. If not, an error message is displayed in step 134. Subsequently, the system loops back to step 122 until the retries are exhausted. Once the system determines that the BIOS ROM 30 was successfully erased, the BIOS ROM 30 is programmed in step 134. The system then checks in step 136 to see if the programming of the BIOS ROM 30 was successful. If not, an error message is displayed in step 134 and the cycle is repeated until the retries are exhausted. If so, the system proceeds to step 138 to erase the main block 28 and the two parameter blocks 24 and 26 of the flash recovery ROM 20 in step 138. If the erasure of the main blocks 24, 26 and 28 of the flash recovery ROM 20 was successful as determined in step 140, the image of those blocks from the main memory is programmed into the corresponding block of the flash recovery ROM 20 in step 142. The system then checks to determine if the programming of those blocks was successful in step 144. If the programming of those blocks is found to be unsuccessful, an error message is displayed in step 134 and the cycle is repeated until the retries are exhausted. If the programming of the blocks 24, 26 and 28 was successful, a message is displayed in step 146 requesting the user to touch the ENTER key on the keyboard (not shown). If the ENTER key is depressed, the video RAM is cleared in step 150 and the system initiates a cold reset 150.

If the P command was depressed from the monitor program, indicating that the boot block 22 of the flash recovery ROM is to be updated, the argument of the LOAD_FLASH_EEPROM function will have been set to the character Y causing the boot block 22 of the flash recovery ROM 20 to be erased in step 152. Subsequently, in step 154, the system checks to determine if the erasure was successful. If not, an error message is displayed in step 134 and the system returns to step 122 until the number of retries are exhausted. If the erasure was successful, the boot block 22 of the flash recovery ROM 20 is reprogrammed in step 156. After reprogramming of the boot block 22, the system again checks in step 144 to determine if the programming was successful. If not, an error message is displayed on the monitor in step 134 and the cycle is repeated until the number of retries has been exhausted. If so, a message is displayed prompting the user to depress the ENTER key in step 146. The system waits in step 148 for the ENTER key to be depressed. Once it is depressed, the video RAM is cleared in step 150 and a cold reset is initiated.

An important aspect of the invention is the ability of the programming utility in accordance with the present invention to program different types of flash memory devices with a single utility. In addition to minimizing the software overhead for programming different types of flash memory devices within a computer system, the system also provides for faster programming since a single floppy disc can be used to program multiple types of flash memory devices. Moreover, if the checksum routine was utilized with 32-bit register addressing (e.g., executed in protected mode for an Intel-type 80×86 based machine), an entire image file (i.e., 128K byte) can be executed in a single operation in order to circumvent the 64K byte DOS limitation resulting from 16-bit register addressing to provide for faster flash ROM programming.

Flash Disaster Recovery

As mentioned above, another important aspect of the invention relates to the ability of the system to recover from a flash disaster. As discussed above, a flash disaster relates to a condition when the data in flash ROMs and, in particular, the BIOS ROM 30, becomes corrupt as determined by a checksum. The flash disaster recovery utility in accordance with the present invention provides for recovery (e.g., ability to reprogram flash ROMs 20, 30) in such a condition. In particular, the flash disaster recovery utility includes three segments: a boot block segment 160, a loader segment 162 and a flash utility segment 164. These segments are identified by the dashed boxes in FIG. 5. As noted above, certain of the normal BIOS functions are separated out and stored in the boot block 22 in order to enable recovery of the system when a ROM image file has been found to be corrupt. In particular, the principal BIOS function separated out relate to those basic BIOS functions used for initialization of hardware. In addition to the BIOS hardware initialization function, the boot block 22 also includes a utility for performing a checksum of the BIOS ROM 30 as discussed above. Lastly, the boot block utility 160 is also used to load the loader utility 162 into main memory 36. As will be discussed in more detail below, the loader utility 162 is used, in turn, to load the flash recovery utility 164 in order to allow the flash ROMs 20 and 30 to be reprogrammed whenever a checksum of the data within these devices is determined to be corrupt.

Figure 6B:
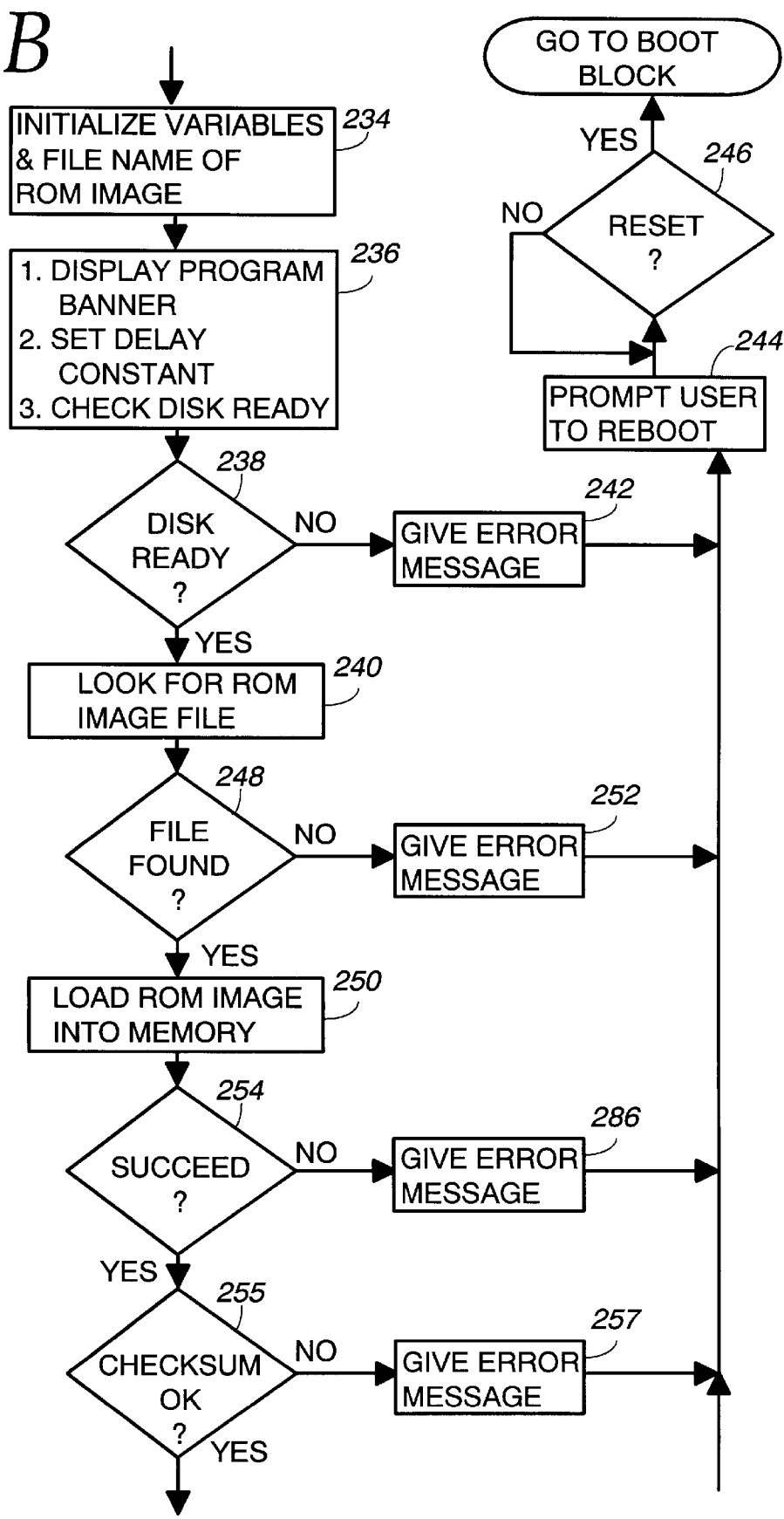
FIG. 6B is a flow diagram of a flash utility which forms a portion of the flash recovery utility in accordance with the present invention.
Figure 6C:
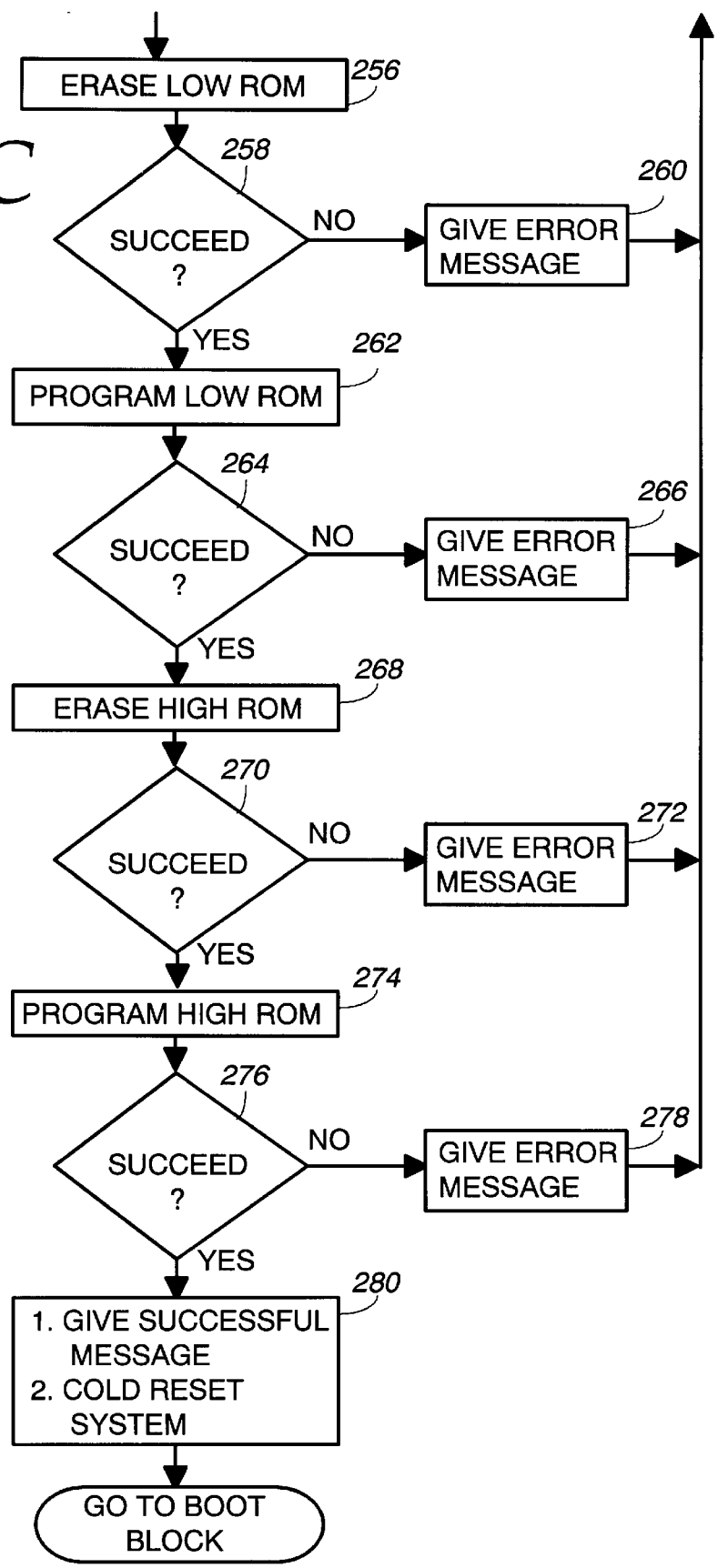
FIG. 6C is a flow diagram of a flash utility in accordance with one portion of the invention.

A generalized block diagram of the entire flash disaster recovery utility illustrating the boot block segment 160, the loader segment 162, as well as the flash utility segment 164 is illustrated in FIG. 5. A more detailed flow diagram of the loader utility 162 (FIG. 6B) and the flash utility 164 is illustrated in FIGS. 6A and 6B. Additionally, the source code for the loader utility 162 (FIG. 6B) which includes the source code files PPLOADER.C, PLDFLASH.C and PPBBINTF.ASM is included in Appendix 2. The source code for the flash utility 164 (FIG. 6C) includes the files PPFLOPPY.C, FLDFLASH.C, PPBBINTF.ASM and FPPINTL.C, also illustrated in Appendix 2. It is also to be noted that the source code files in Appendix 2 may be implemented in a protected mode to enable full 32-bit addressing. As indicated above, 32-bit addressing enables a single checksum to be executed for an entire 128 kilobytes. As such, the checksum execution can be done relatively quicker than other systems which utilize separate checksum utilities for each 64 kilobyte segment in the system. Accordingly, in a system utilizing a 128 kilobyte flash ROM, two such checksum operations would be required for each flash ROM; thus requiring a relatively longer time period to reprogram the flash ROM.

As mentioned above, the boot block 22 contains program instructions for performing a checksum of the BIOS ROM 30 in step 166. If the checksum of the BIOS ROM 30 indicates the data in the BIOS ROM 30 is valid in step 168, the system executes a normal system sequence. If the checksum indicates that the data in the BIOS ROM 30 is corrupt, the boot block utility 22 performs certain BIOS functions and additionally loads the loader utility 162 into main memory 36 to enable the flash recovery utility. In particular, as indicated by step 170, the boot block utility 160 initializes hardware as well as the floppy disc in step 170. The boot block utility also loads the loader utility 162 into main memory 36 in step 170. After the hardware and floppy disc has been initialized and the loader utility 162 has been loaded, the system checks in step 172 to determine if the loading of the loader utility 162 was successful in step 172. If not, an aural warning is generated in step 174. Subsequent to the aural warning in step 174, the system waits in step 176 for a system reset. Once the system is reset, the system control is returned to step 166 and the cycle may be repeated.

If the system determines that the loader utility 162 was successfully loaded into main memory 36, the system executes the loader utility in step 178, as will be discussed in more detail below. In addition to executing the loader utility 162, the system slushes an SCP call to main memory 36 from the floppy disc 34. In particular, during a condition when the BIOS ROM 30 has been determined to be corrupt, an additional BIOS function is included on the floppy disc with the flash ROM update and is loaded into main memory 36. More specifically, for portable personal computers which normally use liquid crystal displays (LCD), a system control processor (SCP) call is used to check the LCD type. In addition, the SCP call controls the programming voltage $V_{pp}$ as well as having responsibility for auto-reset of the system.

In addition to slushing the SCP call, the video RAM is initialized and the flash utility 164 is loaded into main memory 36. The system next checks in step 180 whether these functions were successful. If not, the system provides a visual error message and prompts the user to re-boot in step 182. After the visual error message is provided, the system waits for reset in step 184. After reset, the system returns to step 166.

If the functions identified in step 178 are found to be successful, the flash utility 164 is executed in step 186. As will be discussed in more detail below, execution of the flash utility 164 includes loading of the ROM image from the floppy disc 34 into main memory 36 and finally into the flash ROM. If this operation is successful, as determined in step 188, the system then checks to see if the flash recovery was successful in step 190. If not, a visual error message is generated and the user is prompted to re-boot in step 192. If the flash recovery is successful, as determined in step 190, the system is reset in step 194.

The loader utility 162 is illustrated in FIG. 6A. This utility, identified as file PPLOADER.C in Appendix 2, is used to load the flash programming utility 164 from a floppy disc 34 into main memory 36. Subsequently, control is transferred to the flash programming utility 164 to update the flash ROM 20, 30 which has been corrupted. The utility is set up to operate in the protected mode using the global descriptor table (GDT).

As illustrated in FIG. 6A, initially, in step 200, variables are initialized and buffer space is requested for the ROM image file. In particular, the loader utility 164 is provided with sufficient code to perform all its own BIOS functions. Accordingly, various disc variables such as number of sectors per track, sector size, cluster size and head number are initialized. In addition, buffer space is requested for the ROM image file and the file allocation table (FAT). More particularly, the floppy disc 34 used for flash disaster recovery to update the flash ROMs 20, 30 is a DOS-formatted disc which includes a boot sector and a FAT table. As such, memory space for the FAT table and the ROM image file is reserved in step 200. In addition, the target name of the ROM image file for the flash utility 164 is copied into a global buffer.

As mentioned above, an SCP call is used for various functions including checking the LCD type; controlling of the LCD; controlling of the programming voltage $V_{pp}$ and control of reset. During a flash recovery mode of operation, the SCP code is stored on the floppy disc 34. Accordingly, this SCP code is copied to main memory 36 in step 202. In addition, the video RAM is initialized and a banner is displayed which, for example, may indicate the name of the utility; flash programming utility.

Next, in steps 204 and 206, the system checks to see if a floppy disc containing the flash programming utility 164 has been inserted in the designated drive. If not, an error message is displayed and an error flag is set in step 208. The system may permit several retries after which the user may be prompted to re-boot in step 210. After the user prompt, the system awaits reset in step 212, after which it returns to the boot block.

If the disc is ready in step 206, the utility looks for the flash ROM image file on the floppy disc 34 in step 214. This is done by first locating the FAT table. After the FAT table is located on the floppy disc 34, it is loaded into the main memory along with the root directory. Subsequently, the root directory is searched for the flash ROM image file name that was stored in the global buffer in step 200 in step 216. If the flash ROM image file is found, it is loaded into main memory in step 218. If not, an error message is displayed and error flag is set in step 220.

The system then checks to determine if the operation of loading the ROM image file into main memory was successful in step 222. If not, an error message is displayed and an error flag is set in step 224. If the image file was successfully loaded into main memory 36, a success flag is set in step 226. Once the system acknowledges that the success flag is set in step 228, the GDT is updated in step 230. Once the GDT is updated, control is transferred to the flash programming utility 164 in step 232.

As illustrated in FIG. 6B, once control is transferred to the flash programming utility 164, the variables are initialized and the file name of the ROM image file is copied to the global buffer in step 234. Subsequently, in step 236, the program banner, identifying the flash programming utility, is displayed. Additionally, the utility sets the program delay constant as well as checks for disc insertion in step 238. If the disc has been inserted into the appropriate drive, the utility searches for the ROM image file in step 240. If not, an error message is displayed in step 242 and the user is prompted to re-boot in step 244. Once the user is prompted to re-boot, the system waits for a reset in step 246, after which the system transfers to the boot block.

The system next checks for the ROM image file in step 248 by comparing file names in the root directory with the target file name copied to the global buffer. If the ROM image file is located, it is loaded into main memory 36 in step 250. If the ROM image file is not located, an error message is displayed in step 252.

As illustrated in FIG. 6B, once the image file is successfully loaded into main memory 36, the system checks in step 254 to determine if the operation was successful. If not, an error message is displayed in step 256. Subsequently, a checksum of the image file is performed in step 255. If the checksum indicates corrupt data, an error message is given in step 257. If the checksum indicates that the data in the image file is valid, the system proceeds to erase the flash BIOS ROM 30 which is located in the lower address space in step 256. Once the BIOS ROM 30 is erased, the system checks in step 258 to determine if the erasure was successful in step 258. If not, an error message is displayed in step 260. If the erasure was successful, the ROM image file in main memory is programmed into the flash ROM 30 in step 262. The system next checks in step 264 to determine whether programming of the flash ROM 30 was successful. If not, an error message is displayed in step 266. If erasure and programming of the BIOS ROM 30 was successful, the system next proceeds to erase the main block and two parameter blocks of the flash recovery ROM 20 in step 268. After those blocks of the flash recovery ROM 20 have been erased, the system next checks to see if the erasure was successful in step 270. If not, an error message is displayed in step 272. If so, the blocks 24, 26 and 28 of the flash recovery ROM 20 is programmed with the ROM image file in main memory in step 274. The system next checks to determine if programming of the those blocks was successful in step 276. If not, an error message is displayed in step 278. If the blocks 24, 26 and 28 of the flash recovery ROM 20 are successfully programmed, the system displays a user message indicating that the recovery was successful and proceeds to initiate a system reset in step 280. Subsequently, the system returns to the boot block 22.

The programming utility described above enables multiple types of flash ROMs to be reprogrammed during a single operation. In addition, in the event that the data in the flash ROM becomes corrupt, a recovery utility is provided which enables the flash ROM to be reprogrammed during such a condition.

Various implementations of the programming utilities are contemplated. In one implementation, it is contemplated that the system utilize 32-bit register addressing. By enabling 32-bit register addressing, the checksum routines performed on the ROMs and ROM image files can be performed in a single operation, thus speeding up the operation.

It should be noted that the instructions for erasing and programming the specific Intel-type flash ROM identified herein are described in detail in a publication entitled "MEMORY PRODUCTS 1992", supra, hereby incorporated by reference. In addition, the specific flash ROM programming instructions are also included in the appropriate source code files in Appendices 1 and 2.

Obviously, many modifications and variations of the present invention are possible in light of the above teachings. Thus, it is to be understood that, within the scope of the appended claims, the invention may be practiced otherwise than as specifically described above.

APPENDIX 1
-23-

```c
/***************************************************************/
/* File: PPROM.C                                               */
/*           Phoenix: Flash EEPROM Programming Utility         */
/*                                                             */
/* Purpose: This program programs the Flash EEProm in the system from a */
/*      disk file. This utility is a BIOS based version that can make   */
/*      use of all the BIOS services available. This utility is used to */
/*      update the Flash EEPROM    contents from one release of BIOS ROM */
/*      code to another. This utility must do ALL the disk work itself  */
/*      since the DOS services are not available. This utility is burned*/
/*      into an EPROM device and placed      on the "PPROM" adaptor. It is */
/*      used to install the BIOS ROM code into the Flash EEPROM when the*/
/*      Flash EEPROM checksum is invalid. (i.e., Manufacturing install) */
/*                                                             */
/***************************************************************/ include "ascii.h"      /* Defines common ASCII chars   */
include "disk.h"       /* Structures for disk handling */
include "pprom.h"      /* Constants/structures for pgm */ define     FALSE 0
define     TRUE !(FALSE)

/***************************************************************/
/*              TITLE VARIABLES                                */
/*                                                             */
/* Variables required/used by the main body of the LDFLASH program */
/***************************************************************/

/* Messages to appear on the screen as part of the program title. */
char    version_message[]       = "  BIOS based version, Revision #2.1";
char    version_date_message[]  = "         Jan. 29, 1992";

char    default_filename[]      = "ROMIMAGE.BIN\0";
char    bblock_filename[]       = "BBIMAGE.BIN\0";
/***************************************************************/
/*              Local Procedure Prototypes                     */
/***************************************************************/
void    near    Setup_Environment();
int     near    Read_Disk(int, int, void far *);
int     near    Get_Next_FAT_Index(unsigned int *);
int     near    Compare_Names (char *, char *);
int     near    Check_abort();

/***************************************************************/
/* PPROM.C         PPROM Update Initialization                 */
/*                                                             */
/* Purpose: This routine is the initialization section of the BIOS based*/
/*      utility program. Its function is to setup the environment for   */
/*      the main body of the program. This file contains the 'Main'     */
/*      section for the C program. The body is called as a function.    */
```

```
/*                                                                          */
/* Parameters: filenam.ext (optional, file containing the ROM image)        */
/*                                                                          */
/* Inputs: The named file or the default file.                              */
/*                                                                          */
/* Outputs: BIOS ROM code to the Flash EEPROM.                              */
/*                                                                          */
/* Return Value: none.                                                      */
/*                                                                          */
/* Operation:                                                               */
/*      - request buffer space for the BIOS ROM image (248K)                */
/*      - parse the filename from the command line, if given                */
/*      - call the program body                                             */
/*      - return to the Monitor Prompt                                      */
/*                                                                          */
/****************************************************************************/ void far
Load_EEPROM (char far *entry_string)
{
    int             index;          /* Loop control var         */

Setup_Environment ();

/******* Check for and parse the optional filename on the command line **/
    if (entry_string = = NULL)                  /* Invalid input, use default   */
    { /* Calling pgm in error, use default */
        entry_string = &default_filename[0];    /* filename    */
    } while ((*entry_string != ' ')               /* Skip to whitespace, if any   */
        && (*entry_string != '\0'))
    { /* skip past this program name in string    */
        entry_string++;
    }
    while ((*entry_string = = ' ')              /* Skip all whitespace          */
        && (*entry_string != '\0'))
    { /* skip past separating blanks    */
        entry_string++;
    }
    if (*entry_string = = '\0')                 /* No optional filename given   */
    { /* End of string, use default    */
        entry_string = &default_filename[0];    /* Make it point at default value   */
    } for (index = 0; index < FNAME_SIZE + FEXT_SIZE; index++)
    { /* Clear & pad out the work space    */
        globals.image_filename[index] = ' ';    /* Clear name buffer to blanks */
    }
```

```
/* Copy target name into global buffer and do padding/truncation      */
for (index = 0; (index < FNAME_SIZE)
            && (*entry_string! = '.')
            && (*entry_string! = '\0'); index + +, entry_string + +)
{ /* Turn off bit 5 to make lower case into upper case            */
        globals.image_filename[index] =             /* Converting to upper case      */
            (char)(*entry_string & (*entry_string > = 'a' ? 0xDFU : 0xFFU));
}
while ((*entry_string! = '.')                /* truncate long names by      */
    && (*entry_string! = '\0'))          /* skipping all chars til '.'    */
{ /* Advance to next char position    */
    entry_string + +;
}
if (*entry_string = = '.')                   /* Skip the period in the filename   */
{ /* Advance to next char position    */
    entry_string + +;
}
for (index = 0; (index < FEXT_SIZE)          /* Copy extension (if any)       */
            && (*entry_string! = '\0'); index + +, entry_string + +)
{ /* Turn off bit 5 to make lower case into upper case           */
        globals.image_filename[FNAME_SIZE + index] =    /* Converting to upper case */
            (char)(*entry_string & (*entry_string > = 'a' ? 0xDFU : 0xFFU));
} asm MOV AX,0003H;                       /* Use Int 10 call to set video mode 3  */
asm INT 10H;                            /* Clear screen & Prep for programming  */

Load_Flash_EEPROM ('N');                /* Call the main body of program*/ asm MOV AX,0003H;                       /* Use Int 10 call to set video mode 3  */
asm INT 10H;                            /* Clear screen & return to Monitor   */

} /* end Main */

/*****************************************************************/
/* PPROM.C       BOOT BLOCK Update Initialization         */
/*                                                        */
/* Purpose: This routine is the initialization section of the BOOT    */
/*      BLOCK update program. Its function is to setup the environment */
/*      for the main body of the program. This file contains the 'Main' */
/*      section for the C program. The body is called as a function.  */
/*                                                        */
/* Parameters: filenam.ext (optional, file containing the ROM image) */
/*                                                        */
/* Inputs: The named file or the default file.            */
/*                                                        */
```

-26-

```c
/* Outputs: BIOS ROM code to the Flash EEPROM.               */
/*                                                           */
/* Return Value: none.                                       */
/*                                                           */
/* Operation:                                                */
/*      - request buffer space for the BIOS ROM image (248K) */
/*      - parse the filename from the command line, if given */
/*      - call the program body                              */
/*      - return to the Monitor Prompt                       */
/*                                                           */
/*************************************************************/ void far
Load_BBLOCK ()
{
   int          index;          /* Loop control var          */
   Setup_Environment ();

/****** Check for and parse the optional filename on the command line **/
   for (index = 0; index < 11; index++)
   {
        globals.image_filename[index] = bblock_filename[index];
   } asm MOV AX,0003H;            /* Use Int 10 call to set video mode 3 */
   asm INT 10H;                 /* Clear screen & Prep for programming */

Load_Flash_EEPROM ('Y');     /* Call the main body of program */ asm MOV AX,0003H;            /* Use Int 10 call to set video mode 3 */
   asm INT 10H;                 /* Clear screen & return to Monitor    */

} /* end Main */
/*************************************************************/
/* PPROM.C        Setup Environment                          */
/*                                                           */
/* Purpose: This routine is the initialization section of the BIOS based*/
/*      utility program. Its function is to setup the environment for   */
/*      the main body of the program. This file contains the 'Main'     */
/*      section for the C program. The body is called as a function.    */
/*                                                           */
/* Parameters: filenam.ext (optional, file containing the ROM image) */
/*                                                           */
/* Inputs: The named file or the default file.               */
/*                                                           */
```

```
/* Outputs: BIOS ROM code to the Flash EEPROM.                    */
/*                                                                */
/* Return Value: none.                                            */
/*                                                                */
/* Operation:                                                     */
/*     - request buffer space for the BIOS ROM image (248K)       */
/*     - parse the filename from the command line, if given       */
/*     - call the program body                                    */
/*     - return to the Monitor Prompt                             */
/*                                                                */
/******************************************************************/
void near
Setup_Environment ()
{
/***** Call the Machine specific routine to initialize the environment. */
    Mach_Entry_Init();

/******** Initialize some of the global variables and CPU registers ******/
    globals.disk.sectors_per_track = 9;  /* 3.5" FD default         */
    globals.disk.sector_size       = 512; /* DOS standard value     */
    globals.disk.cluster_size      = 1;   /* one sector per cluster */
    globals.disk.num_heads         = 2;   /* 3.5" FD default        */

/******** Request memory blocks for the code image buffer ****************/
    globals.image_segment_1  = (unsigned char far *)MK_FP(0x3000U, 0);
    globals.image_segment_2  = (unsigned char far *)MK_FP(0x4000U, 0);
    globals.image_segment_3  = (unsigned char far *)MK_FP(0x5000U, 0);
    globals.image_segment_4  = (unsigned char far *)MK_FP(0x6000U, 0);
    globals.image_segment_41 = (unsigned char far *)MK_FP(0x6000U, MEM_48K);
    globals.image_segment_42 = (unsigned char far *)MK_FP(0x6000U, MEM_52K);
    globals.screen_image     = (union video_ram far (*)[])MK_FP(0xB800U, 0); /* Init pointer
to video RAM */
    globals.disk.FAT_address = (unsigned int far *)MK_FP(0x2000U, 0);        /* Area to hold
the FAT in mem     */
}
/******************************************************************/
/* PPROM.C       Find Image File                                  */
/*                                                                */
/* Purpose: Locate and open the ROM image file as specified by the user.*/
/*     This is done by first reading the disk boot sector to locate the*/
/*     disk FAT table (File Allocation Table). Then...            */
/*                                                                */
/* Inputs: filename (global var) - name of file to look for       */
/*                                                                */
/* Outputs: file FAT entry (global var)                           */
/*                                                                */
/* Return Values: 0 - file found and opened.                      */
/*                1 - file not found.                             */
/*                2 - disk error.                                 */
/*                                                                */
```

```
/*********************************************************/
int near
Find_Image_File ()
{
    struct s_disk_boot_sector far *boot_sector;  /* pointer to temp buff    */
    int                      index;        /* Loop control var        */
    int                      root_sector;  /* Logical sector of start of Root Dir */
    int                      root_size;    /* number of sectors used by root dir */
    struct s_dir_entry  far  *root_file;   /* pointer to file entry in root dir  */

/* Temporarily use the FAT area    */
                                           /* to hold the boot sector         */
    boot_sector = (struct s_disk_boot_sector far
*)MK_FP(FP_SEG(globals.disk.FAT_address), 0x2000);

/* Read the boot sector ****************************************/ if (Read_Disk (0, 1, boot_sector))
    {
        Display_User_Msg (ERROR_ATTR, "ERROR, reading Boot Sector");
        return (DISK_ERROR);
    }
                                           /* Record important values   */
    globals.disk.sector_size      = boot_sector->sector_size;
    globals.disk.cluster_size     = boot_sector->cluster_size;
    globals.disk.num_heads        = boot_sector->num_heads;
    globals.disk.sectors_per_track = boot_sector->sectors_per_track;

/* Load the FAT into memory ************************************/ if (Read_Disk (boot_sector->reserved_space, boot_sector->FAT_size, (void
*)globals.disk.FAT_address))
    {
        Display_User_Msg (ERROR_ATTR, "ERROR, reading F.A.T.");
        return (DISK_ERROR);
    }

/*** Load root directory into memory *******************************/
                                           /* Locate the Root Dir       */
    root_sector = boot_sector->reserved_space +
                  (boot_sector->FAT_copies * boot_sector->FAT_size);
    root_size = (boot_sector->num_root_entries * DIR_ENTRY_SIZE)
                / boot_sector->sector_size;
                                           /* Locate the start of the files area */
    globals.disk.starting_data_sector = root_sector + root_size;
                                           /* Establish the buffer for the directory data */
    root_file = (struct s_dir_entry *)globals.image_segment_1;
                                           /* Read Root dir into memory */
    if (Read_Disk (root_sector, root_size, root_file))
    {
```

```
          Display_User_Msg (ERROR_ATTR, "ERROR, reading Root Dir.");
          return (DISK_ERROR);
    }

/* Search for file name *************************************/ for (index = boot_sector->num_root_entries;
         index > 0; index--, root_file++)
    {
          if (root_file->filename[0] == 0xE5U )
          { /* Entry has been deleted, skip it     */
             continue;
          }
          if (root_file->filename[0] == 0x00U )
          { /* Null entry indicates end of dir entries. File not found.  */
             break;
          }
          if (Compare_Names ((char *)root_file, (char *)globals.image_filename) )
          { /* Match. Read the starting FAT entry from the dir entry.   */
             globals.disk.starting_FAT_entry = root_file->start_cluster;
             globals.disk.file_size          = root_file->file_size;
             return (GOOD_READ);
          }
    } /* end for */

/* File not found in root directory. Error   */
    Display_User_Msg (ERROR_ATTR, "Can't locate input file.");
    return (NO_FILE);                           /* Complain and exit   */

} /* end Find_Image_File () */

/*****************************************************************/
/* PPROM.C           Read Image File                            */
/*                                                               */
/* Purpose: This routine reads the BIOS ROM code file into the memory */
/*      buffers. The file is assumed to be in binary format and  */
/*      therefore requires no translation during the load.       */
/*                                                               */
/* Inputs:    Starting FAT index - (global Variable)             */
/*            image buffer - (global variables) memory buffer for code*/
/*                                                               */
/* Outputs: file contents into memory buffers.                  */
/*                                                               */
/* Return Values: 0 - file read OK                              */
/*                1 - read error on disk                        */
/*                2 - file too short to fill buffers            */
/*                3 - file too long for buffers                 */
/*                4 - wrong machine ID                          */
/*                5 - image checksum error.                     */
/*****************************************************************/
```

```
#define SIZE_OF_SECTOR   512                      /* Data bytes in sector */
define SIZE_OF_READ     SIZE_OF_SECTOR           /* Read one sector at a time */ int near
Read_Image_File ()
{
    unsigned int far    *image_buffer;     /* Work pointer to block buffer     */
    unsigned long int   bytes_read;        /* Continuing count of # of byte read */
    unsigned int        rom_size_k;        /* Rom size in K */
    unsigned int        fat_index;         /* Points to the next cluster       */
    unsigned int        file_sector;       /* Sector to read on disk           */
    int                 j;

if (globals.disk.file_size > ROM_SIZE + HEADER_SIZE)
    {
        Display_User_Msg (ERROR_ATTR, "File too long for ROM");
        return (FILE2LONG);
    }
    if (globals.disk.file_size < ROM_SIZE + HEADER_SIZE)
    { /* Could not read a full block, file too short      */
        Display_User_Msg (ERROR_ATTR, "File too short for ROM.");
        return (FILE2SHORT);
    }
    fat_index = globals.disk.starting_FAT_entry;/* Load starting index */
    if (Verify_Machine(fat_index) != TRUE)
        return (WRONG_MACH_ID);
    Get_Next_FAT_Index(&fat_index);                /* Get next cluster pointer */
    if (globals.disk.cluster_size == HEADER_SIZE/1024)  /* if cluster size is 1 sector, */
        Get_Next_FAT_Index(&fat_index);            /* we need to read and discard another sector */
    bytes_read = 0;                                /* Clear byte counter */
    j = 0;
    Display_User_Msg (NORMAL_ATTR, "Reading 256K image");
    Set_Display_Start();
    do {
        if ((bytes_read + globals.disk.sector_size * globals.disk.cluster_size) <= MEM_64K)
        {   /* Use the first segment pointer    */
            image_buffer =
                MK_FP (FP_SEG(globals.image_segment_1), bytes_read);
        }
        else if ((bytes_read + globals.disk.sector_size * globals.disk.cluster_size) <= 2*MEM_64K)
        {   /* Use the second segment pointer   */
            image_buffer =
                MK_FP (FP_SEG(globals.image_segment_2), bytes_read-MEM_64K);
        }
        else if ((bytes_read + globals.disk.sector_size * globals.disk.cluster_size) <= 3*MEM_64K)
```

```
        {  /* Use the third segment pointer */
           image_buffer =
                 MK_FP (FP_SEG(globals.image_segment_3), bytes_read-2*MEM_64K);
        }
        else { /* Use the second segment pointer   */
           if (bytes_read > = ROM_SIZE)
           { /* Data too large for current allocated memory buffers   */
                 if (Checksum_Image(globals.image_segment_1, FLASH_SIZE) != TRUE)
                 {
                       Display_User_Msg (ERROR_ATTR, "CHECKSUM ERROR! Bad
image file.");
                       return (BAD_CHECKSUM);
                 }
                 Display_User_Msg (NORMAL_ATTR, "Checksum passed");
                 return (GOOD_READ);
           }
           image_buffer =
                 MK_FP (FP_SEG(globals.image_segment_4), (bytes_read - 3*MEM_64K));
        }
        file_sector = ((fat_index-2) * globals.disk.cluster_size)
                       + globals.disk.starting_data_sector;
        if (Read_Disk (file_sector, globals.disk.cluster_size, image_buffer) )
        {
          Display_User_Msg (ERROR_ATTR, "ERROR, reading File");
          return (FILE_ERROR);
        }
        bytes_read + = globals.disk.sector_size * globals.disk.cluster_size;   /* Increment
byte count    */
        j++;
        if (j = = 4)
           j = 0;
        Display_Prog_Num(j);
   } while (Get_Next_FAT_Index(&fat_index));
   return (GOOD_READ);
} /* end Read_Image_File () */

/*****************************************************************/
/* PPROM.C         Read Boot Block Image File               */
/*                                                          */
/* Purpose: This routine reads the BIOS ROM code file into the memory  */
/*      buffers. The file is assumed to be in binary format and    */
/*      therefore requires no translation during the load.         */
/*                                                          */
/* Inputs:    Starting FAT index - (global Variable)          */
/*            image buffer - (global variables) memory buffer for code*/
/*                                                          */
/* Outputs: file contents into memory buffers.               */
/*                                                          */
```

–32–

```c
/* Return Values: 0 - file read OK                              */
/*                1 - read error on disk                        */
/*                2 - file too short to fill buffers            */
/*                3 - file too long for buffers                 */
/*                4 - wrong machine ID                          */
/*                5 - image checksum error.                     */
/****************************************************************/ int near
Read_BImage_File ()
{
    unsigned int far  *image_buffer;    /* Work pointer to block buffer       */
    unsigned long int  bytes_read;      /* Continuing count of # of byte read */
    unsigned int       fat_index;       /* Points to the next cluster         */
    unsigned int       file_sector;     /* Sector to read on disk             */ if (globals.disk.file_size > BBLOCK_SIZE + HEADER_SIZE)
    {
        Display_User_Msg (ERROR_ATTR, "File too long for ROM");
        return (FILE2LONG);
    }
    if (globals.disk.file_size < BBLOCK_SIZE + HEADER_SIZE)
    { /* Could not read a full block, file too short             */
        Display_User_Msg (ERROR_ATTR, "File too short for ROM.");
        return (FILE2SHORT);
    }
    fat_index = globals.disk.starting_FAT_entry;/* Load starting index */
    if(Verify_Machine(fat_index) != TRUE)
        return (WRONG_MACH_ID);
    Get_Next_FAT_Index(&fat_index);           /* Get next cluster pointer */
    if (globals.disk.cluster_size == HEADER_SIZE/1024)  /* if cluster size is 1 sector, */
        Get_Next_FAT_Index(&fat_index);       /* we need to read and discard another
sector */
    bytes_read = 0;                            /* Clear byte counter  */
    Display_User_Msg (NORMAL_ATTR, "Reading Boot Block image");
    Set_Display_Start();
    do {
        image_buffer =
            MK_FP (FP_SEG(globals.image_segment_1), bytes_read);
        if (bytes_read >= BBLOCK_SIZE)
            return (GOOD_READ);
        file_sector = ((fat_index-2) * globals.disk.cluster_size)
                      + globals.disk.starting_data_sector;
        if (Read_Disk (file_sector, globals.disk.cluster_size, image_buffer) )
        {
            Display_User_Msg (ERROR_ATTR, "ERROR, reading File.");
            return (FILE_ERROR);
        }
        bytes_read += globals.disk.sector_size * globals.disk.cluster_size;  /* Increment
byte count     */
```

```c
  } while (Get_Next_FAT_Index(&fat_index));
  return (GOOD_READ);
} /* end Read_BImage_File () */

/****************************************************************/
/* PPROM.C        Verify_machine                              */
/*                                                           */
/* Purpose: Verify the machine ID with the disk header and determine */
/*     if we should go ahead and reprogram the flash.        */
/*     This code will only work with Floppy disk, because the cluster */
/*     size is restricted to be 1 or 2 sectors only, and header is */
/*     set as 2 sectors.                                     */
/*                                                           */
/* Parameters:                                               */
/*     None.                                                 */
/* Return Values:                                            */
/*     TRUE - The machine ID is correct.                     */
/*     FALSE- This rom image is not for this machine.        */
/*                                                           */
/****************************************************************/
#define MODEL_ID_LEN 8
extern char far MODEL_ID;
int near
Verify_Machine(unsigned int fat_index)
{
  char far *id_ptr;
  union image_header image;      /* Work pointer to block buffer */
  unsigned int file_sector;      /* Sector to read on disk      */
  unsigned int index;

id_ptr = &MODEL_ID;
  image.buffer = (unsigned int far *)MK_FP (FP_SEG(globals.image_segment_1), 0);
  file_sector = ((fat_index-2) * globals.disk.cluster_size)
                    + globals.disk.starting_data_sector;
  if (Read_Disk (file_sector, globals.disk.cluster_size, image.buffer) )
  {
    Display_User_Msg (ERROR_ATTR, "ERROR, reading File");
    return (FILE_ERROR);
  }
  for ( index = 0; index < MODEL_ID_LEN; ++index)
                   /* Start to verify if machine name is the same */
  {
      if (image.header->machine_id[index] != id_ptr[index])
      {
      Display_User_Msg (ERROR_ATTR, "ERROR: Wrong image file");
      return (FALSE);
      }
  }
  Display_Firmware_Version(image.header);
  return(TRUE);
```

```
}
/************************************************************/
/* PPROM.C        Get_Next_FAT_Index                        */
/*                                                          */
/* Purpose: Using the current FAT index, determine the next cluster */
/*      number to use for this file.                        */
/*                                                          */
/* Parameters:                                              */
/*      *FAT_index - pointer to a variable that contains the current */
/*              FAT index and which will be updated with the new index. */
/*                                                          */
/* Return Values:                                           */
/*      TRUE - next cluster has been found.                 */
/*      FALSE- no more clusters in this file. EOF           */
/*                                                          */
/************************************************************/
int near
Get_Next_FAT_Index(unsigned int *FAT_index)
{
  if (*FAT_index >= 0x0FF0)
   /* That was the last cluster in this file.     */
    return (FALSE);

/* Locate next cluster     */
  asm PUSH DS                                /* Save Data Seg reg   */

_DS = FP_SEG(globals.disk.FAT_address); /* Load FAT pointer    */
  asm PUSH DS                                /* Save reg just loaded */
  _BX = FP_OFF(globals.disk.FAT_address); /* Load FAT pointer    */
  asm PUSH BX                                /* Save reg just loaded */
  _AX = *FAT_index;                          /* Load current index  */
  asm POP BX;                                /* Reload regs destroyed*/
  asm POP DS;                                /*  by the C code      */
  asm MOV CX,AX;
  asm SHL AX,1;                              /* AX = cluster * 2    */
  asm ADD AX,CX;                             /* AX = cluster * 3    */
  asm TEST AX,01H;                           /* Whole or fraction?  */
  asm PUSHF;                                 /* Save status         */
  asm SHR AX,1;                              /* AX = cluster * 1.5  */
  asm ADD BX,AX;                             /* Point to next entry */
  asm MOV AX,[BX];                           /* Load next entry     */
  asm POPF;                                  /* If (Whole number)   */
  asm JNZ GETFAT1;                           /*   Then              */
  asm AND AX,0FFFH;                          /*   take low 12 bits  */
  asm JMP GETFAT2;
GETFAT1:                                     /* Else                */
  asm MOV CX,4;                              /*   take upper 12 bits */
  asm SHR AX,CL;
GETFAT2:                                     /* Endif               */
```

```
asm POP  DS

*FAT_index = _AX               /* Save next index      */
    return (TRUE);
}
/*************************************************************/
/* PPROM.C          Wait for the Floppy                      */
/*                                                           */
/* Purpose: Wait for the user to change diskettes. This is usually */
/*      called after an error was detected on the disk or in the file. */
/*                                                           */
/* Inputs: status (parameter)                                */
/*              = FALSE - wait for the floppy to be removed. */
/*              = TRUE  - wait for a floppy to be inserted.  */
/*                                                           */
/* Outputs: none                                             */
/*                                                           */
/*************************************************************/
extern int far SCP_RECV_FAR();

int near
Wait_Floppy (int status)
{
  register int   count;          /* Work counter for timing delay*/ if (status)                   /* Look for new floppy to be inserted  */
    {
        while ( Read_Disk (1, 1,  /* Read til no error    */
            (void *)globals.image_segment_1))/* Buffer address to fill */
        {                         /* Wait for good read result */
            if (Check_abort() == 0x01 ) /* Check if the user want to abort the operation */
                return (FALSE);   /* 0x01 is the ESC key scan code */
        }
    }
    else
    {                             /* Wait for floppy to be removed*/
TOP_WHILE:                        /* do {                 */
        _AH = DISK_CHANGE_STATUS;  /*  AH = Check Changed Status (0x16)*/
        asm XOR  DL,DL;           /*  DL = Drive 0 (A:)    */
        asm INT      13H;         /*  Call BIOS to check floppy */
        asm TEST AH,0FFH;         /* } while (ret_value == 0);   */
        asm JZ   TOP_WHILE;

} /* end if */
    return(TRUE);
} /* end Wait_Floppy () */

/*************************************************************/
```

```
/* PPROM.C         Check for floppy ready                        */
/*                                                               */
/* Purpose: Check the status of the floppy disk. Return the status. */
/*                                                               */
/* Inputs: none                                                  */
/*                                                               */
/* Return Values: FALSE - floppy not inserted.                   */
/*                TRUE - disk is readable (ready)                */
/*                                                               */
/*****************************************************************/
int near
Check_Disk_Ready ()
{
   return (!(Read_Disk (1, 1,             /* Test by reading a sector. */
         (void *)globals.image_segment_1)));/*Buffer address to fill */

} /* end Check_Disk_Ready () */

/*****************************************************************/
/* PPROM.C         Read Disk Sectors                             */
/*                                                               */
/* Purpose: Read N sectors from the disk drive starting at the passed */
/*       logical sector number.                                  */
/*                                                               */
/* Parameters:                                                   */
/*     logical_sector  - logical sector number to read ( 0 - n ) */
/*     num_sectors     - number of sectors to read               */
/*     buffer          - pointer to buffer where to put data     */
/*                                                               */
/* Return Values:                                                */
/*     0 - read successful                                       */
/*     2 - disk device error                                     */
/*                                                               */
/*****************************************************************/
int near
Read_Disk(int logical_sector, int num_sectors, void far *buffer)
{
   unsigned char   track;     /* Current track to read on disk*/
   unsigned char   head;      /* Head/side to read on disk   */
   unsigned char   sector;    /* Sector to read. 1 - n       */ track  = logical_sector / globals.disk.sectors_per_track;
   sector = (logical_sector % globals.disk.sectors_per_track) + 1;
   head   = track % globals.disk.num_heads;
   track  = track / globals.disk.num_heads;

while (num_sectors-- > 0)
   {
```

```
        _AH = READ_SECTOR;          /* AH = Read Sector, (0x02)   */
        _AL = 0x01U;                /* AI = Number sectors to read */
        _CH = track;                /* CH = cylinder 0,           */
        _CL = sector;               /* CL = Sector number to read (1)  */
        _DH = head;                 /* DH = Head 0                */
        _DL = 0;                    /* DL = Drive 0 (A:)          */
        asm  LES  BX,buffer;        /* ES:BX = buffer address     */
        asm  INT  13H;              /* Call BIOS to read floppy   */ if (_AH != 0)               /* Check for disk error       */
            return (DISK_ERROR);
        (unsigned long)buffer += globals.disk.sector_size;  /* Increment buff ptr */
        if (++sector > globals.disk.sectors_per_track)
        { /* Wrap sectors to next head */
            sector = 1;
            if (++head > globals.disk.num_heads)
            { /* wrap head to next track */
                head = 0;
                track++;
            }
        }
    } /* end while */
    return (GOOD_READ);
}

/*****************************************************************/
/* PPROM.C          Compare Filenames                            */
/*                                                               */
/* Purpose: This routine compares the filename in the directory entry */
/*          with the target string to test for a match.          */
/*                                                               */
/* Parameters:                                                   */
/*          dir_name - pointer to directory entry (11 bytes long) */
/*          target name - pointer to string to match.            */
/*                                                               */
/* Return Values:                                                */
/*          FALSE - names don't match                            */
/*          TRUE  - names match in content and length            */
/*                                                               */
/*****************************************************************/
int near
Compare_Names (char *dir_name, char *target_name)
{
    int       index;                /* loop control variable      */

/* Compare the two padded, truncated name strings. All 11 chars. */
    for (index=0; index < FNAME_SIZE+FEXT_SIZE; index++)
    {
        if (*(dir_name++) != *(target_name++))
```

```
        { /* Name characters do not match    */
            return (FALSE);
        }
    } return (TRUE);              /* Names match       */
}

/***********************************************************************/
/* PPROM.C        Checksum Image                                      */
/*                                                                    */
/* Purpose: Checksum the image file before it continue to program the */
/*     flash. This is to prevent excessive flash programming which    */
/*     may shorten the life of flash as well as to prevent corrupting */
/*     the good code which is already in flash.                      */
/*                                                                    */
/* Parameters:                                                        */
/*     None.                                                          */
/* Return Values:                                                     */
/*     TRUE - Checksum is OK.                                         */
/*     FALSE- This rom image is bad.                                  */
/*                                                                    */
/***********************************************************************/ int near
Checksum_Image(unsigned char far * start_mem_addr, unsigned long image_size)
{
  int    num_segment;
  unsigned int   last_block_size, start_segment, start_offset;

start_segment = FP_SEG (start_mem_addr);
  start_offset = FP_OFF (start_mem_addr);
  num_segment = image_size / MEM_64K;
  last_block_size = image_size % MEM_64K;
  if (last_block_size != 0)
    {
       last_block_size = last_block_size/2;
       num_segment++;
    }
  else
    {
       last_block_size = MEM_64K/2;
    }
  _DX = num_segment;
  asm PUSH   DS;                      /* Save segment value */
  asm MOV    AX, 0;
  asm PUSH   AX;
  asm mov    ax, start_segment;       /* AX: Image_1 segment */
  asm PUSH   AX;
CZR_1:;
```

-39-

```
    asm MOV    BX, start_offset;              /* BX: index into RAM */
    asm CMP    DX, num_segment;
    asm JE     CZR_2;
    asm MOV    BX, 0;
CZR_2:;
    asm MOV    CX, 8000H;                     /* CX: size of RAM to be checksummed */
    asm DEC    DX;
    asm OR     DX, DX;
    asm JNZ    CZR_5;
    asm MOV    CX, last_block_size;
CZR_5:;
    asm POP    DS;                            /* Setup the segment */
    asm POP    AX;                            /* Obtain previous checksum */
CZR_10:;
    asm ADD    AX, DS:[BX];                   /* Add a word into the checksum */
    asm ADC    AX, 0;                         /* Add carrys back into checksum */
    asm ADD    BX, 2;                         /* Point to the next word */
    asm LOOP   CZR_10;                        /* Repeat for every word of the ROM */
    asm CMP    DX, 0;                         /* If the final segment is finished */
    asm JE     CZR_15;                        /* Go out to verify checksum */
    asm PUSH   AX;                            /* Save checksum on the stack */
    asm MOV    AX, DS;
    asm ADD    AX, 1000H;                     /* Proceed to next segment */
    asm MOV    DS, AX;
    asm PUSH   DS;                            /* Save segment on stack */
    asm JMP    CZR_1;
CZR_15:;
    asm CMP    AX, 1;
    asm JNE    CZR_20;
CZR_30:;
    asm POP    DS                             /* Retrieve DS segment value */
    return(TRUE);                             /* Yes, Return to caller */
CZR_20:
    asm POP    DS                             /* Retrieve DS segment value */
    return(FALSE);
}

/**********************************************************************/
/* PPROM.C          Display Firmware Version                          */
/*                                                                    */
/* Purpose: Display firmware date and version number                  */
/*                                                                    */
/* Parameters:                                                        */
/*      None.                                                         */
/* Return Values:                                                     */
/*      None                                                          */
/**********************************************************************/
char Header_message[] = {"Firmware Date:    , Version:"};

void near
```

-40-

```
Display_Firmware_Version(struct header_format *image_hdr)
{
  int temp_ptr_storage;

image_hdr->space = 0;                              /* To write a null character for proper
display */
  temp_ptr_storage = globals.video_msg_pointer;      /* Keep a temparay copy */
  Display_User_Msg(NORMAL_ATTR, Header_message);     /* Display header */
  globals.video_msg_pointer -= (SCREEN_WIDTH - 15);  /* Point to the starting address
of date message */
  Display_User_Msg(NORMAL_ATTR, image_hdr->fw_date); /* Display header */
  globals.video_msg_pointer -= (SCREEN_WIDTH - 20);  /* Point to the starting address
of date message */
  Display_User_Msg(NORMAL_ATTR, image_hdr->fw_version);/* Diplay FW version
number */
  globals.video_msg_pointer = (temp_ptr_storage + SCREEN_WIDTH);
}

/****************************************************************/
/* Check_abort()                                                */
/*                                                              */
/*     Check_abort is called to receive a byte from the SCP     */
/* command execution of an SCP command which returns a result byte. */
/* The difference between this routine and the SCP_RECV in scp.asm is */
/* that we don't want a long wait here, we need a quick return. */
/*                                                              */
/* Output:                                                      */
/*     AL: Byte read from the SCP                               */
/*                                                              */
/* Note:    This routine must work in protected mode.           */
/*                                                              */
/****************************************************************/
#define SCP_STATUS   0x64     /* System Control Processor Status */
#define SCP_RESULT   0x01     /* SCP has a result byte */
#define SCP_BUSY     0x02     /* SCP has not yet read command */
#define SCP_DATA_IN  0x60     /* SCP's input-data port */
define SCP_DATA_OUT 0x60     /* SCP's OUTput-data port */ int
Check_abort()
{
  register int index;
  _AX = 0;                    /* Clear AX register. */
  for (index = 0 ; index < 250; ++index )
  {
        asm IN  AL,SCP_STATUS;           /* Read the SCP's status register */
        asm AND AL,SCP_RESULT;           /* Does the SCP have a byte waiting? */
*/
        asm JNZ SR3;                     /* Yes - get the byte from the SCP*/
```

```
        }
        return;
SR3::
        asm IN    AL,SCP_DATA_IN;        /* Yes - flush the byte from the SCP */
        return;
}

/******************************************************************/
/*    Define the manufacturer index codes for the available parts  */
/******************************************************************/ define SEEQ           0           /* Index code for the SEEQ 48C010 part  */
define INTEL          1           /* Index code for the INTEL 28F010 part
                    */
define MAX_MFGR_INDEX 1           /* Set upper limit on index     */ ifndef MFGR                       /* Check for alternate part selection  */
define MFGR    INTEL              /* Set the default part index   */
endif /******************************************************************/
/*    Now include the machine specific code                        */
/******************************************************************/
#include "machdep.h"

#if MFGR > MAX_MFGR_INDEX          /* Verify the manufacturer index */
#error "Unknown device type, Aborting"
#error " Current types are : 'INTEL' 'SEEQ'"
#undef MFGR
#endif                             /* Flag fatal error & exit       */

/******************************************************************/
/*    Pull in the protected mode routines                          */
/******************************************************************/
#include "protect.c"

/******************************************************************/
/*    Now include the common code for programming the FLASH part   */
/******************************************************************/
#include "ldflash.c"

/******************************************************************/
/*    Pull in the appropriate device handling routines             */
/******************************************************************/
#if (MFGR == SEEQ)

#include "ppseeq.c"

#elif (MFGR == INTEL)
```

-42-

```
#include "ppintel.c"

#endif
```

/*:::::::::::::::::::::::::::End of File:::::::::::::::::::::::::::::*/

```c
#pragma inline                    /* Flag use of inline asm code */
/*******************************************************************/
/* File: LDFLASH.C                                                 */
/*        Phoenix: Flash EEPROM Programming Utility                */
/*                                                                 */
/* Purpose: This program programs the Flash EEProm in the system from a */
/*     disk file. This utility has two incarnations. First, there is a  */
/*     DOS based version that can make use of all the DOS services      */
/*     available. This version is used to update the Flash EEPROM       */
/*     contents from one release of BIOS ROM code to another. Second,   */
/*     there is the standalone version that must do ALL the work        */
/*     itself. This version is burned into a EPROM device and placed    */
/*     on the "PPROM" adaptor. It is used to install the BIOS ROM code  */
/*     into the Flash EEPROM when the Flash EEPROM checksum is invalid. */
/*     (i.e., Manufacturing install)                                    */
/*******************************************************************/

/*******************************************************************/
/* Modified on 2/20/91 by VSJ                                      */
/*     Added  Clear_Display_Ram()  in phase III, after             */
/*                  Press Enter key to reboot                      */
/*                                                                 */
/* 03/26/91 BDW - added call to machine dependent routine to setup the */
/*              machine environment for programming. Stabilizes the two */
/*              disk drives (floppy & winchester) before programming.   */
/* 09/27/91 MEL - revised the program to serve 28F001-BX with 28F010 */
/*******************************************************************/

/*******************************************************************/
/* LDFLASH.C              Load Flash EEPROM                        */
/*                                                                 */
/* Purpose: This routine is the body section of the Flash EEPROM   */
/*     utility program. Its function is to control the operation of */
/*     the programming of the Flash EEPROM.                        */
/*                                                                 */
/* Inputs:                                                         */
/*                                                                 */
/* Outputs:                                                        */
/*                                                                 */
/* Return Value: none.                                             */
/*                                                                 */
/* Operation:                                                      */
/*     Phase-I)   Locate the file to load.                         */
/*     Phase-II)  Read the file into memory buffers.               */
/*     Phase-III) Write the memory buffers to the Flash EEPROM device. */
/*                                                                 */
/*******************************************************************/
extern void far cold_reset();
```

-44-

```c
void near
Load_Flash_EEPROM (char x)
{
  int retries;                    /* Numbers of errors to absorb before restarting */
  int result;                     /* Result of function return */ while (TRUE)                    /* Start/restart of process            */
  {
      Clear_Display_Ram ();       /* Initialize the video RAM content    */
      Display_Program_Banner ();  /* Place Program title on screen       */
      set_delay_constant();       /* Get delay for byte program in flash */

/* Phase - 1: Locate the BIOS ROM code image file on disk    */ retries = 3;                /* Numbers of errors to absorb before restarting */
      while (retries--)
      {
        if ( !Check_Disk_Ready() )
        {
          if (x = = 'Y')
             Display_User_Msg (NORMAL_ATTR, "Please insert BOOT BLOck image floppy in drive A:");
          else
             Display_User_Msg (NORMAL_ATTR, "Please insert ROM image floppy in drive A:");
          if (Wait_Floppy (TRUE) = = FALSE)
             {
                Display_User_Msg (ERROR_ATTR, "User Aborted!");
                return;
             }
        }
        Display_User_Msg (NORMAL_ATTR, "Looking for code file...");
        if (Find_Image_File() = = 0)        /* attempt to locate file */
           /* file found, proceed */
              break;                        /* leave while loop */
        else
        { /* file NOT found */
            if ( retries = = 0 )
            { /* retries exhausted, display error and restart.    */
                Display_User_Msg (ERROR_ATTR, "Retries exhausted, Please remove diskette.");
                Wait_Floppy (FALSE);    /* Wait for floppy removed.    */
                return;                 /* Return to MAIN              */
            }
            Display_User_Msg (ERROR_ATTR, "File not found, Try another diskette.");
            Wait_Floppy (FALSE);        /* Wait for floppy to be removed */
        }
      } /* endwhile */
```

```
/* Phase - II: Read the file into the memory buffers.            */ retries = 3;
        while (retries--)
        {
          if (x = = 'Y')
            result = Read_BImage_File ();
          else
            result = Read_Image_File ();
          if (result = = 0)
          { /* File read correctly, proceed.       */
                break;                          /* OK, go write EEPROM device.    */
          }
          else
          { /* File or Disk error, attempt retry.     */
                if ( ((retries = = 0) || (result = = WRONG_MACH_ID) || (result = =
BAD_CHECKSUM))
                { /* retries exhausted, display error and restart.    */
                        Display_User_Msg (ERROR_ATTR, "Retries exhausted, Try another
diskette.");
                        Wait_Floppy (FALSE);    /* Wait for floppy removed.    */
                        return;                 /* Return to MAIN              */
                }
          }
        } /* endwhile */

/* Phase - III: Update the Flash EEPROM contents with memory buffer contents.    */

Mach_Program_Setup();                   /* Stabilize the environment   *//*
BDW 3/26/91*/
        retries = 2;
        while (retries--)
        {
          if (x = = 'Y')
            result = Write_BBLOCK_Data ();
          else
            result = Write_EEPROM_Data ();
          if (result = = 0)
          { /* Device successfully programmed, return to 'Main' pgm.   */
                Display_User_Msg (NORMAL_ATTR, "Programming succeeded. Press
ENTER key to reboot system ...");
                while( (SCP_RECV_FAR() & 0xff) != 0x1C ) ; /* 0x1C is the scan code of
ENTER key */
                Clear_Display_Ram2 ();          /* Initialize the video RAM content */
                cold_reset();   /* we need a cold reset to reslush flash ROM to RAM */
                return;         /* returns to the MAIN procedure.     */
          }
          else
```

-46-

```c
    { /* Programming error, attempt retry.       */
            if (retries > 0)
            { /* Give message on all but last retry */
                Display_User_Msg (ERROR_ATTR, "Error programming FLASH Device. Retrying...");
            }
    }
    } /* endwhile */
    Display_User_Msg (ERROR_ATTR, "FLASH Device failure! Device content has been corrupted.");
    Display_User_Msg (ERROR_ATTR, " Remove floppy and re-insert to try again, else reboot.");
    Wait_Floppy (FALSE);                    /* Delay a while, then restart */

} /* end while(true) */

} /* end Load_Flash_EEPROM */                 /* Returns to MAIN    */

/*******************************************************************/
/* LDFLASH.C           Display User Msg                            */
/*                                                                 */
/* Purpose: This routine has the responsability of placing messages */
/*          on the user's display screen. It is assumed that the video is */
/*          in a state equivilent to video mode 3 (alphanumeric 80 x 24). */
/*          This means the video buffer is at B800:0 and each word contains */
/*          a character byte and an attribute byte.                */
/*                                                                 */
/* Inputs: msg_string - pointer to the string of chatacters to display. */
/*                     The string is terminated with a NULL char.  */
/*         char_attribute - The color attribute to associate with this */
/*                     text on the screen. Matches the EGA definition. */
/*         screen_msg_pointer (global var) - points to loc of next msg. */
/*                                                                 */
/* Outputs: The message string is placed into the video memory with the */
/*          given color attribute. The first message is placed on  */
/*          screen line 3. Each display request after that is placed */
/*          on the next available line on the screen. No special   */
/*          checking is done for line or screen wrapping, that is  */
/*          left up to the caller.                                 */
/*                                                                 */
/* Return Values: none.                                            */
/*                                                                 */
/*******************************************************************/
void near
Display_User_Msg (char char_attribute, char msg_string[])
{
    register union video_ram far *cell_pointer;
    union video_ram              cell_value;
```

-47-

```
Set_Display_Start();                        /* Load starting loaction*/
cell_pointer = &(*globals.screen_image)[globals.video_msg_pointer];
cell_value.byte.attribute = char_attribute;   /* Set the attribute value     */
while (*msg_string != 0)
{ /* copy till null terminator */
        cell_value.byte.character = *(msg_string++); /* Set the next data byte     */
        (*cell_pointer).cell = cell_value.cell;
        cell_pointer++;
}
globals.video_msg_pointer += SCREEN_WIDTH;  /* Move to the next line       */

} /* end Display_User_Msg () */

/************************************************************/
/* LDFLASH.C          Clear Display RAM                     */
/*                                                          */
/* Purpose: This routine is used to initialize the video display buffer  */
/*      to a constant value in preparation for display of messages to    */
/*      the user. The video RAM is accessed directly with the assumption*/
/*      that the video susb-section of hardware has been setup for       */
/*      operating in video mode 3.                                      */
/*                                                                      */
/* Inputs: screen_buffer (global variable) - points to the video RAM    */
/*                                                                      */
/* Outputs: Constant value to all storage locations in video RAM        */
/*                                                                      */
/************************************************************/
void near
Clear_Display_Ram ()    /* Initialize the video RAM content    */
{
    register unsigned int video_cell_index;
    union video_ram         cell_value;        /* used to build cell value */ cell_value.byte.character  = BLANK;
    cell_value.byte.attribute  = NORMAL_ATTR;
    for (video_cell_index = 0;
         video_cell_index < (SCREEN_WIDTH*SCREEN_LENGTH);
         video_cell_index++)
    {
        (*globals.screen_image)[video_cell_index].cell = cell_value.cell;
    }
}
/************************************************************/
/* LDFLASH.C          Clear Display RAM                     */
/*                                                          */
/* Purpose: This routine is used to initialize the video display buffer  */
/*      to a constant value in preparation for display of messages to    */
/*      the user. The video RAM is accessed directly with the assumption*/
```

-48-

```c
/*    that the video susb-section of hardware has been setup for   */
/*    operating in video mode 3.                                    */
/*                                                                  */
/* Inputs: screen_buffer (global variable) - points to the video RAM */
/*                                                                  */
/* Outputs: Constant value to all storage locations in video RAM    */
/*                                                                  */
/******************************************************************/
void near
Clear_Display_Ram2 ()              /* Initialize the video RAM content */
{
   register unsigned int video_cell_index;
   union video_ram          cell_value;       /* used to build cell value */ cell_value.byte.character   = BLANK;
   cell_value.byte.attribute   = BLKBG_ATTR;
   for (video_cell_index = 0;
        video_cell_index < (SCREEN_WIDTH*SCREEN_LENGTH);
        video_cell_index++)
   {
      (*globals.screen_image)[video_cell_index].cell = cell_value.cell;
   }
}

/******************************************************************/
/* LDFLASH.C              Display Program Banner                   */
/*                                                                  */
/* Purpose: Assuming a presently blank screen, this routine writes a */
/*     border pattern and the program herrald to the video RAM.     */
/*                                                                  */
/* Inputs: screen_buffer (global variable) - points to the video RAM */
/*         screen_msg_pointer (global var) - points to next message loc */
/*                                                                  */
/* Outputs: Banner to screen_buffer & initialized screen values    */
/*                                                                  */
/******************************************************************/
void near
Display_Program_Banner ()          /* Place Program title on screen */
{
   register unsigned int video_cell_index;   /* selects video cell */
   union video_ram          cell_value;       /* used to build cell value */

/* place border around the screen                                */
   /* First, place the four corners                                 */
   cell_value.byte.attribute = 0x1F;     /* Blue background,bright white char */
   cell_value.byte.character = DBL_CORNER_TL;  /* place the top left corner  */
   (*globals.screen_image)[0].cell = cell_value.cell;
   cell_value.byte.character = DBL_CORNER_TR;  /* place the top right corner */
   (*globals.screen_image)[SCREEN_WIDTH-1].cell = cell_value.cell;
   cell_value.byte.character = DBL_CORNER_BL;  /* place the bottom left corner */
```

```c
    (*globals.screen_image)[SCREEN_WIDTH*(SCREEN_LENGTH-1)].cell =
cell_value.cell;
    cell_value.byte.character = DBL_CORNER_BR;   /* place the bottom right corner*/
    (*globals.screen_image)[SCREEN_WIDTH*(SCREEN_LENGTH-1)+79].cell =
cell_value.cell;

/* Second, place the top edge border                */
    cell_value.byte.character = DBL_HORIZONTAL;
    for (video_cell_index=1; video_cell_index < SCREEN_WIDTH-1; video_cell_index++)
        (*globals.screen_image)[video_cell_index].cell = cell_value.cell;

/* Third, place the left and right vertical edges.                */
    cell_value.byte.character = DBL_VERTICAL;
    for (video_cell_index=SCREEN_WIDTH;                       /* initializer */
         video_cell_index < SCREEN_WIDTH*(SCREEN_LENGTH-1);   /* conditional */
         video_cell_index+=SCREEN_WIDTH)                      /* incrementer */
    {
        (*globals.screen_image)[video_cell_index].cell       = cell_value.cell;
        /* left */
        (*globals.screen_image)[video_cell_index+SCREEN_WIDTH-1].cell =
cell_value.cell; /* right*/
    }

/* Fourth, place the bottom edge border                */
    cell_value.byte.character = DBL_HORIZONTAL;
    for (video_cell_index=SCREEN_WIDTH*(SCREEN_LENGTH-1)+1;   /* initializer */
         video_cell_index < (SCREEN_WIDTH*SCREEN_LENGTH)-1;   /* conditional */
         video_cell_index++)                                  /* incrementer */
    {
        (*globals.screen_image)[video_cell_index].cell = cell_value.cell;
    }

/* Last, Place the program title on the screen                */
    globals.video_msg_pointer = (SCREEN_WIDTH * 3) + 15;/* init msg location pointer
    */
    Display_User_Msg(HIGHLT_ATTR,"    Flash EEPROM Programming Utility");
    globals.video_msg_pointer += SCREEN_WIDTH;           /* Place a blank lines  */
    Display_User_Msg(NORMAL_ATTR, version_message);
    Display_User_Msg(NORMAL_ATTR, version_date_message);
    globals.video_msg_pointer = (SCREEN_WIDTH * 9) + 10;/* Set the msg pointer
    */
                                                         /* and include 2 blank lines  */

/* move cursor out of screen */
    asm mov ah,2;                    /* Set cursor position */
    asm mov dh,26; asm mov dl,0;     /* Get position */
    asm mov bh,0;                    /* On window 0 */
    asm int 10H;                     /* Generate interrupt */
} /* end Display_Program_Banner () */
```

```
/*************************************************************/
/* LDFLASH.C            Display Progressing Number           */
/*                                                           */
/* Purpose: This routine has the responsability of placing progressing */
/*       dots on the user's screen. It is assumed that the video is */
/*       in a state equivilent to video mode 3 (alphanumeric 80 x 24). */
/*       This means the video buffer is at B800:0 and each word contains */
/*       a character byte and an attribute byte.             */
/*                                                           */
/* Inputs: msg_string - pointer to the string of chatacters to display. */
/*                      The string is terminated with a NULL char. */
/*       char_attribute - The color attribute to associate with this */
/*                      text on the screen. Matches the EGA definition. */
/*       screen_msg_pointer (global var) - points to loc of next msg. */
/*                                                           */
/* Outputs: The message string is placed into the video memory with the */
/*          given color attribute. The first message is placed on */
/*          screen line 3. Each display request after that is placed */
/*          on the next available line on the screen. No special */
/*          checking is done for line or screen wrapping, that is */
/*          left up to the caller.                           */
/*                                                           */
/* Return Values: none.                                      */
/*                                                           */
/*************************************************************/
void near
Display_Prog_Num (int k)
{
  register union video_ram far *cell_pointer;
  union video_ram           cell_value;
                                        /* Load starting loaction*/
  cell_pointer = &(*globals.screen_image)[globals.video_msg_pointer];
  cell_value.byte.attribute = NORMAL_ATTR;    /* Set the attribute value */
  switch (k)
  {
    case 0:  cell_value.byte.character = '-';   /* Set the data byte */
             break;
    case 1:  cell_value.byte.character = '/';   /* Set the data byte */
             break;
    case 2:  cell_value.byte.character = '|';   /* Set the data byte */
             break;
    case 3:  cell_value.byte.character = '\\';  /* Set the data byte */
  }

(*cell_pointer).cell = cell_value.cell;

} /* end Display_Prog_Num (k) */
```

-51-

```
/*****************************************************************/
/* LDFLASH.C            Set Display Starting Position           */
/*                                                               */
/* Purpose: This routine has the responsability of setting display */
/*      starting position. It is assumed that the video is        */
/*      in a state equivilent to video mode 3 (alphanumeric 80 x 24). */
/*      This means the video buffer is at B800:0 and each word contains */
/*      a character byte and an attribute byte.                   */
/*                                                               */
/* Inputs:                                                        */
/*      screen_msg_pointer (global var) - points to loc of next msg. */
/*                                                               */
/* Outputs: The message string is placed into the video memory with the */
/*          given color attribute.                                */
/*                                                               */
/* Return Values: none.                                           */
/*                                                               */
/*****************************************************************/
void near
Set_Display_Start ()
{
    int i, j;
    union video_ram     cell_value;         /* used to build cell value */ cell_value.byte.character   = BLANK;
    cell_value.byte.attribute   = NORMAL_ATTR;
    if (globals.video_msg_pointer >= SCREEN_WIDTH*(SCREEN_LENGTH-1))
    {
        for (i = 10; i < (SCREEN_LENGTH-1); i++)
        {
            for (j = 10; j < (SCREEN_WIDTH-1); j++)
            {
                (*globals.screen_image)[SCREEN_WIDTH*(i-1)+j].cell =
                    (*globals.screen_image)[SCREEN_WIDTH*i+j].cell;
            }
        }
        for (j = 10; j < (SCREEN_WIDTH-1); j++)
        {
            (*globals.screen_image)[(SCREEN_LENGTH-2)*SCREEN_WIDTH+j].cell =
                cell_value.cell;
        }
        globals.video_msg_pointer = (SCREEN_LENGTH-2)*SCREEN_WIDTH+10;
    }
}
/*****************************************************************/
/* LDFLASH.C            Write buffer data to Flash EEPROM        */
/*                                                               */
/* Purpose: Copy the memory buffer contents to the Flash EEPROM. */
/*      A special programming process/sequence must be followed to */
/*      properly program the device. Refer to the device specification */
```

-52-

```
/*      data sheet for more deatils.                                    */
/*                                                                      */
/* Inputs: image_segment_1 (global var) - points to first 64K of data   */
/*         image_segment_2 (global var) - points to second 64K of data  */
/*         image_segment_3 (global var) - points to third 64K of data   */
/*         image_segment_4 (global var) - points to fourth 48K of data  */
/*         image_segment_41 (global var) - points to fifth 4K of data   */
/*         image_segment_42 (global var) - points to sixth 4K of data   */
/*                                                                      */
/* Outputs: data to EEPROM device.                                      */
/*                                                                      */
/* Return Values: 0 - Device programmed correctly.                      */
/*                other - Error specified by the error message.         */
/*                                                                      */
/* Operation:                                                           */
/*      1) Erase phase. Proceed through the device's erasure process.   */
/*      2) Programming phase. Write buffer contents to device.          */
/*         Then verify device contents with buffer contents.            */
/*                                                                      */
/* Note: This routine defaults to programming two INTEL parts -- 28F010 */
/*       and 28F001BX. The part type can be changed by using the        */
/*                "-DMFGR=string"                                       */
/*       option on the compiling command line. "string" is one of the   */
/*       device manufaturers names (i.e., "SEEQ", "INTEL", "INTEL2",    */
/*       etc.)                                                          */
/*                                                                      */
/*      To add a new manufacturer's part:                               */
/*      1) add a "#define" for the manufacturer, below, use the next    */
/*         available index number in sequence.                          */
/*      2) increment the MAX_MFGR_INDEX definition to account for the   */
/*         new manufacturer's part.                                     */
/*      3) add the Erase and Program procedure addresses to the two     */
/*         call tables.                                                 */
/*      4) write the routines into a separate file (ie. PPSEEQ.C)       */
/*      5) "#include" the new device file into the PPROM.C file.        */
/*      6) include the procedures' prototypes in the PPROM.H file.      */
/*                                                                      */
/**********************************************************************/ int near
Write_EEPROM_Data ()
{
    int    results;      /* Hold response values of device routine   */ results = MFGR;               /* line to force compiler error    */
                                  /* in case of invalid MFGR         */
    /* Phase 1: Erase the entire device, then verify it's erased.    */ if (MFGR == SEEQ)
    Display_User_Msg (HIGHLT_ATTR, "     Part type is a SEEQ 48F010");
```

```c
    results = SEEQ_Erase();          /* Erase the SEEQ 48F010 part      */
    results |= SEEQ_Program(globals.image_segment_1, globals.image_segment_2)
    return(results);
#elif (MFGR == INTEL)
    Display_User_Msg (HIGHLT_ATTR, "Erasing Low ROM");
    results = Intel_Erase();         /* Erase the INTEL 28F010 part     */
    if (results != 0)
    {
        Display_User_Msg (ERROR_ATTR, "Device error");
        return(results);
    }
    Display_User_Msg (HIGHLT_ATTR, "Programming Low ROM");
                                     /* Program the INTEL 28F010 part   */
    results = Intel_Program(globals.image_segment_1, globals.image_segment_2);
    if (results != 0)
    {
        Display_User_Msg (ERROR_ATTR, "Device error");
        return(results);
    }
/*  switch (MODEL)
    {
      case 'A':
          return(results);
      case 'B':
    }
*/
        Display_User_Msg (HIGHLT_ATTR, "Erasing High ROM");
        results = Intel_Erase2();    /* Erase the second part           */
    if (results != 0)
    {
      Program_Err_Msg(results);
      return(results);
    }
    /* Phase II: Attempt to program the device, includes verify. */

Display_User_Msg (HIGHLT_ATTR, "Programming High ROM");
                                     /* Program INTEL 28F001BX-T */
    results = Intel_Program2(globals.image_segment_3, globals.image_segment_4,
                    globals.image_segment_41, globals.image_segment_42);

if (results != 0)
      Program_Err_Msg(results);
    return(results);
endif

} /* end Write_EEPROM_Data () */

/**************************************************************/
/* LDFLASH.C              Write buffer data to BOOT BLOCK     */
/*                                                            */
/* Purpose: Copy the memory buffer contents to the BOOT BLOCK. */
```

```c
/*      A special programming process/sequence must be followed to   */
/*      properly program the device. Refer to the device specification */
/*      data sheet for more deatils.                                  */
/*                                                                   */
/* Inputs: image_segment_1 (global var) - points to first 8K of data  */
/*                                                                   */
/* Outputs: data to BOOT BLOCK.                                       */
/*                                                                   */
/* Return Values: 0 - Device programmed correctly.                    */
/*                other - Error specified by the error message.       */
/*                                                                   */
/* Operation:                                                         */
/*      1) Erase phase. Proceed through the device's erasure process. */
/*      2) Programming phase. Write buffer contents to device.        */
/*              Then verify device contents with buffer contents.     */
/*                                                                   */
/* Note: This routine defaults to programming INTEL 28F001BX.         */
/*      The part type can be changed by using the                     */
/*              "-DMFGR=string"                                        */
/*      option on the compiling command line. "string" is one of the  */
/*      device manufaturers names (i.e., "SEEQ", "INTEL", etc.).      */
/*                                                                   */
/*      To add a new manufacturer's part:                             */
/*      1) add a "#define" for the manufacturer, below, use the next  */
/*              available index number in sequence.                   */
/*      2) increment the MAX_MFGR_INDEX definition to account for the */
/*              new manufacturer's part.                              */
/*      3) add the Erase and Program procedure addresses to the two   */
/*              call tables.                                          */
/*      4) write the routines into a separate file (ie. PPSEEQ.C)     */
/*      5) "#include" the new device file into the PPROM.C file.      */
/*      6) include the procedures' prototypes in the PPROM.H file.    */
/*                                                                   */
/********************************************************************/ int near
Write_BBLOCK_Data ()
{
    int   results;      /* Hold response values of device routine    */ results = MFGR;                 /* line to force compiler error  */
                                    /* in case of invalid MFGR       */
    /* Phase 1: Erase the entire device, then verify it's erased.    */ if (MFGR == SEEQ)
    Display_User_Msg (HIGHLT_ATTR, "    Part type is a SEEQ 48F010");
    results = SEEQ_Erase();         /* Erase the SEEQ 48F010 part    */
    results |= SEEQ_Program(globals.image_segment_1, globals.image_segment_2)
    return(results);
#elif (MFGR == INTEL)
```

-55-

```c
Display_User_Msg (HIGHLT_ATTR, "Erasing Boot Block");
    results = Intel_Erase3();          /* Erase the boot block*/
if (results != 0)
{
  Program_Err_Msg(results);
  return(results);
}
/* Phase II: Attempt to program the device, includes verify. */

Display_User_Msg (HIGHLT_ATTR, "Programming Boot Block");
                                /* Program Boot Block */
results = Intel_Program3(globals.image_segment_1);
if (results != 0)
    Program_Err_Msg(results);
return(results);
endif } /* end Write_BBLOCK_Data () */ void near
Program_Err_Msg (int results)
{
    if (results & 0x0001)
      Display_User_Msg (ERROR_ATTR, "Programming error.");
    if (results & 0x0002)
      Display_User_Msg (ERROR_ATTR, "Vpp low detected.");
    if (results & 0x0004)
      Display_User_Msg (ERROR_ATTR, "Erasing error.");
    if (results & 0x0008)
      Display_User_Msg (ERROR_ATTR, "Command sequence error.");
    return;
}
extern int far   ONE_MS_DELAY;
/******************************************************************/
/* LDFLASH.C              Set_VPP                                 */
/*                                                                */
/* Purpose: Set the VPP line to the Flash device to either the low (0V) */
/*      state or the high (+12V) state.                           */
/*                                                                */
/* Parameters:                                                    */
/*      direction    - specifies new state of VPP line            */
/*          1 = VPP low state desired.                            */
/*          0 = VPP high state desired.                           */
/*                                                                */
/* Return Values: none                                            */
/*                                                                */
/******************************************************************/
#define SCP_STATUS 0x64       /* Latch address for SCP status  */
#define SCP_CMD         0x64          /* Latch address for SCP cmds */
#define SCP_DATA    0x60      /* Latch address for SCP data */
```

-56-

```c
#define SCP_CMD_READY  0x02      /* Bit to indicate ready for cmd*/
#define SCP_NOOP       0xFF      /* SCP cmd to do nothing         */
#define SCP_ZCMD       0xBF      /* SCP cmd leading all Zenith cmds */
#define SCP_VPP_OFF    0x01      /* SCP cmd to make VPP or PWD low */
#define SCP_VPP_ON     0x00      /* SCP cmd to make VPP or PWD high*/
#define SCP_PWD_EN     0x56      /* SCP cmd to enable PWD to be raised high
*/ void near
Set_VPP(int direction)
{
    direction = (direction == VPP_LOW) ? SCP_VPP_OFF : SCP_VPP_ON;
         /* Now delay appropriate time for VPP voltage to settle.   */
l1:
    asm IN      AL,SCP_STATUS;        /* Read SCP status              */
    asm TEST    AL,SCP_CMD_READY;     /* Wait for SCP ready for cmd   */
    asm JNZ     l1;
    asm MOV     AL,SCP_ZCMD;          /* Load SCP Zenith command      */
    asm OUT     SCP_CMD,AL;           /* Send cmd to SCP              */
l2:
    asm IN      AL,SCP_STATUS;        /* Read SCP status              */
    asm TEST    AL,SCP_CMD_READY;     /* Wait for SCP ready for cmd   */
    asm JNZ     l2;
    asm MOV     AX,direction;         /* Load SCP VPP command         */
    asm OUT     SCP_DATA,AL;          /* Send cmd parameter to SCP    */
                                      /* Wait for SCP to take the cmd */
l3:
    asm IN      AL,SCP_STATUS;
    asm TEST    AL,SCP_CMD_READY;     /* Wait for SCP to process cmd  */
    asm JNZ     l3;
    asm MOV     AL,SCP_NOOP;          /* Cmd taken, wait for processing to finish
                                       */
    asm OUT     SCP_CMD,AL;           /* Write a dummy cmd, then      */
l4:
    asm IN      AL,SCP_STATUS;        /*  wait for it to be taken     */
    asm TEST    AL,SCP_CMD_READY;     /*  by the SCP.                 */
    asm JNZ     l4;
    Delay_10us();
}

/*******************************************************************/
/* LDFLASH.C                 Set_PWD                               */
/*                                                                 */
/* Purpose: Set the PWD line to the Flash device to either the low (5V)
/*          state or the high (+12V) state.                        */
/*                                                                 */
/* Parameters:                                                     */
/*      direction  - specifies new state of PWD line               */
/*              0 = PWD low state desired.                         */
/*             >0 = PWD high state desired.                        */
```

```
/*                                                              */
/* Return Values: none                                           */
/*      .                                                        */
/*..............................................................*/
void near
Set_PWD(int direction)
{
    direction = (direction = = VPP_LOW) ? SCP_VPP_OFF : SCP_VPP_ON;
k1:
    asm IN      AL,SCP_STATUS;          /* Read SCP status              */
    asm TEST    AL,SCP_CMD_READY;       /* Wait for SCP ready for cmd   */
    asm JNZ     k1;
    asm MOV     AL,SCP_ZCMD;            /* Load SCP Zenith command      */
    asm OUT     SCP_CMD,AL;             /* Send cmd to SCP              */
k2:
    asm IN      AL,SCP_STATUS;          /* Read SCP status              */
    asm TEST    AL,SCP_CMD_READY;       /* Wait for SCP ready for cmd   */
    asm JNZ     k2;
    asm MOV     AX,SCP_PWD_EN;                  /* Load SCP VPP command
    */
    asm OUT     SCP_DATA,AL;            /* Send cmd parameter to SCP    */
k4:
    asm IN      AL,SCP_STATUS;          /* wait for it to be taken      */
    asm TEST    AL,SCP_CMD_READY;       /* by the SCP.                  */
    asm JNZ     k4;
    asm MOV     AX,direction;           /* Load SCP VPP command         */
    asm OUT     SCP_DATA,AL;            /* Send cmd parameter to SCP    */
                                        /* Wait for SCP to take the cmd */
k5:
    asm IN      AL,SCP_STATUS;
    asm TEST    AL,SCP_CMD_READY;       /* Wait for SCP to process cmd  */
    asm JNZ     k5;
    asm MOV     AL,SCP_NOOP;            /* Cmd taken, wait for processing to finish
    */
    asm OUT     SCP_CMD,AL;             /* Write a dummy cmd, then      */
k6:
    asm IN      AL,SCP_STATUS;          /* wait for it to be taken      */
    asm TEST    AL,SCP_CMD_READY;       /* by the SCP.                  */
    asm JNZ     k6;
    Delay_10us();
}

/*:::::::::::::::::::::End of File:::::::::::::::::::::::::*/
```

```
#pragma inline                    /* will be using inline asm code*/
/*********************************************************************/
/* PPINTEL.C        Intel 28F010 Flash EEPROM Tools                  */
/*                                                                    */
/* This file contains the tools routines to erase and program the Intel */
/* Flash EEPROM device (number 28F010, 128K x 8). This part will be used*/
/* to hold the ROM BIOS code for some of the new machines.           */
/*                                                                    */
/* This Intel part uses a command register approach to controlling    */
/* the internal activities of the part. When the Vpp line is at TTL   */
/* levels, the device operates exactly like any standard UVEPROM in its*/
/* read mode. When the Vpp line is raised to the 12V level, the write */
/* and erase capabilities are enabled. The following table shows the  */
/* commands available for this part.                                  */
/*                                                                    */
/*                  |   First Bus Cycle  ||  Second Bus Cycle        */
/* Command          | Operation| Address| Data|| Operation| Address| Data */
/* -----------------------------------------------------------------  */
/* Read Memory      |  Write  |  X  | 00H ||        |     |           */
/* Read ID Bytes    |  Write  |  X  | 90H || Read   | IA  | ID        */
/* Erase            |  Write  |  X  | 20H || Write  | X   | 20H       */
/* Erase Verify     |  Write  | EA  | A0H || Read   | X   | EVD       */
/* Program          |  Write  |  X  | 40H || Write  | PA  | PD        */
/* Program Verify   |  Write  |  X  | C0H || Read   | X   | PVD       */
/* Reset            |  Write  |  X  | FFH || Write  | X   | FFH       */
/*    IA = Indentifier Address: 00H manufacturer, 01H for device code */
/*    EA = Address of memory location to be read during erase verify  */
/*    PA = Address of memory location to be programmed.               */
/*    ID = Data read from identifier latches (mfgr = 89H, device = B4H)*/
/*    EVD = Data read from latch during erase verify.                 */
/*    PD = Data to be programmed at addredd PA.                       */
/*    PVD = Data read from latch during program verify.               */
/*                                                                    */
/*********************************************************************/
/* Define the commands used to control accesses to the memory chip   */
#define READ_MODE     0x00      /* INTEL command to establish normal read mode */
#define ERASE_SETUP   0x20      /* INTEL command to prep for erase */
#define ERASE_ALL     0x20      /* INTEL command to initiate erase */
#define ERASE_VERIFY  0xA0      /* INTEL command to check byte for eraseure */
#define PGM_SETUP     0x40      /* INTEL command to prep for programming */
#define PGM_VERIFY    0xC0      /* INTEL command to check programmed byte */
define RESET_MODE    0xFF      /* INTEL command to reset the command status */ define TEN_US   0x000C  /* timer counter for 10 us, base on 1/1.19Mhz */
define SIX_US   0x0007  /* timer counter for 6 us, base on 1/1.19Mhz */
#define TEN_MS   0x2E7C  /* timer counter for 10 ms, base on 1/1.19Mhz */
```

```
/****************************************************************/
/* PPINTEL.C       Intel 28F001BX Flash EEPROM Tools            */
/*                                                              */
/* This file contains the tools routines to erase and program the Intel */
/* Flash EEPROM device (number 28F001, 128K x 8). This part will be used*/
/* to hold the ROM BIOS code for some of the new machines.      */
/*                                                              */
/* This Intel part uses a command register approach to controlling */
/* the internal activities of the part. When the Vpp line is at TTL */
/* levels, the device operates exactly like any standard UVEPROM in its */
/* read mode. When the Vpp line is raised to the 12V level, the write */
/* and erase capabilities of the main block and two parameter blocks */
/* are enabled. To enable erasing and programming the boot block, either*/
/* PWD or OE must be raised to 12V in addition that Vpp is raised to */
/* the 12V level. The following table shows the commands available for */
/* this part.                                                   */
/*                                                              */
/*                  |  First Bus Cycle  ||  Second Bus Cycle    */
/* Command          | Operation| Address| Data|| Operation| Address| Data  */
/* ------------------------------------------------------------ */
/* Read Memory      | Write  | X  | FFH ||         |        |      */
/* Read ID Bytes    | Write  | X  | 90H || Read    | IA     | ID   */
/* Read Status      | Write  |00000H| 70H || Read   |00000H | SRD  */
/* Clear Status     | Write  |00000H| 50H ||         |        |      */
/* Erase            | Write  | BA | 20H || Write   | BA     | D0H  */
/* Program          | Write  | PA | 40H || Write   | PA     | PD   */
/*     IA = Identifier Address: 00H manufacturer, 01H for device code */
/*     BA = Address within the block being erased.              */
/*     PA = Address of memory location to be programmed.        */
/*     ID = Data read from identifier latches (mfgr = 89H, device = B4H) */
/*     PD = Data to be programmed at addressed PA.              */
/*     SRD = Data read from status register.                    */
/*                                                              */
/****************************************************************/
/*    Define the commands used to control accesses to the memory chip */
#define READ_MODE2      0xFF       /* INTEL command to establish normal read mode */
#define READ_STATUS     0x70       /* INTEL command to read status register */
#define CLEAR_STATUS    0x50       /* INTEL command to clear status register */
#define ERASE_CONFIRM   0xD0       /* INTEL command to initiate erase */
/****************************************************************/
/* Return codes:                                                */ define SUCCESS             0
define DEVICE_ERROR        1
#define VPP_RANGE_ERROR     2
#define COMM_SEQ_ERROR      8
#define ERASE_ERROR         4
```

```
#define PROG_ERROR         1                                          */
/*..........................................................................*/
/*..........................................................................*/

/*..........................................................................*/
/*    Function Prototypes...                                         */
int nearCheck_Device_Erased(unsigned char far *, long);
int nearVerify_Erasure(unsigned char far *, long);
int nearProgram_Byte(unsigned char far *, unsigned char);
int nearCheck_Block_Erased(unsigned char far *, long);
int nearVerify_Blcok_Erasure(unsigned char far *);
int nearProgram_Block(unsigned char far *, unsigned char far *, long, unsigned char far *);
int nearProgram_Byte2(unsigned char far *, unsigned char far *, unsigned char);
void         Hw_Delay(int);
int nearset_delay_constant();

/*..........................................................................*/
/*PPINTEL.C        Set Delay Constants                               */
/*                                                                    */
/* Purpose: This routine divides ONE_MS_DELAY constant to get program */
/*     delay constants. For the Intel part, the programming delay    */
/*     constant of 10 us is required.                                */
/*                                                                    */
/*..........................................................................*/
extern unsigned int far one_ms_delay;

int near
set_delay_constant()
{
        globals.program_delay_constant = one_ms_delay/100U;
}

/*..........................................................................*/
/* PPINTEL.C             Intel Erase2                                 */
/*                                                                    */
/* Purpose: This routine is responsible for erasing the entire 28F001BX */
/*     memory device.                                                */
/* Parameters: none.                                                 */
/*                                                                    */
/* Return Values:                                                    */
/*      0 - Success. Device has been completely erased.             */
/*      2 - Vpp low detected.                                        */
/*      4 - Erasing error.                                           */
/*      8 - Command sequence error.                                  */
/*..........................................................................*/
int near
```

```
Intel_Erase2()
{
  unsigned char far *base, *flash1, *flash2, *flash3, *flash4;
  unsigned char      srd;       /* Data read from status register */
  int cresult, vresult;         /* Temp hold return values       */
  unsigned int segment_keep;    /* Keeps the current CS contents*/ segment_keep = ENTER_PROTECTED_MODE_FAR();  /* Enter protected mode
          */
                                  /* Establish descriptors for the Flash device   */
  Set_GDT_Entry(GDT_ENTRY_7,
            *((unsigned long far *)MK_FP(GDT_CS_ENTRY,
FP_OFF(&globals.flash_seg_1))),
            DATA_DESCRIPTOR);
  Set_GDT_Entry(GDT_ENTRY_8,
            *((unsigned long far *)MK_FP(GDT_CS_ENTRY,
FP_OFF(&globals.flash_seg_2))),
            DATA_DESCRIPTOR);
  flash1 = (unsigned char far *)MK_FP(GDT_ENTRY_7, 0);
  flash2 = (unsigned char far *)MK_FP(GDT_ENTRY_8, 0);
  flash3 = (unsigned char far *)MK_FP(GDT_ENTRY_8, MEM_48K);
  flash4 = (unsigned char far *)MK_FP(GDT_ENTRY_8, MEM_52K);
  base = flash1;
  vresult = 0;
  Set_VPP(VPP_HIGH);              /* Raise the VPP voltage       */
  /* Check if the device is already erased, else prep the device.*/
  cresult = Check_Block_Erased(flash1, MEM_64K-1);
  cresult |= Check_Block_Erased(flash2, MEM_48K-1);
  if (cresult)
  { /* Device is not erased, proceed with erasure process.        */
      *flash1 = ERASE_SETUP;
      *flash1 = ERASE_CONFIRM;
      vresult = Verify_Block_Erasure(base);
    if (vresult != 0)
      goto exit_erase;
  }
  cresult = Check_Block_Erased(flash3, MEM_4K-1);
  if (cresult)
  { /* Device is not erased, proceed with erasure process.        */
      *flash3 = ERASE_SETUP;
      *flash3 = ERASE_CONFIRM;
      vresult = Verify_Block_Erasure(base);
    if (vresult != 0)
      goto exit_erase;
  }
  cresult = Check_Block_Erased(flash4, MEM_4K-1);
  if (cresult)
  { /* Device is not erased, proceed with erasure process.        */
      *flash4 = ERASE_SETUP;
      *flash4 = ERASE_CONFIRM;
```

```
  vresult = Verify_Block_Erasure(base);
}
exit_erase:                              /* Return the device to normal mode */
  *base = READ_MODE2;
  Set_VPP(VPP_LOW);              /* Lower the VPP voltage     */
  Exit_Protected_Mode_Bridge(segment_keep);     /* Return to Real Mode       */
  return (vresult);
}
/*****************************************************************/
/* PPINTEL.C              Intel Erase3                          */
/*                                                              */
/* Purpose: This routine is responsible for erasing the boot block of */
/*      28F001BX memory device.                                 */
/* Parameters: none.                                            */
/*                                                              */
/* Return Values:                                               */
/*      0 - Success. Device has been completely erased.         */
/*      2 - Vpp low detected.                                   */
/*      4 - Erasing error.                                      */
/*      8 - Command sequence error.                             */
/*****************************************************************/
int near
Intel_Erase3()
{
  unsigned char far *base, *flash1, *flashb;
  unsigned char       srd;     /* Data read from status register */
  int cresult, vresult;        /* Temp hold return values    */
  unsigned int segment_keep;   /* Keeps the current CS contents*/ segment_keep = ENTER_PROTECTED_MODE_FAR();   /* Enter protected mode
    */
                               /* Establish descriptors for the Flash device */
  Set_GDT_Entry(GDT_ENTRY_7,
            *((unsigned long far *)MK_FP(GDT_CS_ENTRY,
FP_OFF(&globals.flash_seg_1))),
            DATA_DESCRIPTOR);
  Set_GDT_Entry(GDT_ENTRY_8,
            *((unsigned long far *)MK_FP(GDT_CS_ENTRY,
FP_OFF(&globals.flash_seg_2))),
            DATA_DESCRIPTOR);
  flash1 = (unsigned char far *)MK_FP(GDT_ENTRY_7, 0);
  flashb = (unsigned char far *)MK_FP(GDT_ENTRY_8, MEM_56K);
  base = flash1;
  vresult = 0;
  Set_VPP(VPP_HIGH);           /* Raise the VPP voltage      */
       Hw_Delay(TEN_MS);
  Set_PWD(VPP_HIGH);           /* Raise the VPP voltage      */
       Hw_Delay(TEN_MS);
  /* Check if the device is already erased, else prep the device.*/
  cresult = Check_Block_Erased(flashb, MEM_8K-1);
```

```c
if (cresult)
{ /* Device is not erased, proceed with erasure process.        */
      *flashb = ERASE_SETUP;
      *flashb = ERASE_CONFIRM;
      vresult = Verify_Block_Erasure(base);
}
*base = READ_MODE2;
Set_PWD(VPP_LOW);              /* Raise the VPP voltage         */
      Hw_Delay(TEN_MS);
Set_VPP(VPP_LOW);              /* Lower the VPP voltage         */
Exit_Protected_Mode_Bridge(segment_keep);    /* Return to Real Mode   */
return (vresult);
}

/********************************************************************/
/* PPINTEL.C       Check Block Erased                              */
/*                                                                  */
/* Purpose: This routine checks a block of the flash device to see if */
/*      it is erased. If it is, a return code is passed back indicating */
/*      this condition. If the block is NOT erase, then all bytes in  */
/*      the block are programmed to zero (0) in preparation for a device*/
/*      erasure command cycle. This routine expects VPP to be LOW.   */
/*                                                                  */
/*                                                                  */
/* Parameters:                                                      */
/*      flash   - far pointer to the block to be tested.            */
/*      size    - size (in bytes) of the block to be tested. Max 65535 */
/*                                                                  */
/* Return Values:                                                   */
/*      FALSE - Block tested to be fully erased.                    */
/*      TRUE  - Block had at least one non-erased byte.             */
/*                                                                  */
/********************************************************************/
int near
Check_Block_Erased(unsigned char far *flash, long size)
{
  unsigned long     block_offset;   /* Offset into block of EPROM    */

/* Check if device is already erased.                              */
  for (block_offset=0; block_offset < =size; block_offset++ )
  { /* Check all locations in device's block for erased value       */
      if (flash[block_offset] != 0xFFU)
      { /* Block NOT erased.         */
        break;
      }
  } /* end for */ if (block_offset > (unsigned long)size)
  { /* Above loop completed with no error     */
      return (FALSE);               /* Device block is erased.       */
  }
```

```
    return (TRUE);              /* return with an error.*/
}
/*******************************************************************/
/* PPINTEL.C        Verify Erasure                               */
/*                                                               */
/* Purpose: This routine checks the device under VPP = HIGH to see if the */
/*     device block has been erased. This routine expects VPP = HIGH. */
/*                                                               */
/* Return Values:                                                */
/*     0 - Success. Device has been completely erased.           */
/*     2 - Vpp low detected.                                     */
/*     4 - Erasing error.                                        */
/*     8 - Command sequence error.                               */
/*                                                               */
/*******************************************************************/
int near
Verify_Block_Erasure(unsigned char far *base)
{
        unsigned char srd;
        int result;
    /* Check if device is already erased.                */
        *base = READ_STATUS;
        Hw_Delay(TEN_MS);
        srd = *base;
     while (srd < 0x80U)            /* Check the Write Machine's status */
        {
                /* If busy, continue to read status */
            *base = READ_STATUS;
            Hw_Delay(TEN_MS);
            srd = *base;
        } /* end while */
        if (srd & 0x08U)
        { /* Vpp range error */
          result = VPP_RANGE_ERROR;
        }
        else if ((srd & 0x30U) = = 0x30U)
        { /* Command sequence error */
          result = COMM_SEQ_ERROR;
        }
        else if (srd & 0x40U)
        { /* Block erase error */
          result = ERASE_ERROR;
        }
        else
        { /* Successful erasure */
          result = SUCCESS;
        }
                                /* Clear Status Register */
```

```
        *base = CLEAR_STATUS;
    return(result);
}

/*******************************************************************/
/* PPINTEL.C            Intel Program2                             */
/*                                                                 */
/* Purpose: This routine programs the 120K data buffer into the FLASH */
/*          EPROM device 28F001BX.                                 */
/*                                                                 */
/* Parameters:                                                     */
/*     data_block_1 - ptr to the first 64K data block to be programed. */
/*     data_block_2 - ptr to the second 48K data block to be programed.*/
/*     data_block_3 - ptr to the third 4K parameter block.         */
/*     data_block_4 - ptr to the fourth 4K parameter block.        */
/*                                                                 */
/* Return Values:                                                  */
/*     0 - Success. Device has been successfully programmed.       */
/*     2 - Vpp low detected.                                       */
/*     4 - Program error.                                          */
/*******************************************************************/
int near
Intel_Program2(unsigned char far *data_block_1, unsigned char far *data_block_2, \
               unsigned char far *data_block_3, unsigned char far *data_block_4)
{
    int              results;    /* Temp holds return values   */
    unsigned char far *flash;    /* Pointer to flash device    */
    unsigned char far *base;     /* Pointer to flash base address*/
    long             byte_count; /* Counter of device block size */
    unsigned char far *prog_data; /* Pointer to data buffer    */
    unsigned int     segment_keep; /* Keeps the current CS contents*/ segment_keep = ENTER_PROTECTED_MODE_FAR();  /* Enter protected mode
                    */
                                    /* Establish descriptors for the Flash dev. */
    Set_GDT_Entry(GDT_ENTRY_7, Make_Physical_Address(data_block_1),
DATA_DESCRIPTOR);
    Set_GDT_Entry(GDT_ENTRY_8,
                  *((unsigned long far *)MK_FP(GDT_CS_ENTRY,
FP_OFF(&globals.flash_seg_1))),
                  DATA_DESCRIPTOR);
    base = (unsigned char far *)MK_FP(GDT_ENTRY_8,0);

Set_VPP(VPP_HIGH);              /* Raise the VPP voltage      */

/***** Work on the first block of 64K ************************/
    flash = (unsigned char far *)MK_FP(GDT_ENTRY_8,0);
    prog_data = (unsigned char far *)MK_FP(GDT_ENTRY_7,0);
    byte_count = MEM_64K;
    results = Program_Block(flash, base, byte_count, prog_data);
```

```c
/***** Work on the second block of 48K    *************************/
                            /* Establish descriptors for the Flash & Data   */
Set_GDT_Entry(GDT_ENTRY_7, Make_Physical_Address(data_block_2),
DATA_DESCRIPTOR);
  Set_GDT_Entry(GDT_ENTRY_8,
             *((unsigned long far *)MK_FP(GDT_CS_ENTRY,
FP_OFF(&globals.flash_seg_2))),
             DATA_DESCRIPTOR);

if (results = = SUCCESS)
  {
       flash = (unsigned char far *)MK_FP(GDT_ENTRY_8,0);
       prog_data = (unsigned char far *)MK_FP(GDT_ENTRY_7,0);
       byte_count = MEM_48K;
       results = Program_Block(flash, base, byte_count, prog_data);
  }

/***** Work on the third block of 4K    *************************/
                            /* Establish descriptors for the Flash & Data   */
Set_GDT_Entry(GDT_ENTRY_7, Make_Physical_Address(data_block_3),
DATA_DESCRIPTOR);
  Set_GDT_Entry(GDT_ENTRY_8,
             *((unsigned long far *)MK_FP(GDT_CS_ENTRY,
FP_OFF(&globals.flash_seg_3))),
             DATA_DESCRIPTOR);

if (results = = SUCCESS)
  {
       flash = (unsigned char far *)MK_FP(GDT_ENTRY_8,0);
       prog_data = (unsigned char far *)MK_FP(GDT_ENTRY_7,0);
       byte_count = MEM_4K;
       results = Program_Block(flash, base, byte_count, prog_data);
  }
            /***** Work on the fouth block of 4K    *************************/
                            /* Establish descriptors for the Flash & Data   */
Set_GDT_Entry(GDT_ENTRY_7, Make_Physical_Address(data_block_4),
DATA_DESCRIPTOR);
  Set_GDT_Entry(GDT_ENTRY_8,
             *((unsigned long far *)MK_FP(GDT_CS_ENTRY,
FP_OFF(&globals.flash_seg_4))),
             DATA_DESCRIPTOR);

if (results = = SUCCESS)
  {
       flash = (unsigned char far *)MK_FP(GDT_ENTRY_8,0);
       prog_data = (unsigned char far *)MK_FP(GDT_ENTRY_7,0);
       byte_count = MEM_4K;
       results = Program_Block(flash, base, byte_count, prog_data);
  }
```

```c
/***** Finish up and exit to caller ***************************/
                                /* Return the device to normal mode   */
  *base = READ_MODE2;
  Set_VPP(VPP_LOW);                       /* Lower the VPP voltage     */

Exit_Protected_Mode_Bridge(segment_keep);    /* Return to Real Mode    */
  return (results);
}
/************************************************************************/
/* PPINTEL.C             Intel Program3                           */
/*                                                                */
/* Purpose: This routine programs the 120K data buffer into the FLASH  */
/*     EPROM device 28F001BX.                                     */
/*                                                                */
/* Parameters:                                                    */
/*     data_block_b - ptr to the 8K boot block to be programmed.  */
/*                                                                */
/* Return Values:                                                 */
/*     0 - Success. Device has been successfully programmed.      */
/*     2 - Vpp low detected.                                      */
/*     4 - Program error.                                         */
/************************************************************************/
int near
Intel_Program3(unsigned char far *data_block_b)
{
  int             results; /* Temp holds return values   */
  unsigned char far    *flash;     /* Pointer to flash device    */
  unsigned char far    *base;      /* Pointer to flash base address*/
  long            byte_count;  /* Counter of device block size */
  unsigned char far    *prog_data;  /* Pointer to data buffer    */
  unsigned int    segment_keep; /* Keeps the current CS contents*/ segment_keep = ENTER_PROTECTED_MODE_FAR();   /* Enter protected mode
     */
                                /* Establish descriptors for the Flash dev.   */
  Set_GDT_Entry(GDT_ENTRY_7, Make_Physical_Address(data_block_b),
DATA_DESCRIPTOR);
  Set_GDT_Entry(GDT_ENTRY_8,
           *((unsigned long far *)MK_FP(GDT_CS_ENTRY,
FP_OFF(&globals.flash_seg_1))),
           DATA_DESCRIPTOR);
  base = (unsigned char far *)MK_FP(GDT_ENTRY_8,0);

Set_VPP(VPP_HIGH);                  /* Raise the VPP voltage   */
      Hw_Delay(TEN_MS);
  Set_PWD(VPP_HIGH);                  /* Raise the VPP voltage   */
      Hw_Delay(TEN_MS);

/***** Work on the boot block of 8K   ***********************/
  Set_GDT_Entry(GDT_ENTRY_8,
```

-68-

```
        *((unsigned long far *)MK_FP(GDT_CS_ENTRY,
FP_OFF(&globals.flash_seg_2))),
            DATA_DESCRIPTOR);

flash = (unsigned char far *)MK_FP(GDT_ENTRY_8,MEM_56K);
    prog_data = (unsigned char far *)MK_FP(GDT_ENTRY_7,0);
    byte_count = MEM_8K;
    results = Program_Block(flash, base, byte_count, prog_data);
    /***** Finish up and exit to caller ****************************/
                                    /* Return the device to normal mode */
    *base = READ_MODE2;
    Set_PWD(VPP_LOW);           /* Raise the VPP voltage    */
        Hw_Delay(TEN_MS);
    Set_VPP(VPP_LOW);              /* Lower the VPP voltage    */

Exit_Protected_Mode_Bridge(segment_keep);   /* Return to Real Mode   */
    return (results);
}
/*****************************************************************/
/* PPINTEL.C          Program Block                             */
/*                                                               */
/* Purpose: This routine programs a single block of the flash device */
/*    with the data passed into the block addressed by the passed  */
/*    pointer. This routine expects the VPP line to be in its high */
/*    state.                                                      */
/*                      */
/* Parameters:                                                    */
/*    flash    - Pointer to the byte to program in the device.    */
/*    data_byte - the data value to program in the device.        */
/*                                                                */
/* Return Values:                                                 */
/*    0 - Success. Device has been successfully programmed.       */
/*    2 - Vpp low detected.                                       */
/*    4 - Program error.                                          */
/*****************************************************************/ int near
Program_Block(unsigned char far *flash, unsigned char far *base, long size, unsigned char far
*prog_data)
{
    int    result;              /* Temp holds return values */
    unsigned long byte_count = size;
    result = PROG_ERROR;
    while (byte_count-- != 0)     /* Program all bytes of block */
    {
        result = Program_Byte2(flash, base, *prog_data);
        if (result != SUCCESS)
        { /* Error in programming the byte.  */
            break;                  /* Abort with device error   */
```

```
        }
        flash++;                    /* Advance flash pointer           */
        ·prog_data++;               /* Advance program data pointer    */
    } /* end while */
    return(result);
}

/************************************************************************/
/* PPINTEL.C              Program Byte2                                 */
/*                                                                      */
/* Purpose: This routine programs a single byte of the flash device     */
/*      with the data passed into the addressed by the passed pointer.  */
/*      This routine expects the VPP line to be in its high state.      */
/*                                                                      */
/* Parameters:                                                          */
/*      flash    - Pointer to the byte to program in the device.        */
/*      data_byte - the data value to program in the device.            */
/*                                                                      */
/* Return Values:                                                       */
/*      0 - Success. Device has been successfully programmed.           */
/*      2 - Vpp low detected.                                           */
/*      4 - Program error.                                              */
/************************************************************************/ int near
Program_Byte2(unsigned char far *flash, unsigned char far *base, unsigned char data_byte)
{
        unsigned char srd;

int     result;                 /* Temp holds return values */

*flash = PGM_SETUP;         /* Send the Program Setup cmd      */
        *flash = data_byte;         /* Program the byte                */

Delay_10us();
        /* Allow the chip to complete programming   */

/* Check if device is already programed.                     */
        *base = READ_STATUS;
        srd = *base;
        while (srd < 0x80U )        /* Check if programming has finished */
        {
            *base = READ_STATUS;
            srd = *base;
        } /* end while */
        if (srd & 0x08U)
        { /* Vpp range error */
            result = VPP_RANGE_ERROR;
        }
```

```
          else if (srd & 0x10U)
          { /* Program error */
            *result = PROG_ERROR;
          }
          else
          { /* Successful erasure */
            result = SUCCESS;
          }
                                    /* Clear Status Register */
          *base = CLEAR_STATUS;
    return(result);
}
/***********************************************************************/
/* PPINTEL.C              Intel Erase                              */
/*                                                                 */
/* Purpose: This routine is responsible for erasing the entire FLASH */
/*      memory device. For this Intel part, the erasure process is a */
/*      two part process. First the part must be programmed to all 0's, */
/*      then the erase command is used to clear the part.          */
/*                                                                 */
/* Parameters: none.                                               */
/*                                                                 */
/* Return Values:                                                  */
/*      0 - Success. Device has been completely erased.            */
/*      1 - Device Error. The device still failed after all retries. */
/*                                                                 */
/***********************************************************************/
int near
Intel_Erase()
{
    int           results;        /* Temp holds return values */
    int           erase_retries;  /* Number of times to try erasure */
    unsigned int  segment_keep;   /* Keeps the current CS contents */ segment_keep = ENTER_PROTECTED_MODE_FAR();  /* Enter protected mode
         */
                                  /* Establish descriptors for the Flash device */
    Set_GDT_Entry(GDT_ENTRY_7,
                 *((unsigned long far *)MK_FP(GDT_CS_ENTRY,
    FP_OFF(&globals.flash_seg_low))),
                 DATA_DESCRIPTOR);
    Set_GDT_Entry(GDT_ENTRY_8,
                 *((unsigned long far *)MK_FP(GDT_CS_ENTRY,
    FP_OFF(&globals.flash_seg_high))),
                 DATA_DESCRIPTOR);

/* Check if the device is already erased, else prep the device. */
    results = Check_Device_Erased((unsigned char far *)MK_FP(GDT_ENTRY_7,0),
    MEM_64K-1);
```

```c
    results |= Check_Device_Erased((unsigned char far *)MK_FP(GDT_ENTRY_8,0),
MEM_64K-1);
    if (results)
    { /* Device is not erased, proceed with erasure process.       */
        Set_VPP(VPP_HIGH);          /* Raise the VPP voltage        */
        erase_retries = 1000;       /* Load upper limit of attempts */
        while (erase_retries--)     /* Attempt to erase device.     */
        {
            *(unsigned char far *)MK_FP(GDT_ENTRY_7,0) = ERASE_SETUP;
            *(unsigned char far *)MK_FP(GDT_ENTRY_7,0) = ERASE_ALL;
            Hw_Delay(TEN_MS);       /* Allow the chip to complete erasure */
            if (Verify_Erasure((unsigned char far *)MK_FP(GDT_ENTRY_7,0), MEM_64K-1)
            && Verify_Erasure((unsigned char far *)MK_FP(GDT_ENTRY_8,0), MEM_64K-
1))
            { /* Device has been completely erased. Finish up & exit */
                results = SUCCESS;  /* Record erasure status        */
                break;              /* Leave the while loop         */
            }
        } /* end while */
                                    /* Return the device to normal mode */
        *(unsigned char far *)MK_FP(GDT_ENTRY_7,0) = READ_MODE;
        Set_VPP(VPP_LOW);           /* Lower the VPP voltage        */
    }
    Exit_Protected_Mode_Bridge(segment_keep);  /* Return to Real Mode */
    return (results);
}

/******************************************************************/
/* PPINTEL.C       Check Device Erased                            */
/*                                                                */
/* Purpose: This routine checks a block of the flash device to see if */
/*          it is erased. If it is, a return code is passed back indicating */
/*          this condition. If the block is NOT erase, then all bytes in */
/*          the block are programmed to zero (0) in preparation for a device*/
/*          erasure command cycle. This routine expects VPP to be LOW. */
/*                                                                */
/* Parameters:                                                     */
/*      flash   - far pointer to the block to be tested.          */
/*      size    - size (in bytes) of the block to be tested. Max 65535 */
/*                                                                */
/* Return Values:                                                  */
/*      FALSE - Block tested to be fully erased.                  */
/*      TRUE  - Block had at least one non-erased byte.           */
/*                                                                */
/******************************************************************/
int near
Check_Device_Erased(unsigned char far *flash, long size)
{
    unsigned long   block_offset;   /* Offset into block of EPROM   */
```

-72-

```c
/* Check if device is already erased.                              */
for (block_offset = 0; block_offset < = size; block_offset++)
{ /* Check all locations in device's block for erased value        */
    if (flash[block_offset] != 0xFFU)
        { /* Block NOT erased.                    */
            break;
        }
} /* end for */ if (block_offset > (unsigned long)size)
{ /* Above loop completed with no error    */
    return (FALSE);                    /* Device block is erased.        */
}

/* Set all memory locations to zero prior to erasure command.      */
Set_VPP(VPP_HIGH);                     /* Put the VPP line to high       */
for ( ; size >= 0 ; size--, flash++)
{
    if (*flash != 0)
        { /* Force all bytes to zero in prep for programming   */
            if (Program_Byte(flash, (unsigned char)0x00))
            { /* Error in programming the byte.  */
/***BDW          Set_VPP(VPP_LOW); /* Yes,                              */BDW***/
/***1/16/90      return (TRUE);          /* return the error.           */BDW***/
            }
        }
} /* end for */
Set_VPP(VPP_LOW);                      /* Put VPP line back to low       */
return (TRUE);                         /* return with an error.*/
}

/****************************************************************/
/* PPINTEL.C       Verify Erasure                                 */
/*                                                                */
/* Purpose: This routine checks the device under VPP = HIGH to see if the */
/*      device block has been erased. This routine expects VPP = HIGH.    */
/*                                                                */
/* Parameters:                                                    */
/*      flash   - far pointer to the flash device block to be tested.   */
/*      size    - size (in bytes) of the block to test. Max 65535.   */
/*                                                                */
/* Return Values:                                                 */
/*      TRUE  - Device block is fully erased.                     */
/*      FALSE - At least one byte in the block was NOT erased.    */
/*                                                                */
/****************************************************************/
int near
Verify_Erasure(unsigned char far *flash, long size)
{
    /* Check if device is already erased.                         */
```

```c
for ( ; size >= 0; size--, flash++)
{
    *flash = ERASE_VERIFY;
    Delay_10us();                      /* Minimum of 6 us are required */
    if (*flash != 0xFF)
    { /* Device didn't erase fully. */
        return (FALSE);
    }
} /* end for */ return(TRUE);
}

/*****************************************************************/
/* PPINTEL.C            Intel Program                            */
/*                                                               */
/* Purpose: This routine programs the 128K data buffer into the FLASH */
/*     EPROM device. The programming loop is repeated upto 25 times   */
/*     to program the device, after which a device error is returned. */
/*                                                               */
/* Parameters:                                                   */
/*      data_block_low - ptr to low 64K data block to be programed. */
/*      data_block_high - ptr to high 64K data block to be programmed */
/*                                                               */
/* Return Values:                                                */
/*      0 - Success. Device has been completely programmed.      */
/*      1 - Device Error. The device still failed after all retries. */
/*                                                               */
/*****************************************************************/
int near
Intel_Program(unsigned char far *data_block_low, unsigned char far *data_block_high)
{
    int              results;    /* Temp holds return values */
    unsigned char far *flash;    /* Pointer to flash device */
    long             byte_count; /* Counter of device block size */
    unsigned char far *prog_data; /* Pointer to data buffer */
    unsigned int segment_keep;   /* Keeps the current CS contents*/ segment_keep = ENTER_PROTECTED_MODE_FAR();  /* Enter protected mode */
                                /* Establish descriptors for the Flash dev. */
    Set_GDT_Entry(GDT_ENTRY_7, Make_Physical_Address(data_block_low),
DATA_DESCRIPTOR);
    Set_GDT_Entry(GDT_ENTRY_8,
                *((unsigned long far *)MK_FP(GDT_CS_ENTRY,
FP_OFF(&globals.flash_seg_low))),
                DATA_DESCRIPTOR);
```

```
results = DEVICE_ERROR;              /* Assume error unitl good end    */

Set_VPP(VPP_HIGH);                   /* Raise the VPP voltage          */

/***** Work on the first block of 64K ************************/
flash = (unsigned char far *)MK_FP(GDT_ENTRY_8,0);
prog_data = (unsigned char far *)MK_FP(GDT_ENTRY_7,0);
byte_count = MEM_64K;

while (byte_count-- != 0)            /* Program all bytes of block     */
{
    results = Program_Byte(flash, *prog_data);
    if (results != SUCCESS)
    { /* Error in programming the byte.  */
        break;                       /* Abort with device error        */
    }
    flash++;                         /* Advance flash pointer          */
    prog_data++;                     /* Advance program data pointer   */
} /* end while */

/***** Work on the second block of 64K ************************/
                                     /* Establish descriptors for the Flash & Data */
Set_GDT_Entry(GDT_ENTRY_7, Make_Physical_Address(data_block_high),
DATA_DESCRIPTOR);
Set_GDT_Entry(GDT_ENTRY_8,
              *((unsigned long far *)MK_FP(GDT_CS_ENTRY,
FP_OFF(&globals.flash_seg_high))),
              DATA_DESCRIPTOR);

if (results == SUCCESS)
{
    flash = (unsigned char far *)MK_FP(GDT_ENTRY_8,0);
    prog_data = (unsigned char far *)MK_FP(GDT_ENTRY_7,0);
    byte_count = MEM_64K;

while (byte_count-- != 0)        /* Program all bytes of block     */
    {
        results = Program_Byte(flash, *prog_data);
        if (results != SUCCESS)
        {
            break;                   /* Abort with device error        */
        }
        flash++;                     /* Advance flash pointer          */
        prog_data++;                 /* Advance program data pointer   */
    } /* end while */
}

/***** Finish up and exit to caller ************************/
                                     /* Return the device to normal mode */
*(unsigned char far *)MK_FP(GDT_ENTRY_7,0) = READ_MODE;
```

-75-

```
Set_VPP(VPP_LOW);                        /* Lower the VPP voltage        */

Exit_Protected_Mode_Bridge(segment_keep);   /* Return to Real Mode       */
return (results);
}

/*******************************************************************/
/* PPINTEL.C           Program Byte                                */
/*                                                                 */
/* Purpose: This routine programs a single byte of the flash device */
/*      with the data passed into the addressed by the passed pointer. */
/*      This routine expects the VPP line to be in its high state. */
/*                                                                 */
/* Parameters:                                                     */
/*      flash    - Pointer to the byte to program in the device.   */
/*      data_byte - the data value to program in the device.       */
/*                                                                 */
/* Return Values:                                                  */
/*      0 - Success. Device has been completely erased.            */
/*      1 - Device Error. The device still failed after all retries. */
/*                                                                 */
/*******************************************************************/ int near
Program_Byte(unsigned char far *flash, unsigned char data_byte)
{
    int     prog_retries;          /* Number of times to try erasure    */ prog_retries = 25;             /* Load upper limit of attempts      */
    while (prog_retries--)
    { /* Attempt to prog device. */
        *flash = PGM_SETUP;                /* Send the Program Setup cmd    */
        *flash = data_byte;                /* Program the byte              */

Delay_10us();
        /* Allow the chip to complete programming   */

*flash = PGM_VERIFY;               /* Stops programming cycle       */

Delay_10us();              /*Minimum of 6 microseconds are required */ if (*flash = = data_byte)  /* Check the location to see...  */
        { /* Programmed correctly. */
            *flash = READ_MODE;            /* Return the device to normal mode */
            return (SUCCESS);      /* if written data is correct    */
        }
    } /* end while */

*flash = READ_MODE;            /* Return the device to normal mode  */
```

```c
        return (DEVICE_ERROR);
}

/******************** for debug ********************************/
#define     TIMER_CMD_REG   0x43
#define TIMER2_LATCH        0x42
#define PL_PROG_PORT        0x61    /* Peripheral Interface port */
#define TIMER2_ENABLE  0x01         /* Bit 0 */
define TIMER2_OUT          0x20    /* Bit 5 */ void
Hw_Delay(int timeout)
{
        asm     MOV     AL, 10110010B;
        asm     OUT     TIMER_CMD_REG, AL;      /* Program channel 2 to mode 1 and use binary */
        _AX = timeout;
        asm     OUT     TIMER2_LATCH, AL;       /* LSB of timeout value, granuity = 1/1.19MHz */
        asm     OUT     TIMER2_LATCH, AX;       /* MSB of timeout value */
        asm     IN      AL, PL_PROG_PORT;
        asm     AND     AL, 11111100B;          /* Disable speaker */
        asm     OR      AL, TIMER2_ENABLE;      /* Enable and start Timer 2 */
        asm     OUT     PL_PROG_PORT, AL;       /* Do it */
DLY10::
        asm     IN      AL, PL_PROG_PORT;       /* Monitor timer2 output */
        asm     TEST    AL, TIMER2_OUT;
        asm     JNZ     DLY10;                  /* wait for time2 output got stablized */
DLY20::
        asm     IN      AL, PL_PROG_PORT;       /* Monitor timer2 output */
        asm     TEST    AL, TIMER2_OUT;
        asm     JZ      DLY20;                  /* Not time out yet */
        asm     IN      AL, PL_PROG_PORT;
        asm     AND     AL, 11111110B;          /* Stop timer 2 counting */
        asm     OUT     PL_PROG_PORT, AL;       /* Do it */
} define     US_DELAY    0x1

Delay_10us()
{
        asm     MOV     AX,GDT_CS_ENTRY;  /*routine is in protectect mode */
        asm     MOV     ES,AX;
        asm     MOV     BX,OFFSET globals.program_delay_constant;
        asm     MOV     CX,ES:[BX];
```

```
DLY10:;
        asm    LOOP DLY10;
}
/*
Delay_6us()
{
        asm    MOV  CX,1*US_DELAY;
DLY6:;
        asm    LOOP DLY6;
}
*/

/*::::::::::::::::::::::::End of File::::::::::::::::::::::::::::*/
```

```c
/*********************************************************************/
/* PPROM.H         Include file for Flash EEPROM utilities          */
/*                                                                   */
/*                                                                   */
/*********************************************************************/
#define MEM_4K      (unsigned long)(4UL * 1024UL)    /* 4K memory size decl */
#define MEM_8K      (unsigned long)(8UL * 1024UL)    /* 4K memory size decl */
#define MEM_48K     (unsigned long)(48UL * 1024UL)   /* 48K memory size decl */
#define MEM_52K     (unsigned long)(52UL * 1024UL)   /* 52K memory size decl */
#define MEM_56K     (unsigned long)(56UL * 1024UL)   /* 56K memory size decl */
#define MEM_64K     (unsigned long)(64UL * 1024UL)   /* 64K memory size decl */
#define FLASH_SIZE  (unsigned long)(248UL * 1024UL)  /* Size of EEPROM in bytes */
#define BBLOCK_SIZE (unsigned long)(8UL * 1024UL)    /* Size of EEPROM in bytes */
#define ROM_SIZE    (unsigned long)(256UL * 1024UL)  /* Size of EEPROM in bytes */
define HEADER_SIZE (unsigned long)(1024UL)          /* Size of header: 2 SECTORS */ define FNAME_SIZE  8        /* Length of max DOS file name   */
define FEXT_SIZE   3        /* Length of max DOS extension   */ define VPP_LOW     0        /* Parameter to functions        */
define VPP_HIGH    1        /* Parameter to functions        */ define KBDSTATUS 1          /* For INT 16 */

/*********************************************************************/
/*    Macros used to manipulate far addresses                       */
#define FP_OFF(fp)    ((unsigned)(fp))
#define FP_SEG(fp)    ((unsigned)((unsigned long)(fp) >> 16))
#define MK_FP(seg,ofs) ((void far *) \
                       (((unsigned long)(seg) << 16) | (unsigned)(ofs)))

/*********************************************************************/
/*    Screen related constants and structures                       */ define SCREEN_WIDTH   80
define SCREEN_LENGTH  25
#define NORMAL_ATTR    0x17    /* Blue bkgnd,white chars        */
#define HIGHLT_ATTR    0x1F    /* Blue bkgnd,Bright White char  */
#define ERROR_ATTR     0x4F    /* Red  bkgnd,Bright White char  */
#define BLKBG_ATTR     0x07    /* Blue bkgnd,white chars        */
```

```c
union video_ram        {              /* Describes video memory layout*/
    unsigned short int  cell;         /* within the video RAM for     */
    struct two_bytes    {             /* video mode 3                 */
        unsigned char  character;     /* With both word and byte      */
        unsigned char  attribute;     /* access definitions.          */
    } byte;                           /* Don't forget 8086 byte swap  */
};                                    /* when using word accesses     */ struct header_format {
    char machine_id[8];
    unsigned int hw_version;
    char fw_date[8];
    char space;
    char copy_right[11];
    char unused[2];
    char fw_version[3];
    char *fill;
};

union image_header {
    unsigned int far    *buffer;
    struct header_format *header;
};

union checksum_word {
    unsigned long int dword;
    unsigned int sword[2];
};

extern struct gbls     {
    unsigned char far  *image_segment_1;   /* Segment pointer to 1st 64K block */
    unsigned char far  *image_segment_2;   /* Segment pointer to 2cd 64K block */
    unsigned char far  *image_segment_3;   /* Segment pointer to 3rd 64K block */
    unsigned char far  *image_segment_4;   /* Segment pointer to 4th 48K block */
    unsigned char far  *image_segment_41;  /* Segment pointer to 5th 4K block  */
    unsigned char far  *image_segment_42;  /* Segment pointer to 6th 4K block  */
    union video_ram far (*screen_image)[]; /* Pointer to the screen bufer */
    int                 video_msg_pointer; /* index to the next msg location */
    char                image_filename[14]; /* Name of code image file   */
    struct disk_stuff   disk;              /* Disk handler variables    */
    unsigned int        program_delay_constant; /* program cycly time for flash */
    unsigned long       flash_seg_low;     /* Address at which to find the */
    unsigned long       flash_seg_high;    /* first Flash part in the system*/
    unsigned long       flash_seg_1;       /* Address at which to find the */
    unsigned long       flash_seg_2;       /* second Flash part in the system */
    unsigned long       flash_seg_3;
    unsigned long       flash_seg_4;
} far globals;
```

-80-

```c
/***************************************************************/
/*      Function Prototypes                                  */
/***************************************************************/ void    near Send_SCP_Cmd(int);             /* Found in LDFLASH.C  */
void    near Load_Flash_EEPROM (char);      /* Found in LDFLASH.C  */
void    near Display_User_Msg (char ,char s[]);
void    near Clear_Display_Ram ();
void    near Clear_Display_Ram2 ();
void    near Display_Program_Banner ();
void    near Display_Prog_Num (int);
void    near Set_Display_Start ();
int     near Write_EEPROM_Data ();
int     near Write_BBLOCK_Data ();
void    near Program_Err_Msg (int);
void    near Set_VPP(int);
void    near Set_PWD(int);

int     near SEEQ_Erase();                  /* EEPROM dependent routines  */
int     near SEEQ_Program(unsigned char far *,unsigned char far *);
int     near Intel_Erase();
int     near Intel_Erase2();
int     near Intel_Erase3();
int     near Intel_Program(unsigned char far *,unsigned char far *);
int     near Intel_Program2(unsigned char far *,unsigned char far *,\
                    unsigned char far *,unsigned char far *);
int     near Intel_Program3(unsigned char far *);

int     near Check_Disk_Ready ();           /* Found in PPROM.C */
int     near Find_Image_File ();
int     near Read_Image_File ();
int     near Read_BImage_File ();
int     near Verify_Machine(unsigned int);
int     near Wait_Floppy (int);
int     near Checksum_Image(unsigned char far *, unsigned long);
void    near Display_Firmware_Version(struct header_format *);

/* Found in Machine dependent file  */
void    near Mach_Entry_Init();
void    near Mach_Program_Setup();
```

-81-

```c
/*****************************************************************/
/* Protect.c          Protected Mode Routines                    */
/*                                                                */
/* These routines are used to enter and exit the Intel 80x86 family's */
/* protected mode of execution.                                   */
/* These routines are tightly coupled with associated routines in the */
/* BIOS ROM. A default GDT is provided by the ROM and must not be */
/* altered except for the two 'user entries'.                    */
/*                                                                */
/*****************************************************************/
#include "protect.h"

/*****************************************************************/
/* PROTECT.C          Enter Protected Mode                       */
/*                                                                */
/* Purpose: Place the processor into protected mode. This is needed */
/*          because the code buffer and the receiving FLASH EPROM part are */
/*          both 128K in size. We must use protected mode to be able to */
/*          address the FLASH part which resides in very high memory... */
/*          0xFFFE0000 - 0xFFFFFFFF                               */
/*                                                                */
/* Parameters: none                                               */
/*                                                                */
/* Return Values: int - The current CS segment register contents. This */
/*                will be required on the Exit_Prot_Mode call    */
/*                                                                */
/* Note: These two protected mode routines must be used as a pair. They */
/*       are tightly coupled with the BIOS ROM's P.M. entry and exit */
/*       routines. All of these routines depend on a default GDT table */
/*       provided by the ROM. Constants for this structure can be found */
/*       in the include file 'protect.h' but a summary is shown here: */
/*       Default GDT entries:                                     */
/*           0     Null entry, never used                         */
/*           1     GDT entry. Points to the GDT itself            */
/*           2     IDT entry. Points to a default IDT             */
/*           3     DS entry. Points to segment in DS at entry     */
/*           4     ES entry. Points to segment in ES at entry     */
/*           5     SS entry. Points to segment in SS at entry     */
/*           6     CS entry. Points to segment in CS at entry     */
/*           7     user entry 1.                                  */
/*           8     user entry 2.                                  */
/*       This routine uses the ES register to convert the caller's */
/*       segment into a selector. Therefore, entry 4 becomes the code */
/*       selector for the user's routines. The CS entry remains the code */
/*       selector for the ROM's protected mode routines.         */
/*                                                                */
/*             This routine found in the monitor segment         */
/*****************************************************************/
extern unsigned int far ENTER_PROTECTED_MODE_FAR();
```

```c
/*****************************************************************/
/* PROTECT.C          Exit Protected Mode Bridge                 */
/*                                                               */
/* Purpose: This is a 'bridge' to the BIOS based routine that returns */
/*       the processor to REAL mode. After the EEPROM            */
/*       accesses have been completed, the program must return to REAL */
/*       mode before returning to the monitor prompt or DOS.     */
/*                                                               */
/* Parameters: int - The CS segment register contents for REAL mode for */
/*                   this routine (and its caller).              */
/*                                                               */
/* Return Values: none                                           */
/*                                                               */
/* TRICK: Since these two protected mode routines must be used as a */
/*       pair, we know that the CS entry in the GDT contains the proper */
/*       values for the execution segment of the BIOS ROM's routine */
/*       EXIT_PROTECTED_MODE_FAR. We will use this fact to create the */
/*       correct far call address for use inside protected mode. */
/*                                                               */
/*****************************************************************/
extern void far EXIT_PROTECTED_MODE_FAR(unsigned int);
void near
Exit_Protected_Mode_Bridge(unsigned int keep_segment)
{
  void far (*Far_Proc)();          /* Work pointer to far procedure*/

/* Initialize the proc address &*/
                                   /* Change the selector to CS_GDT*/
  Far_Proc = MK_FP(GDT_CS_ENTRY, FP_OFF(&EXIT_PROTECTED_MODE_FAR));
  Far_Proc(keep_segment);          /* Make the call                */
}

/*****************************************************************/
/* Protect.C          Setup a GDT entry                          */
/*                                                               */
/* Purpose: Modify the contents of a GDT entry for use by the calling */
/*       program. The selector specified should be one of the 'user' */
/*       entries in the default GDT shown above.                 */
/*                                                               */
/* Parameters:                                                   */
/*       selector - offset into GDT of the selector to be modified */
/*       physical_address - 32 bit address the selector is to point to */
/*       type - 0 - selector is to be a writable data segment    */
/*             !0 - selector is to be a readable code segment    */
/*                                                               */
/* Return Values: none.                                          */
```

```c
/*                                                                      */
/**********************************************************************/
void near
Set_GDT_Entry(unsigned int selector, unsigned long physical_address, int type)
{
  register union descriptors far *gdt_ptr;      /* Pointer to GDT entry    */ gdt_ptr = (union descriptors far *)MK_FP(GDT_GDT_ENTRY,selector);

gdt_ptr->descriptor.segment_limit   = (unsigned int)0xFFFF;
  gdt_ptr->descriptor.seg_base_0_15   = FP_OFF(physical_address);
  gdt_ptr->quarters.three             = 0x9100;   /* set 3 flags: accessed, system, present
      */
  gdt_ptr->descriptor.seg_base_16_23  = FP_SEG(physical_address) & 0xFFU;
  gdt_ptr->descriptor.type            =
          type ? DTYPE_CODE+DTYPE_READABLE :
DTYPE_DATA+DTYPE_WRITABLE;
  gdt_ptr->quarters.four              = 0;
  gdt_ptr->descriptor.seg_base_24_31  = (FP_SEG(physical_address) & 0xFF00U) >> 8;

}

/**********************************************************************/
/* Protect.C        Make a Physical Address                            */
/*                                                                     */
/* Purpose: To translate a segment:offset address into a linear 32 bit */
/*      physical address for use in protected mode descriptors.        */
/*                                                                     */
/* Parameters:                                                         */
/*      real_address - real mode segment:offset type address           */
/*                                                                     */
/* Return Values:                                                      */
/*      unsigned long - 32 bit linear/physical address                 */
/*                                                                     */
/**********************************************************************/
unsigned long
Make_Physical_Address(void far *real_address)
{
  asm MOV   AX,real_address+2;   /* Load the segment value       */
  asm XOR   DX,DX;                   /* Clear out upper word      */
  asm MOV   DL,AH;                   /* Copy top 4 bits to upper word*/
  asm SHR   DL,4;                /* DX = top word                */
  asm SHL   AX,4;                /* AX = low word                */
  asm ADD   AX,real_address;     /* Add in the offset            */
  asm ADC   DX,0;                /* Account for carry to top word*/
}
```

```c
/*****************************************************************/
/* PROTECT.H            Protected Mode Definitions               */
/*                                                               */
/*****************************************************************/
#define FP_OFF(fp)     ((unsigned)(fp))
#define FP_SEG(fp)     ((unsigned)((unsigned long)(fp) >> 16))
#define MK_FP(seg,ofs) ((void far *) \
                       (((unsigned long)(seg) << 16) | (unsigned)(ofs)))

struct desc_code_data {                /* Generic code/data descriptor layout */
  unsigned int  segment_limit;      /* Size of the segment (see granularity)*/
  unsigned int  seg_base_0_15;      /* Low word of segment base address */
  unsigned char seg_base_16_23;     /* Low byte of high word of segment addr*/
  unsigned int  accessed:1;         /* Accessed control bit, used by CPU  */
  unsigned int  type:3;             /* Descriptor type                    */
  unsigned int  system:1;           /* System desc designator, 0=sys, 1=data*/
  unsigned int  priviledge_level:2; /* Descriptor priviledge level        */
  unsigned int  present:1;          /* Present bit, for use in swapping   */
  unsigned int  seg_limit_16_19:4;  /* Top 4 bits of segment size vlaue   */
  unsigned int  user_bit:1;         /* Bit available for user definition  */
  unsigned int  :1;                 /* Constant 0 bit                     */
  unsigned int  :1;                 /* Undefined bit                      */
  unsigned int  granularity:1;      /* Granularity of size:0=bytes, 1=4Kbytes */
  unsigned char seg_base_24_31;     /* High byte of high word of segment addr */
};

struct desc_system {                   /* System special descriptors layout  */
  unsigned int  segment_limit;      /* Size of the segment (see granularity)*/
  unsigned int  seg_base_0_15;      /* Low word of segment base address */
  unsigned char seg_base_16_23;     /* Low byte of high word of segment addr*/
  unsigned int  type:4;             /* Descriptor type                    */
  unsigned int  system:1;           /* System descriptor designator bit   */
  unsigned int  priviledge_level:2; /* Descriptor priviledge level        */
  unsigned int  present:1;          /* Present bit, for use in swapping   */
  unsigned int  seg_limit_16_19:4;  /* Top 4 bits of segment size vlaue   */
  unsigned int  user_bit:1;         /* Bit available for user definition  */
  unsigned int  :1;                 /* Constant 0 bit                     */
  unsigned int  :1;                 /* Undefined bit                      */
  unsigned int  granularity:1;      /* Granularity of size:0=bytes, 1=4Kbytes */
  unsigned char seg_base_24_31;     /* High byte of high word of segment addr */
};

struct desc_gate {                     /* System call gate descriptor layout */
  unsigned int  proc_offset_0_15;   /* Offset of procedure entry point    */
  unsigned int  selector;           /* Segment selector for procedure     */
  unsigned int  dword_count:5;      /* Double word count                  */
  unsigned int  :3;                 /* Constant 0 bits                    */
  unsigned int  type:4;             /* Descriptor type = C0H for call gate */
  unsigned int  system:1;           /* System descriptor designator bit   */
```

```
    unsigned int  priviledge_level:2;/* Descriptor priviledge level      */
    unsigned int  present:1;       /* Present bit, for use in swapping   */
    unsigned int  proc_offset_16_31;/* Top word of procedure entry offset */
};

struct desc_words {              /* Overlay structure for quick setting */
    unsigned int  one;           /* of descriptor bits. Usually used    */
    unsigned int  two;           /* to clear a descriptor to all 0*/
    unsigned int  three;
    unsigned int  four;
};

union descriptors {
    struct desc_words       quarters;
    struct desc_code_data   descriptor;
    struct desc_system      sys_descriptor;
};

/******************************************************************/
/*   The number of GDT, LDT and IDT entries can be specified by the  */
/*   user or left to default here to these small system values.      */
/******************************************************************/
#ifndef GDT_NUM_ENTRIES
#define GDT_NUM_ENTRIES         16
#endif
#ifndef LDT_NUM_ENTRIES
#define LDT_NUM_ENTRIES         16
#endif
#ifndef IDT_NUM_ENTRIES
#define IDT_NUM_ENTRIES         32
endif define GDT_SIZE   (unsigned int)(GDT_NUM_ENTRIES * sizeof(struct desc_words))
define LDT_SIZE   (unsigned int)(LDT_NUM_ENTRIES * sizeof(struct desc_words))
#define IDT_SIZE   (unsigned int)(IDT_NUM_ENTRIES * sizeof(struct desc_words))

struct global_descriptor_table {     /* List of defined segments in system */
    union descriptors   GDT_frame[GDT_NUM_ENTRIES]; /* Array of descriptors */
};

struct local_descriptor_table {      /* List of defined segments in application */
    union descriptors   LDT_frame[LDT_NUM_ENTRIES]; /* Array of descriptors */
};

struct interrupt_descriptor_table {  /* List of interrupt descriptors */
    union descriptors   IDT_frame[IDT_NUM_ENTRIES]; /* Array of descriptors */
};
```

```
/*****************************************************************/
/*      GDT entry indexes for a default system...         */
/*****************************************************************/
#define GDT_NULL_ENTRY      0x00    /* First entry is always zero   */
#define GDT_GDT_ENTRY       0x08    /* Entry points to the GDT seg */
#define GDT_IDT_ENTRY       0x10    /* Entry points to the IDT seg */
#define GDT_DS_ENTRY        0x18    /* User's value to put in DS    */
#define GDT_ES_ENTRY        0x20    /* User's value to put in ES    */
#define GDT_SS_ENTRY        0x28    /* User's value to put in SS    */
#define GDT_CS_ENTRY        0x30    /* User's value to put in CS    */
#define GDT_ENTRY_7         0x38    /* General purpose entry        */
#define GDT_ENTRY_8         0x40    /* General purpose entry        */

/*****************************************************************/
/*      MACHINE STATUS WORD EQUATES          */
/*****************************************************************/ define MSW_PROTECT_ENABLE  0x01    /* Enable protected mode        */

/* The following 3 bits allow exceptions to be generated on given conditions */ define MSW_MONITOR_XTENT   0x02    /* WAIT causes exceptions       */
define MSW_EMULATE_XTENT   0x04    /* ESC causes exceptions        */
#define MSW_TASK_SWITCH             0x08    /* TS and extension used    */
#define MSW_EXTENSION_TYPE  0x10    /* 1 = 80387 is installed       */

/*****************************************************************/
/*      Descriptor Type definitions                      */
/*                                                       */
/*****************************************************************/
/* The following are generalcode/data descriptors, the system bit = 1 */
#define DTYPE_DATA          0x00    /* Type for data segment        */
#define DTYPE_EXPAND_DOWN   0x02    /* Data segment for stacks      */
#define DTYPE_WRITABLE      0x01    /* Data segment write protected*/
#define DTYPE_CODE          0x04    /* Type for Code segment        */
#define DTYPE_CONFORMING    0x02    /* Code segment conforms to ?   */
#define DTYPE_READABLE      0x01    /* Code segment readable        */

/* The following are special system descriptors, the system bit = 0 */
#define DTYPE_TASK          0x09    /* Type for Task segment        */
#define DTYPE_BUSY          0x02    /* Task busy indicator          */
#define DTYPE_CALL_GATE             0x0C    /* Type for a Call Gate     */
#define DTYPE_TASK_GATE             0x05    /* Type for a Task Gate     */
#define DTYPE_INTERRUPT_GATE        0x0E    /* Type for an Interrupt Gate */
#define DTYPE_TRAP_GATE             0x0F    /* Type for a Trap Gate     */

/*****************************************************************/
```

-87-

```
/* Parameter constants for Set_GDT_entry                              */
/************************************************************************/
#define DATA_DESCRIPTOR       0     /* Make a writable data segment
*/
#define CODE_DESCRIPTOR       1     /* Make a readable code segment
*/
```

```c
/******************************************************************/
/* DISK.H           DOS Disk Structures                           */
/*  .                                                             */
/* Purpose: This include file describes the structures found on a DOS */
/*     disk. These include the boot sector, FAT and directory entry. */
/*                                                                */
/*                                                                */
/******************************************************************/ struct s_disk_boot_sector   {
    unsigned char       jump_inst;
    unsigned int    jump_offset;
    char            OEM_name[8];
    unsigned int    sector_size;          /* # bytes in a sector   */
    unsigned char       cluster_size;     /* # sectors in a cluster  */
    unsigned int    reserved_space;       /* # reserved sectors    */
    unsigned char       FAT_copies;       /* # copies of FAT       */
    unsigned int    num_root_entries;     /* # dir entries in root dir */
    unsigned int    volunm_size;          /* # sectors in volumn   */
    unsigned char       media_type;       /* Media type code       */
    unsigned int    FAT_size;             /* # sectors in FAT copy */
    unsigned int    sectors_per_track;    /* # sectors in a track  */
    unsigned int    num_heads;            /* # of disk heads       */
    unsigned int    num_hidden_sectors;   /* # sectors in hidden files */
    };

struct s_dir_entry  {
    unsigned char       filename[8];      /* name given to file    */
    unsigned char       extension[3];     /* file extension        */
    unsigned char       file_attribute;   /* attribute flags       */
    char            reserved[10];         /* unused bytes (to date) */
    unsigned int    time_field;           /* Creation/update time  */
    unsigned int    date_field;           /* Creation/update date  */
    unsigned int    start_cluster;        /* Index into FAT for file start*/
    unsigned long       file_size;        /* Number of bytes in file */
    };

struct disk_stuff   {                     /* Variables needed by the disk */
    unsigned int far *FAT_address;        /* handling portion of the   */
    int         starting_FAT_entry;       /* flash code.           */
    int         sector_size;
    int         cluster_size;
    int     sectors_per_track;
    int         num_heads;
    int         starting_data_sector;
    unsigned long       file_size;
    };
```

```
#define READ_SECTOR          2        /* BIOS cmd value       */
#define DISK_CHANGE_STATUS   0x16     /* Bios cmd value       */
#define DIR_ENTRY_SIZE       32       /* Bytes in each dir entry  */

/* Disk return codes  */             /* Used by Read_Disk        */
#define GOOD_READ    0
#define NO_FILE      1
#define DISK_ERROR   2
                                     /* Used by Read_Image_File */
#define FILE_ERROR   1
#define FILE2SHORT 2
#define FILE2LONG  3
#define     WRONG_MACH_ID 4
#define BAD_CHECKSUM  5
```

```c
/***********************************************************************/
/* ASCII.H         ASCII character definitions              */
/*                                                          */
/*                                                          */
/***********************************************************************/

/*    Standard ASCII characters                             */ define NULL           0x00    /* Null character or nul pointer*/
define BLANK          0x20    /* Space                    */

/*    Line Drawing characters, double line boxes            */ define DBL_CORNER_TL      0xC9    /* Top left corner          */
define DBL_CORNER_TR      0xBB    /* Top right corner         */
#define DBL_CORNER_BL      0xC8    /* Bottom left corner       */
#define DBL_CORNER_BR      0xBC    /* Bottom right corner      */
#define DBL_HORIZONTAL     0xCD    /* Straight horizontal line */
#define DBL_VERTICAL       0xBA    /* Straight vertical line */
#define DBL_TEE_RIGHT      0xCC    /* TEE to the right         */
#define DBL_TEE_DOWN       0xCB    /* TEE downward               */
#define DBL_TEE_LEFT       0xB9    /* TEE to the left          */
#define DBL_TEE_UP         0xCA    /* TEE upward               */
#define DBL_CROSS     0xCE   /* Full cross              */
#define     DBL_ASTERISK       0x2A    /* Atserisk              */
```

```
/*****************************************************************/
/*    Machine must select which manufacturer's part is to be used */
/*    in their hardware. Presently (June/90) multiple parts are NOT */
/*    supported.                                                  */
/*****************************************************************/
#define MFGR      INTEL        /* Set Chip manufacturer id */
#define MODEL     'B'          /* Set model id             */
/*****************************************************************/
/*    Machine dependent functions...                             */
/*****************************************************************/

/*****************************************************************/
/*                    Mach_Entry_Init                            */
/*                                                               */
/* Purpose: This routine is called as the first thing done by the Flash */
/*      routines. It is responsible for establishing the machine in a */
/*      compatible state for the functions to follow.            */
/*                                                               */
/* Parameters: none.                                             */
/*                                                               */
/* Return value: none.                                           */
/*****************************************************************/
void
Mach_Entry_Init()
{
   _AH = 0;
   _DL = 0;
   asm       INT 13H;
   asm MOV   AX,SEG version_message;   /* Load address of FLASH_DATA */
   asm MOV   DS,AX;                    /* segment                    */ globals.flash_seg_low   = 0x00FC0000UL;   /* Define the location */
   globals.flash_seg_high  = 0x00FD0000UL;   /* of the Flash device. */
   globals.flash_seg_1     = 0x00FE0000UL;   /* Define the location */
   globals.flash_seg_2     = 0x00FF0000UL;   /* of the Flash device. */
   globals.flash_seg_3     = 0x00FFC000UL;
   globals.flash_seg_4     = 0x00FFD000UL;
}

/*****************************************************************/
/*                    Mach_Program_Setup                         */
/*                                                               */
/* Purpose: This routine is called just prior to invoking the Flash */
/*      programming algorithm. It is responsible for establishing the */
/*      machine to a stable state for the programming function.  */
/*                                                               */
/* Parameters: none.                                             */
/*                                                               */
```

```
/* Return value: none.                                              */
/*                                                                   */
/* Function: This routine stabilizes the disk systems by issuing a disk */
/*      BIOS function call to 'reset_disk_system'. The INT 13, sub-  */
/*      function 00H (drive number > 80H) will reset both the hard disk */
/*      and floppy disk controllers, recalibrate the attached drives and*/
/*      prepare the disks for I/O. For the floppy disk system the dirve */
/*      motors are stopped. For the hard disk system, the command should*/
/*      reset the drive timeout value in the controller and give the */
/*      programming algorithm a 60 second period in which to complete. */
/*         Finally, the SPRAT device must be configured to place the */
/*      Flash device in the FFFE0000 - FFFFFFFF address space.        */
/*                                                                   */
/******************************************************************/ define DISK_CONTROL_PORT    03F2H
define DISK_IO_ENABLE       0CH void
Mach_Program_Setup()
{
  _AH = 0x00;                   /* Load BIOS function number*/
  _DL = 0x80;                   /* Select drive #80 - winch 0  */
  asm INT    13H;               /* Reset the disk subsystem.   */

/*     Now turn off the floppy drive's motor.                       */ asm MOV   DX,DISK_CONTROL_PORT;/* Point to disk hardware port */
  asm MOV   AL,DISK_IO_ENABLE;   /* Get the command to shut down */
  asm OUT   DX,AL;               /* Turn the motors off         */

/*    Configure the SPRAT device for Flash at highest memory.       */

}
```

```
***************************************************************
* User name:   MIN (27)            Queue:  FIRMWARE/LASER_P_QUEUE  *
* File name:   PPLOADER.H          Server  FIRMWARE_PSERVER        *
* Directory:                                                       *
* Description: PPLOADER.H                                          *
*              December 2, 92              12:19pm                 *
***************************************************************
*                                                                  *
*                     M  M  III  N   N                             *
*                     MM MM  I   NN  N                             *
*                     M M M  I   N N N                             *
*                     M M M  I   N N N                             *
*                     M   M  I   N N N                             *
*                     M   M  I   N  NN                             *
*                     M   M III  N   N                             *
*                                                                  *
***************************************************************
*                                                                  *
*   PPPP  PPPP  L     OOO    A    DDDD  EEEEE RRRR     H   H       *
*   P  P  P  P  L    O   O  A A   D   D E     R   R    H   H       *
*   P  P  P  P  L    O   O A   A  D   D E     R   R    H   H       *
*   PPPP  PPPP  L    O   O A   A  D   D EEEE  RRRR     HHHHH       *
*   P     P     L    O   O AAAAA  D   D E     R R      H   H       *
*   P     P     L    O   O A   A  D   D E     R  R  .. H   H       *
*   P     P     LLLLL OOO  A   A  DDDD  EEEEE R   R .. H   H       *
*                                                                  *
***************************************************************
```

APPENDIX 2
-93-

```
/****************************************************************/
/* PPLOADER.H       Include file for Flash Recovery utilities   */
/*                                                              */
/*                                                              */
/****************************************************************/
#define HEADER_SIZE    (unsigned long)(1024UL)  /* Size of header: 2 SECTORS */
/* #define UTIL_SIZE   (unsigned long)(64UL * 1024UL) */ /* Size of Flash code */
define UTIL_SIZE      (unsigned long)(16UL * 1024UL)    /* Size of Flash code */ define FNAME_SIZE     8       /* Length of max DOS file name */
define FEXT_SIZE      3       /* Length of max DOS extension */

/****************************************************************/
/*      Screen related constants and structures                 */ define SCREEN_WIDTH   80
define SCREEN_LENGTH  25
#define NORMAL_ATTR    0x17    /* Blue bkgnd,white chars       */
#define HIGHLT_ATTR    0x1F    /* Blue bkgnd,Bright White char */
define ERROR_ATTR     0x4F    /* Red bkgnd,Bright White char  */ union video_ram {                       /* Describes video memory layout*/
    unsigned short int  cell;           /* within the video RAM for     */
    struct two_bytes    {               /* video mode 3                 */
        unsigned char   character;      /* With both word and byte      */
        unsigned char   attribute;      /* access definitions.          */
        } byte;                         /* Don't forget 8086 byte swap  */
    };                                  /* when using word accesses     */
struct header_format {
    char machine_id[8];
    unsigned int hw_version;
    char fw_date[8];
    char space;
    char copy_right[11];
    char unused[2];
    char fw_version[3];
    char *fill;
    };

extern struct gbls      {
    unsigned long       image_segment_f;    /* Segment address for flash utility */
    int                 video_msg_pointer;  /* index to the next msg location    */
    char                image_filename[14]; /* Name of code image file           */
    struct disk_stuff   disk;               /* Disk handler variables            */
    }           globals;
extern union video_ram  (screen_image[]);   /* Interface to the screen buffer    */

/****************************************************************/
/*      Function Prototypes                                     */ int     near Load_Flash_Util ();            /* Found in LDFLASH.C */
void    near Display_User_Msg (char ,char s[]);
void    near Clear_Display_Ram ();
void    near Display_Program_Banner ();
void    near Display_Prog_Num (int);
void    near Set_Display_Start ();

int     near Check_Disk_Ready ();           /* Found in PPROM.C   */
```

```
int     near Find_Image_File ();
int     near Read_Image_File ();
int     near Wait_Floppy (int);
void    near Display_Firmware_Version(struct header_format *);
```

-96-

THIS PAGE HAS INTENTIONALLY BEEN LEFT BLANK.

```
*******************************************************************
* User name:   MIN (27)              Queue:  FIRMWARE/LASER_P_QUEUE *
* File name:   PPFLOPPY.H            Server  FIRMWARE_PSERVER       *
* Directory:                                                        *
* Description: PPFLOPPY.H                                           *
*              December  2, 92                     12:19pm          *
*                                                                   *
*******************************************************************
*                                                                   *
*                     M  M  III  M  M                               *
*                     MM MM   I  MM M                               *
*                     M M M   I  M M M                              *
*                     M M M   I  M M M                              *
*                     M   M   I  M M M                              *
*                     M   M   I  M MM                               *
*                     M   M  III M  M                               *
*                                                                   *
*******************************************************************
*                                                                   *
*    PPPP  PPPP  FFFFF L    OOO PPPP  PPPP  Y   Y      H   H        *
*    P  P  P  P  F     L    O O P  P  P  P  Y   Y      H   H        *
*    P  P  P  P  F     L    O O P  P  P  P   Y Y       H   H        *
*    PPPP  PPPP  FFFF  L    O O PPPP  PPPP    Y        HHHHH        *
*    P     P     F     L    O O P     P       Y        H   H        *
*    P     P     F     L    O O P     P       Y    ..  H   H        *
*    P     P     F     LLLLL OOO P     P       Y    ..  H   H       *
*                                                                   *
*******************************************************************
```

-98-

```c
/*****************************************************************/
/* PPFLOPPY.H         Include file for Flash Recovery utilities  */
/*                                                                */
/*                                                                */
/*****************************************************************/
#define MEM_4K       (unsigned long)(4UL * 1024UL)   /* 4K memory size decl */
#define MEM_48K      (unsigned long)(48UL * 1024UL)  /* 48K memory size decl */
#define MEM_52K      (unsigned long)(52UL * 1024UL)  /* 52K memory size decl */
#define MEM_64K      (unsigned long)(64UL * 1024UL)  /* 64K memory size decl */
#define ROM_SIZE     (unsigned long)(256UL * 1024UL) /* Size of EEPROM in bytes */
#define FLASH_SIZE   (unsigned long)(248UL * 1024UL) /* Flash size for programming */
define HEADER_SIZE  (unsigned long)(1024UL) /* Size of header: 2 SECTORS */ define FNAME_SIZE   8          /* Length of max DOS file name */
define FEXT_SIZE    3          /* Length of max DOS extension */ define VPP_LOW      0          /* Parameter to functions */
define VPP_HIGH     1          /* Parameter to functions */

/*****************************************************************/
/*      Screen related constants and structures                  */ define SCREEN_WIDTH    80
define SCREEN_LENGTH   25
#define NORMAL_ATTR     0x17    /* Blue bkgnd,white chars */
#define HIGHLT_ATTR     0x1F    /* Blue bkgnd,Bright White char */
define ERROR_ATTR      0x4F    /* Red  bkgnd,Bright White char */ union video_ram {                   /* Describes video memory layout*/
    unsigned short int cell;        /* within the video RAM for    */
    struct two_bytes {              /* video mode 3                */
        unsigned char character;    /* With both word and byte     */
        unsigned char attribute;    /* access definitions.         */
    } byte;                         /* Don't forget 8086 byte swap */
};                                  /* when using word accesses    */ struct header_format {
    char machine_id[8];
    unsigned int hw_version;
    char fw_date[8];
    char space;
    char copy_right[11];
    char unused[2];
    char fw_version[3];
    char *fill;
};

/* union image_header {
    unsigned int far    *buffer;
    struct header_format *header;
};
*/
extern struct gbls {
    unsigned long    image_segment_1;   /* Segment address for 1st 64K block */
    unsigned long    image_segment_2;   /* Segment address for 2nd 64K block */
    unsigned long    image_segment_3;   /* Segment address for 3rd 64K block */
    unsigned long    image_segment_4;   /* Segment address for 4th 48K block */
    unsigned long    image_segment_41;  /* Segment address for 5th 4K block */
    unsigned long    image_segment_42;  /* Segment address for 6th 4K block */
```

-99-

```
    int             video_msg_pointer;      /* index to the next msg location   */
    char            image_filename[14];     /* Name of code image file          */
    struct disk_stuff disk;                 /* Disk handler variables           */
    unsigned int    program_delay_constant; /* program cycly time for flash     */
    unsigned long   flash_seg_low;          /* Address at which to find the     */
    unsigned long   flash_seg_high;         /* first Flash part in the system   */
    unsigned long   flash_seg_1;            /* Address at which to find the     */
    unsigned long   flash_seg_2;            /* second Flash part in the system  */
    unsigned long   flash_seg_3;
    unsigned long   flash_seg_4;
    } globals;
extern union video_ram (screen_image[]);    /* Interface to the screen bufer    */

/****************************************************************/
/*      Function Prototypes                                     */ void    near Load_Flash_EEPROM ();          /* Found in FLDFLASH.C */
void    near Display_User_Msg (char ,char s[]);
void    near Clear_Display_Ram ();
void    near Display_Program_Banner ();
void    near Display_Prog_Num (int);
void    near Set_Display_Start ();
int     near Write_EEPROM_Data ();
void    near Program_Err_Msg (int);
void    near Set_VPP(int);

int     near SEEQ_Erase();                  /* EEPROM dependent routines */
int     near SEEQ_Program(unsigned char far *,unsigned char far *);
int     near Intel_Erase();
int     near Intel_Erase2();
int     near Intel_Program(unsigned long);
int     near Intel_Program2(unsigned long, \
                    unsigned long, unsigned long);

int     near Check_Disk_Ready ();           /* Found in PPROM.C    */
int     near Find_Image_File ();
int     near Read_Image_File ();
int     near Verify_Machine(unsigned int);
int     near Wait_Floppy (int);
void    near Display_Firmware_Version(struct header_format *);

/* Found in Machine dependent file */
void    near Mach_Entry_Init();
extern void     near Mach_Program_Setup();
```

```
                                          -100-
*************************************************************************
* User name:   MIN (27)              Queue:   FIRMWARE/LASER_P_QUEUE    *
* File name:   PPDISK.H              Server   FIRMWARE_PSERVER          *
* Directory:                                                            *
* Description: PPDISK.H                                                 *
*              December 2, 92                    12:19pm                *
*************************************************************************
*                                                                       *
*                         M  M  III  N   N                              *
*                         MM MM  I   NN  N                              *
*                         M M M  I   N N N                              *
*                         M M M  I   N N N                              *
*                         M   M  I   N  NN                              *
*                         M   M  I   N  NN                              *
*                         M   M III  N   N                              *
*                                                                       *
*************************************************************************
*                                                                       *
*      PPPP  PPPP  DDDD   III   SSS  K   K      H   H                   *
*      P  PP P  P  P D   D   I  S   S K K       H   H                   *
*      P  PP P  P  P D   D   I  S     K K       H   H                   *
*      PPPP  PPPP  D    D   I   SSS   KK        HHHHH                   *
*      P     P     D    D   I     S  K K        H   H                   *
*      P     P     D    D   I   S  S K  K  ..   H   H                   *
*      P     P     DDDD     III  SSS  K   K ..  H   H                   *
*                                                                       *
*************************************************************************
```

-101-

```c
/*******************************************************************/
/* PPDISK.H        DOS Disk Structures                             */
/*                                                                 */
/* Purpose: This include file describes the structures found on a DOS */
/*     disk. These include the boot sector, FAT and directory entry.  */
/*                                                                 */
/*                                                                 */
/*******************************************************************/ struct s_disk_boot_sector   {
    unsigned char   jump_inst;
    unsigned int    jump_offset;
    char            OEM_name[8];
    unsigned int    sector_size;        /* # bytes in a sector */
    unsigned char   cluster_size;       /* # sectors in a cluster   */
    unsigned int    reserved_space;     /* # reserved sectors   */
    unsigned char   FAT_copies;         /* # copies of FAT      */
    unsigned int    num_root_entries;   /* # dir entries in root dir */
    unsigned int    volumn_size;        /* # sectors in volumn */
    unsigned char   media_type;         /* Media type code     */
    unsigned int    FAT_size;           /* # sectors in FAT copy*/
    unsigned int    sectors_per_track;  /* # sectors in a track */
    unsigned int    num_heads;          /* # of disk heads     */
    unsigned int    num_hidden_sectors; /* # sectors in hidden files */
    };

struct s_dir_entry      {
    unsigned char   filename[8];        /* name given to file   */
    unsigned char   extension[3];       /* file extension       */
    unsigned char   file_attribute;     /* attribute flags      */
    char            reserved[10];       /* unused bytes (to date)   */
    unsigned int    time_field;         /* Creation/update time */
    unsigned int    date_field;         /* Creation/update date */
    unsigned int    start_cluster;      /* Index into FAT for file start*/
    unsigned long   file_size;          /* Number of bytes in file  */
    };

struct disk_stuff    {                  /* Variables needed by the disk */
    unsigned long FAT_address;    /* handling portion of the    */
    int     starting_FAT_entry;         /*   flash code.             */
    int     sector_size;
    int     cluster_size;
    int     sectors_per_track;
    int     num_heads;
    int     starting_data_sector;
    unsigned long   file_size;
    };

#define READ_SECTOR         2           /* BIOS cmd value     */
#define DIR_ENTRY_SIZE      32          /* Bytes in each dir entry  */

/* Disk return codes  */            /* Used by Read_Disk     */
#define GOOD_READ           0
#define NO_FILE             1
#define DISK_ERROR          2
                                        /* Used by Read_Image_File  */
#define FILE_ERROR          1
#define FILE2SHORT          2
```

-102-

```
#define FILE2LONG      3
#define WRONG_MACH_ID  4
#define BAD_CHECKSUM   5
```

```c
#pragma inline                          /* Flag use of inline asm code */
/*********************************************************************/
/* File: PLDFLASH.C    Flash Code Loading Utility                    */
/*                                                                    */
/* Purpose: This program loads the Flash code into RAM for BIOS      */
/*     recovery. The routines operates in protected mode, using Boot */
/*     Block GDT.                                                     */
/* First release: 1/17/92 (Min Lee)                                  */
/*********************************************************************/

/*********************************************************************/
/* PLDFLASH.C          Load Flash Code                               */
/*                                                                    */
/* Purpose: This routine is the body section of the Flash code loader.*/
/*     Its function is to control the operation of loading Flash code*/
/*     into RAM.                                                      */
/* Inputs: Flash code image file                                     */
/*                                                                    */
/* Outputs: Flash code into the memory                               */
/*                                                                    */
/* Return Value: result - loading status                             */
/*                                                                    */
/* Operation:                                                         */
/*     Phase-I)  Locate the file                                     */
/*     Phase-II) Load the file into memory buffer                    */
/*                                                                    */
/*********************************************************************/
extern void near SLUSH_SCP();
/* extern void near ENABLE_FLASH_ROM();
*/ extern void near POWER_UP_VGA();
extern void near INIT_VIDEO();
extern void near SEND_ROW(int);
extern void near SEND_CHARACTER(int);

int near
Load_Flash_Util ()
{
    int retries;                /* Number of retries before restarting */
    int result;                 /* Result of function return */

SLUSH_SCP();
/*      ENABLE_FLASH_ROM();
*/      POWER_UP_VGA();
        INIT_VIDEO();
        Clear_Display_Ram ();       /* Initialize the video RAM contents    */
        Display_Program_Banner ();  /* Place program title on screen        */

/* Phase - I: Locate the Flash code image file on disk */ retries = 3;                /* Three times of retry before restarting */
        while (retries--)
        {
           if ( !Check_Disk_Ready() )
           {
             Display_User_Msg (HIGHLT_ATTR, "Please insert Flash code diskette in drive A:");
             if (Wait_Floppy (TRUE) == FALSE)
              {
                 Display_User_Msg (ERROR_ATTR, "User Aborted!");
                 return(1);
```

-104-

```
            }
        }
        Display_User_Msg (HIGHLT_ATTR, "Looking for flash code file...");
        result = Find_Image_File();   /* Attempt to locate file */
        if (result == 0)              /* File found, proceed to read file */
            break;
        else                          /* File not found */
        {
            if ( retries == 0 )
            {                         /* Retries exhausted, display error and restart */
                Display_User_Msg (ERROR_ATTR, "Retries exhausted. Please remove diskette.");
                Wait_Floppy (FALSE);       /* Wait for floppy to be removed */
                return(1);                 /* Return to MAIN            */
            }
            Display_User_Msg (ERROR_ATTR, "File not found. Try another diskette.");
            Wait_Floppy (FALSE);           /* Wait for floppy to be removed    */
        }
    } /* endwhile */

/* Phase - II: Read the file into the memory buffer    */
    Display_User_Msg (HIGHLT_ATTR, "Reading flash code image file");
    retries = 3;
    while (retries--)
    {
        result = Read_Image_File ();
        if (result == 0)              /* File read successfully, proceed.    */
        {
            break;
        }
        else                          /* File or disk error, retry.   */
        {
            if ( retries == 0 )
            {                         /* Retries exhausted, display error and restart */
                Display_User_Msg (ERROR_ATTR, "Retries exhausted. Try another diskette.");
                Wait_Floppy (FALSE);       /* Wait for floppy to be removed.   */
                return (1);                /* Return to MAIN            */
            }
        }
    } /* endwhile */
    return(0);
} /* end Load_Flash_Util */                 /* Returns to MAIN      */

/*****************************************************************/
/* PLDFLASH.C         Display User Msg                          */
/*                                                              */
/* Purpose: This routine is responsible for placing messages on the  */
/*     user's screen. It is assumed that the video is in a state    */
/*     equivilent to mode 3 (alphanumeric 80 x 24). This means the  */
/*     video buffer starts from B8000 and each word contains a     */
/*     character byte and an attribute byte.                       */
/*                                                              */
/* Inputs: msg_string - pointer to the message string to be displayed. */
/*                The string is terminated with a NULL character. */
/*         char_attribute - The color attribute associated with the  */
/*                text on the screen. Matches the EGA definition. */
/*         screen_msg_pointer (global var) - points to loc of next msg. */
/*                                                              */
/* Outputs: The message string is placed into the video memory with the */
```

```
/*      given color attribute. The first message is placed on line 3  */
/*      of the screen.  Each display request after that is placed on  */
/*      the next available line of the screen.  When the bottom line is */
/*      reached, the displayed messages will be scroll up one line.    */
/*                                                                    */
/* Return Values: None.                                                */
/*                                                                    */
/**********************************************************************/
void near
Display_User_Msg (char char_attribute, char msg_string[])
{
    int             cell_index;
    union video_ram cell_value;

Set_Display_Start();  /* Scroll messages up one line if bottom is reached */
                          /* Load the starting loaction */
    cell_index = globals.video_msg_pointer;
    cell_value.byte.attribute = char_attribute;  /* Set the attribute value */
    while (*msg_string != 0)          /* copy till the null terminator */
    {
        cell_value.byte.character = *(msg_string++);   /* Set the next data byte */
        screen_image[cell_index].cell = cell_value.cell;
        cell_index++;
    }
    send_row (globals.video_msg_pointer, cell_index-globals.video_msg_pointer);
    globals.video_msg_pointer += SCREEN_WIDTH;  /* Move to the next line */
} /* end Display_User_Msg () */

/**********************************************************************/
/* PLDFLASH.C       Clear Display RAM                                  */
/*                                                                    */
/* Purpose: This routine is used to initialize the video buffer to a   */
/*      constant value in preparation for displaying messages to the   */
/*      user. The video RAM is accessed directly with the assumption   */
/*      that the video susb-section of hardware has been setup for     */
/*      operating in mode 3.                                           */
/*                                                                    */
/* Inputs: Screen_buffer (global variable) - points to the video RAM   */
/*                                                                    */
/* Outputs: Constant value to all storage locations in video RAM       */
/*                                                                    */
/**********************************************************************/
void near
Clear_Display_Ram ()        /* Initialize the video RAM content */
{
    register unsigned int  video_cell_index;
    union video_ram        cell_value;      /* used to build cell value */
    int                    i;

cell_value.byte.character = BLANK;
    cell_value.byte.attribute = HIGHLT_ATTR;
    for (video_cell_index=0;
         video_cell_index < (SCREEN_WIDTH*SCREEN_LENGTH);
         video_cell_index++)
    {
        screen_image[video_cell_index].cell = cell_value.cell;
    }
    for (i=0; i < SCREEN_LENGTH; i++)
    {
```

```
            send_row(i*SCREEN_WIDTH, SCREEN_WIDTH);
     }

}

/***********************************************************************/
/* PLDFLASH.C          Display Program Banner                          */
/*                                                                     */
/* Purpose: Assuming a presently blank screen, this routine writes a   */
/*     border pattern and the program herraid to the video RAM.        */
/*                                                                     */
/* Inputs: screen_buffer (global variable) - points to the video RAM   */
/*         screen_msg_pointer (global var) - points to next message loc*/
/*                                                                     */
/* Outputs: Banner to screen_buffer & initialized screen values        */
/*                                                                     */
/***********************************************************************/
void near
Display_Program_Banner ()           /* Place Program title on screen    */
{
    register unsigned int    video_cell_index;   /* selects video cell */
    union video_ram          cell_value;         /* used to build cell value */
    int                      i;

/* place border around the screen                            */
    /* First, place the four corners                             */
    cell_value.byte.attribute = 0x1F;      /* Blue background,bright white char */
    cell_value.byte.character = DBL_ASTERISK;  /* place the asterisk */
    screen_image[0].cell = cell_value.cell;
    screen_image[SCREEN_WIDTH-1].cell = cell_value.cell;
    screen_image[SCREEN_WIDTH*(SCREEN_LENGTH-1)].cell = cell_value.cell;
    screen_image[SCREEN_WIDTH*(SCREEN_LENGTH-1)+79].cell = cell_value.cell;

/* Second, place the top edge border                         */
    for (video_cell_index=1; video_cell_index < SCREEN_WIDTH-1; video_cell_index++)
        screen_image[video_cell_index].cell = cell_value.cell;

/* Third, place the left and right vertical edges.           */
    for (video_cell_index=SCREEN_WIDTH;                     /* initializer */
         video_cell_index < SCREEN_WIDTH*(SCREEN_LENGTH-1); /* conditional */
         video_cell_index+=SCREEN_WIDTH)                    /* incrementer */
    {
        screen_image[video_cell_index].cell              = cell_value.cell;  /* left */
        screen_image[video_cell_index+SCREEN_WIDTH-1].cell = cell_value.cell;  /* right*/
    }

/* Fourth, place the bottom edge border                      */
    for (video_cell_index=SCREEN_WIDTH*(SCREEN_LENGTH-1)+1; /* initializer */
         video_cell_index < (SCREEN_WIDTH*SCREEN_LENGTH)-1; /* conditional */
         video_cell_index++)                                /* incrementer */
    {
        screen_image[video_cell_index].cell = cell_value.cell;
    }
    for (i=0; i < SCREEN_LENGTH; i++)
    {
        send_row(i*SCREEN_WIDTH, SCREEN_WIDTH);
    }

/* Last, Place the program title on the screen               */
    globals.video_msg_pointer = (SCREEN_WIDTH * 3) + 15;/* init msg location pointer */
```

```
                                                 -107-
    Display_User_Msg(HIGHLT_ATTR, "          Flash Code Loader");
    globals.video_msg_pointer += SCREEN_WIDTH;       /* Place a blank lines */
    Display_User_Msg(HIGHLT_ATTR, version_message);
    Display_User_Msg(HIGHLT_ATTR, version_date_message);
    globals.video_msg_pointer = (SCREEN_WIDTH * 9) + 10;/* Set the msg pointer       */
                                                     /* and include 2 blank lines  */

} /* end Display_Program_Banner () */

/*****************************************************************/
/* PLDFLASH.C       Display Progressing Number                   */
/*                                                               */
/*                                                               */
/* Purpose: This routine has the responsability of placing progressing */
/*      dots on the user's screen. It is assumed that the video is    */
/*      in a state equivilent to video mode 3 (alphanumeric 80 x 24). */
/*      This means the video buffer is at B800:0 and each word contains */
/*      a character byte and an attribute byte.                  */
/*                                                               */
/* Inputs: msg_string - pointer to the string of chatacters to display. */
/*              The string is terminated with a NULL char.       */
/*         char_attribute - The color attribute to associate with this */
/*                 text on the screen. Matches the EGA definition. */
/*         screen_msg_pointer (global var) - points to loc of next msg. */
/*                                                               */
/* Outputs: The message string is placed into the video memory with the */
/*          given color attribute. The first message is placed on */
/*          screen line 3. Each display request after that is placed*/
/*          on the next available line on the screen. No special */
/*          checking is done for line or screen wrapping, that is */
/*          left up to the caller.                               */
/*                                                               */
/* Return Values: none.                                          */
/*                                                               */
/*****************************************************************/
void near
Display_Prog_Num (int k)
{
    union video_ram             cell_value;

cell_value.byte.attribute = HIGHLT_ATTR;    /* Set the attribute value   */
    switch (k)
    {
      case 0:   cell_value.byte.character = '-';   /* Set the data byte   */
                break;
      case 1:   cell_value.byte.character = '/';   /* Set the data byte   */
                break;
      case 2:   cell_value.byte.character = '|';   /* Set the data byte   */
                break;
      case 3:   cell_value.byte.character = '\\';  /* Set the data byte   */
    }

/* Set the data byte   */
    screen_image[globals.video_msg_pointer].cell = cell_value.cell;
    send_characte·(globals.video_msg_pointer);

} /* end Display_Prog_Num (k) */

/*****************************************************************/
/* PLDFLASH.C       Set Display Starting Position                */
/*                                                               */
```

-108-

```c
/* Purpose: This routine has the responsability of setting display    */
/*     starting position. It is assumed that the video is             */
/*     in a state equivilent to video mode 3 (alphanumeric 80 x 24).  */
/*     This means the video buffer is at B800:0 and each word contains*/
/*     a character byte and an attribute byte.                        */
/*                                                                    */
/*                                                                    */
/* Inputs:                                                            */
/*     screen_msg_pointer (global var) - points to loc of next msg.   */
/*                                                                    */
/* Outputs: The message string is placed into the video memory with the*/
/*          given color attribute.                                    */
/*                                                                    */
/*                                                                    */
/* Return Values: none.                                               */
/*                                                                    */
/********************************************************************/
void near
Set_Display_Start ()
{
    int i, j;
    union video_ram        cell_value;        /* used to build cell value */ cell_value.byte.character  = BLANK;
    cell_value.byte.attribute  = HIGHLT_ATTR;
    if (globals.video_msg_pointer >= SCREEN_WIDTH*(SCREEN_LENGTH-1))
    {
        for (i = 10; i < (SCREEN_LENGTH-1); i++)
        {
          for (j = 10; j < (SCREEN_WIDTH-1); j++)
          {
            screen_image[SCREEN_WIDTH*(i-1)+j].cell =
              screen_image[SCREEN_WIDTH*i+j].cell;
          }
          send_row ((i-1)*SCREEN_WIDTH+10, SCREEN_WIDTH-12);
        }
        for (j = 10; j < (SCREEN_WIDTH-1); j++)
        {
            screen_image[(SCREEN_LENGTH-2)*SCREEN_WIDTH+j].cell = cell_value.cell;
        }
        send_row ((SCREEN_LENGTH-2)*SCREEN_WIDTH+10, SCREEN_WIDTH-12);
        globals.video_msg_pointer = (SCREEN_LENGTH-2)*SCREEN_WIDTH+10;
    }
    ;
}
/*::::::::::::::::::::::::::End of File::::::::::::::::::::::::::::*/
```

```
                                                          -109-
#pragma inline                          /* Flag use of inline asm code */
/*******************************************************************/
/* File: PPLOADER.C                                                  */
/*         Loader of Flash Programming Utility                       */
/*                                                                   */
/* Purpose: This program loads Flash Programming Utility from a floppy */
/*     diskette into the memory and then trnsfers control to the     */
/*     utility to recover or to update the ROM code. The program     */
/*     operates in protected mode using the BOOT BLOCK GDT.          */
/* First Release: Min Lee                                            */
/* Release Date: Jan. 17, 1992                                       */
/*******************************************************************/
#include "ascii.h"              /* Defines common ASCII chars   */
#include "ppdisk.h"             /* Structures for disk handling */
include "pploader.h"           /* Constants/structures for pgm */ define FALSE   0
define TRUE    !(FALSE)
extern int interf_read_sector(int, int, int, unsigned long);
extern void interf_disk_change(unsigned long);
extern void start_flash_code();
extern void move_region(unsigned long, void *, int);
extern void Change_GDT();
/*******************************************************************/
char    version_message[]      = "              Revision #1.1";
char    version_date_message[] = "              April 14, 1992";
char    default_filename[]     = "PPFLOPPY.BIN\0";
/*******************************************************************/
/*              Local Procedure Prototypes                          */
/*******************************************************************/
int     near    Read_Disk(int, int, unsigned long);
int     near    Get_Next_FAT_Index(unsigned int *);
int     near    Compare_Names (char *, char *);
int     near    Check_abort();

/*******************************************************************/
/* PPLOADER.C          PPLOADER Initialization                      */
/*                                                                  */
/* Purpose: This routine is the initialization section of the loader */
/*     of Floppy-based flash programming utility. Its function is to */
/*     set up the environment for the utility. The body is called as */
/*     a function.                                                  */
/*                                                                  */
/* Inputs: The default file.                                        */
/*                                                                  */
/* Outputs: Flash code to the memory.                               */
/*                                                                  */
/* Return Value: None.                                              */
/*                                                                  */
/* Operation:                                                       */
/*     - Request buffer space for the Flash code (16K)              */
/*     - Load the Flash code onto the memory                        */
/*     - Transfer control to the Flash code                         */
/*                                                                  */
/*******************************************************************/ void far
PPLOADER_ENTRY ()
{
    char    *entry_string;
```

-110-

```c
    int     result, index;         /* Loop control var         */ globals.disk.sectors_per_track = 9;  /* 3.5" FD default         */
    globals.disk.sector_size    = 512;   /* DOS standard value      */
    globals.disk.cluster_size   = 1;     /* One sector per cluster  */
    globals.disk.num_heads      = 2;     /* 3.5" FD default         */

/******* Request memory blocks for the code image buffer ***************/
    globals.image_segment_f = 0x00008000UL;   /* Starting address for flash code */
    globals.disk.FAT_address= 0x00020000UL;   /* Area to hold the FAT in mem */

/******* Use the default filename **/
    entry_string = &default_filename[0];      /* Filename     */

/* Copy target name into global buffer */
    for (index=0; index < FNAME_SIZE; index++, entry_string++)
    {
        globals.image_filename[index] = *entry_string;
    }
        entry_string++;
    for (index=0; index < FEXT_SIZE; index++, entry_string++)
    {
        globals.image_filename[FNAME_SIZE+index] = *entry_string;
    }
    result = Load_Flash_Util ();        /* Load flash code into memory */
    if (result == 0)                    /* If flash code is successfully loaded */
      {
        Change_GDT();       /* Save GDT into RAM and add one entry for flash data */
        Start_Flash_Code(); /* Transfer control to flash code */
      }
    else                                /* If flash code fails to be loaded */
      {
        Display_User_Msg (ERROR_ATTR, "Reboot the system and try again");
ppfail: goto ppfail;
      }
} /* end Main */

/*********************************************************************/
/* PPLOADER.C       Find Image File                                 */
/*                                                                  */
/* Purpose: Locate and open the flash code image file. This is done by */
/*      first reading the disk boot sector to locate the disk FAT (File */
/*      Allocation Table). Then...                                  */
/*                                                                  */
/* Inputs: Filename (global var) - name of file to look for         */
/*                                                                  */
/* Outputs: File FAT entry (global var)                             */
/*                                                                  */
/* Return Values: 0 - file found and opened.                        */
/*                1 - file not found.                               */
/*                2 - disk error.                                   */
/*                                                                  */
/*********************************************************************/
extern  struct s_disk_boot_sector  boot_sector;   /* Temporary buff */
extern  struct s_dir_entry         root_file[];   /* File entry in root dir */
int near
Find_Image_File ()
{
    unsigned long       locat_boot_sector;   /* Location of boot sector */
```

-111-

```
unsigned long        locat_root_file;      /* Location of root file */
int                  index, i, num_entries; /* Loop control var     */
int                  root_sector;          /* Logical sector of start of root dir */
int                  root_size;            /* Number of sectors used by root dir  */ locat_boot_sector = globals.disk.FAT_address + 0x2000UL;
/* Read the boot sector *********************************/
if (Read_Disk (0, 1, locat_boot_sector) )
{
    Display_User_Msg (ERROR_ATTR, "ERROR, reading Boot Sector");
    return (DISK_ERROR);
}
move_region(locat_boot_sector, &boot_sector, 15);   /* Get boot sector information into data area */
/*** Use boot sector information for gloabal variables **************/
globals.disk.sector_size     = boot_sector.sector_size;
globals.disk.cluster_size    = boot_sector.cluster_size;
globals.disk.num_heads       = boot_sector.num_heads;
globals.disk.sectors_per_track = boot_sector.sectors_per_track;
/*** Load the FAT into memory ******************************/
if (Read_Disk (boot_sector.reserved_space, boot_sector.FAT_size, globals.disk.FAT_address) )
{
    Display_User_Msg (ERROR_ATTR, "ERROR, reading F.A.T.");
    return (DISK_ERROR);
}
/*** Load root directory into memory ***********************/
root_sector = boot_sector.reserved_space +
              (boot_sector.FAT_copies * boot_sector.FAT_size);
root_size = (boot_sector.num_root_entries * DIR_ENTRY_SIZE)
            / boot_sector.sector_size;
                                /* Locate the start of the files area   */
globals.disk.starting_data_sector = root_sector + root_size;
                                /* Establish the buffer for the directory data  */
num_entries = boot_sector.sector_size / DIR_ENTRY_SIZE;
locat_root_file = globals.image_segment_f;
                                /* Read root directory into memory    */
while (root_size--)
{
if (Read_Disk (root_sector, 1, locat_root_file) )
{
    Display_User_Msg (ERROR_ATTR, "ERROR, reading Root Dir.");
    return (DISK_ERROR);
}
root_sector++;
                                /* Move root sector information into data area */
move_region (locat_root_file, &(root_file[0]), boot_sector.sector_size/2);
/*** Search for file name ***********************************/
i = 0;
for (index = num_entries ;
     index > 0; index--, i++)
{
    if (root_file[i].filename[0] == 0xE5U )
    { /* Entry has been deleted, skip it     */
        continue;
    }
    if (root_file[i].filename[0] == 0x00U )
    { /* Null entry indicates end of dir entries. File not found.   */
        Display_User_Msg (ERROR_ATTR, "Can't locate input file.");
        return (NO_FILE);                    /* Complain and exit   */
    }
    if (Compare_Names ((char *)&(root_file[i]), (char *)globals.image_filename) )
```

-112-

```c
    { /* Match is found.  Get the starting FAT entry and file size from the dir entry. */
        globals.disk.starting_FAT_entry = root_file[i].start_cluster;
        globals.disk.file_size          = root_file[i].file_size;
        return (GOOD_READ);
    }
  } /* end for */
 } /* end while */
 /* File not found in root directory. Error */
 Display_User_Msg (ERROR_ATTR, "Can't locate input file.");
 return (NO_FILE);                      /* Complain and exit    */

} /* end Find_Image_File () */

/****************************************************************/
/* PPLOADER.C        Read Image File                            */
/*                                                              */
/* Purpose: This routine reads the Flash code file into the memory */
/*     buffer. The file is assumed to be in binary format and   */
/*     therefore requires no translation during the load.       */
/*                                                              */
/* Inputs:  Starting FAT index - (global variable)              */
/*          Image buffer - (global variables) memory buffer for code */
/*                                                              */
/* Outputs: Flash code contents into memory buffer.             */
/*                                                              */
/* Return Values: 0 - file read OK                              */
/*                1 - disk read error                           */
/*                2 - file too short to fill buffer             */
/*                3 - file too long for buffer                  */
/****************************************************************/
#define SIZE_OF_SECTOR  512           /* Data bytes in sector      */
#define SIZE_OF_READ    SIZE_OF_SECTOR /* Read one sector at a time */
unsigned int    fat_index;            /* Index to the next cluster */ int near
Read_Image_File ()
{
    unsigned long    image_buffer;    /* Starting address of block buffer */
    unsigned long    bytes_read;      /* Continuing count of read bytes   */
    unsigned int     file_sector;     /* Sector to read on disk    */
    int              j;               /* Index for active indication */ if (globals.disk.file_size > UTIL_SIZE)    /* File too long */
    {
        Display_User_Msg (ERROR_ATTR, "File too long");
        return (FILE2LONG);
    }
    if (globals.disk.file_size < UTIL_SIZE)    /* File too short */
    {
        Display_User_Msg (ERROR_ATTR, "File too short");
        return (FILE2SHORT);
    }
    fat_index = globals.disk.starting_FAT_entry; /* Load starting index */
    bytes_read = 0;                              /* Clear byte counter  */
    j = 0;
    Set_Display_Start();              /* Select position for active indication */
    do {
        if (bytes_read >= UTIL_SIZE)
        {
            return (GOOD_READ);
```

-113-

```c
                                        /* Set buffer address for the read sector */
        image_buffer = globals.image_segment_f + bytes_read;
                                        /* Select the file's cluster to be read   */
        file_sector = ((fat_index-2) * globals.disk.cluster_size)
                      + globals.disk.starting_data_sector;
                                        /* Read a cluster into buffer   */
        if (Read_Disk (file_sector, globals.disk.cluster_size, image_buffer) )
        {
            Display_User_Msg (ERROR_ATTR, "ERROR, reading File");
            return (FILE_ERROR);
        }
                                        /* Increment the read bytes with a cluster size */
        bytes_read += globals.disk.sector_size * globals.disk.cluster_size;   /* Increment byte count */
        j++;
        if (j == 4)
           j = 0;
        Display_Prog_Num(j);
    } while (Get_Next_FAT_Index(&fat_index));
    return (GOOD_READ);
} /* end Read_Image_File () */

/*******************************************************************/
/* PPLOADER.C      Get_Next_FAT_Index                               */
/*                                                                  */
/* Purpose: Using the current FAT index, determine the next cluster */
/*     to be read.                                                  */
/*                                                                  */
/* Parameters:                                                      */
/*     fat_index - The current FAT index which will be updated with */
/*          the new index.                                          */
/*                                                                  */
/* Return Values:                                                   */
/*     TRUE - next cluster has been found.                          */
/*     FALSE- no more clusters in this file, EOF.                   */
/*                                                                  */
/*******************************************************************/
extern unsigned int FIND_NEXT_FAT_INDEX (unsigned int *, unsigned long);
int near
Get_Next_FAT_Index(unsigned int * fat_index)
{
    if (*fat_index >= 0x0FF0)   /* If this is the last cluster in the file.  */
        return (FALSE);
                                /* If not, continue to find the next cluster. */
    *fat_index = FIND_NEXT_FAT_INDEX (fat_index, globals.disk.FAT_address);
    return (TRUE);
}

/*******************************************************************/
/* PPLOADER.C      Wait for Floppy                                  */
/*                                                                  */
/* Purpose: Wait for the user to change diskettes. This is usually  */
/*     called after an error was detected on the disk or in the file. */
/*                                                                  */
/* Inputs: Status (parameter)                                       */
/*        FALSE - wait for the floppy to be removed.                */
/*        TRUE  - wait for a floppy to be inserted.                 */
/*                                                                  */
/* Outputs: None                                                    */
/*                                                                  */
```

-114-
```
/*************************************************************/ int near
Wait_Floppy (int status)
{
    if (status)                    /* Look for a floppy to be inserted    */
    {
        while ( Read_Disk (1, 1, globals.image_segment_f))
                                   /* Wait for good read result   */
        {
            if (Check_abort() == 0x01)  /* Check if the user want to abort the operation */
                return (FALSE);         /* 0x01 is the ESC key scan code */
        }
    }
    else
    {                              /* Wait for the floppy to be removed */
        interf_disk_change(globals.image_segment_f);
    } /* end if */
    return(TRUE);
} /* end Wait_Floppy () */

/*************************************************************/
/* PPLOADER.C        Check Disk Ready                        */
/*                                                           */
/* Purpose: Check and return the floppy disk's status.       */
/*                                                           */
/* Inputs: None                                              */
/*                                                           */
/* Return Values: FALSE - floppy not inserted.               */
/*                TRUE  - disk is readable (ready)           */
/*                                                           */
/*************************************************************/
int near
Check_Disk_Ready ()
{
    return (!(Read_Disk (1, 1, globals.image_segment_f)));
                                /* Test by reading a sector into buffer */
} /* end Check_Disk_Ready () */

/*************************************************************/
/* PPLOADER.C        Read Disk Sectors                       */
/*                                                           */
/* Purpose: Read N sectors from the disk, starting from the passed */
/*     logical sector.                                       */
/*                                                           */
/* Parameters:                                               */
/*     logical_sector  - logical sector number to read ( 0 - n ) */
/*     num_sectors     - number of sectors to read           */
/*     buffer          - starting address of the buffer to put data */
/*                                                           */
/* Return Values:                                            */
/*     0 - read successful                                   */
/*     2 - disk device error                                 */
/*                                                           */
/*************************************************************/
int near
Read_Disk(int logical_sector, int num_sectors, unsigned long buffer)
{
```

```
                                                            -115-
    int     track;         /* Current track to read on disk */
    int     head;          /* Head/side to read on disk    */
    int     sector;        /* Sector to read, 1 - n        */
    int     result;        /* Status of reading disk       */ track   = logical_sector / globals.disk.sectors_per_track;
    sector  = (logical_sector % globals.disk.sectors_per_track) + 1;
    head    = track % globals.disk.num_heads;
    track   = track / globals.disk.num_heads;

while (num_sectors-- > 0)   /* While more sectors need to be read */
    {
        result = interf_read_sector(track, sector, head, buffer);
                              /* Call routine to read the sector */
        if (result != 0)      /* Check for disk error */
            return (DISK_ERROR);
        buffer += globals.disk.sector_size;    /* Increment buffer address */
        if (++sector > globals.disk.sectors_per_track)
        {                     /* Wrap sectors to next head */
            sector = 1;
            if (++head > globals.disk.num_heads)
            {                 /* Wrap head to next track */
                head = 0;
                track++;
            }
        }
    } /* end while */
    return (GOOD_READ);
}

/***************************************************************/
/* PPLOADER.C           Compare Filenames                      */
/*                                                              */
/* Purpose: This routine compares the filename in the directory entry */
/*     with the target string to test for a match.             */
/*                                                              */
/* Parameters:                                                  */
/*     dir_name - pointer to directory entry (11 bytes long)   */
/*     target name - pointer to string to match.              */
/*                                                              */
/* Return Values:                                               */
/*     FALSE - filenames don't match                           */
/*     TRUE  - filenames match in content and length           */
/*                                                              */
/***************************************************************/
int near
Compare_Names (char *dir_name, char *target_name)
{
    int     index;         /* loop control variable  */

/* Compare the two padded or truncated name strings. Both are 11 chars. */
    for (index=0; index < FNAME_SIZE+FEXT_SIZE; index++)
    {
        if (*(dir_name++) != *(target_name++))
        {                   /* Name characters do not match */
            return (FALSE);
        }
    }
    return (TRUE);         /* Names match */
```

-116-

```c
/*************************************************************/
/* PPLOADER.C              Check_abort()                     */
/*                                                           */
/*    Check_abort is called to receive a byte from the SCP   */
/* command execution of an SCP command which returns a result byte. */
/* The difference between this routine and the SCP_RECV in scp.asm is */
/* that we don't want a long wait here, we need a quick return. */
/*                                                           */
/* Output:                                                   */
/*    AL: Byte read from the SCP                             */
/*                                                           */
/* Note: This routine must work in protected mode.           */
/*                                                           */
/*************************************************************/
#define SCP_STATUS      0x64    /* System Control Processor Status */
#define SCP_RESULT      0x01    /* SCP has a result byte */
#define SCP_BUSY        0x02    /* SCP has not yet read command */
#define SCP_DATA_IN     0x60    /* SCP's input-data port */
define SCP_DATA_OUT    0x60    /* SCP's OUTput-data port */ int
Check_abort()
{
   register int index;
   _AX = 0;                    /* Clear AX register. */
   for (index = 0 ; index < 250; ++index )
   {
       asm IN  AL,SCP_STATUS;   /* Read the SCP's status register */
       asm AND AL,SCP_RESULT;   /* Does the SCP have a byte waiting? */
       asm JNZ SR3;             /* Yes - get the byte from the SCP*/
   }
   return;
SR3:;
   asm IN   AL,SCP_DATA_IN;    /* Yes - flush the byte from the SCP */
   return;
}
/*************************************************************/
/*    Now include the common code for loading the FLASH code  */
/*************************************************************/
#include "pldflash.c"

/*::::::::::::::::::::::::::End of File::::::::::::::::::::::::::::*/
```

-117-

THIS PAGE HAS INTENTIONALLY BEEN LEFT BLANK.

-118-

```
*********************************************************************
* User name:   MIN (27)              Queue:  FIRMWARE/LASER_P_QUEUE  *
* File name:   PPLOADER.C            Server  FIRMWARE_PSERVER         *
* Directory:   SOURCES:AT\DEVELOP\FLASH\FLOPPY                        *
* Description: PPLOADER.C                                             *
*              December 2, 92                  12:02pm                *
*********************************************************************
*                                                                    *
*                        M   M  III  N   N                           *
*                        MM MM   I   NN  N                           *
*                        M M M   I   N N N                           *
*                        M M M   I   N N N                           *
*                        M   M   I   N N N                           *
*                        M   M   I   N  NN                           *
*                        M   M  III  N   N                           *
*                                                                    *
*********************************************************************
*                                                                    *
*      PPPP  PPPP  L     OOO    A   DDDD  EEEEE RRRR       CCC       *
*      P  P  P  P  L    O   O  A A  D   D E     R   R     C   C      *
*      P  P  P  P  L    O   O A   A D   D E     R   R     C          *
*      PPPP  PPPP  L    O   O A   A D   D EEEE  RRRR      C          *
*      P     P     L    O   O AAAAA D   D E     R R       C          *
*      P     P     L    O   O A   A D   D E     R  R  ..  C   C      *
*      P     P     LLLLL OOO  A   A DDDD  EEEEE R   R  ..  CCC       *
*                                                                    *
*********************************************************************
```

```
********************************************************************
* User name:   MIN (27)              Queue:  FIRMWARE/LASER_P_QUEUE *
* File name:   PLDFLASH.C            Server  FIRMWARE_PSERVER       *
* Directory:   SOURCES:AT\DEVELOP\FLASH\FLOPPY                      *
* Description: PLDFLASH.C                                           *
*              December 2, 92                    12:12pm            *
********************************************************************
*                                                                   *
*                      M  M  III  N   N                             *
*                      MM MM  I   NN  N                             *
*                      M M M  I   N N N                             *
*                      M M M  I   N N N                             *
*                      M   M  I   N N N                             *
*                      M   M  I   N  NN                             *
*                      M   M III  N   N                             *
*                                                                   *
********************************************************************
*                                                                   *
*     PPPP  L    DDDD  FFFFF L     A   SSS  H   H       CCC         *
*     P  P L    D   D  F     L    A A S   S H   H      C   C        *
*     P  P L    D   D  F     L    A A  S    H   H      C            *
*     PPPP  L    D   D FFFF  L    A A   SSS  HHHHH     C            *
*     P     L    D   D F     L   AAAAA     S H   H     C            *
*     P     L    D   D F     L    A A  A S  H   H  ..  C   C        *
*     P     LLLLL DDDD F     LLLLL A   A SSS H   H ..   CCC         *
*                                                                   *
********************************************************************
```

```
                                                              -120-
*************************************************************************
* User name:   MIN (27)                Queue:  FIRMWARE/LASER_P_QUEUE    *
* File name:   PPFLOPPY.C              Server  FIRMWARE_PSERVER          *
* Directory:                                                             *
* Description: PPFLOPPY.C                                                *
*              December 2, 92                  12:14pm                   *
*************************************************************************
*                                                                        *
*                         M   M  III  N   N                              *
*                         MM MM   I   NN  N                              *
*                         M M M   I   N N N                              *
*                         M M M   I   N N N                              *
*                         M   M   I   N N N                              *
*                         M   M   I   N  NN                              *
*                         M   M  III  N   N                              *
*                                                                        *
*************************************************************************
*                                                                        *
*     PPPP  PPPP  FFFFF L    OOO  PPPP  PPPP  Y   Y      CCC             *
*     P  P  P  P  P F   L    O  O P  P  P  P  Y   Y    C   C             *
*     P  P  P  P  P F   L    O  O P  P  P  P   Y Y     C                 *
*     PPPP  PPPP  FFFF  L    O  O PPPP  PPPP    Y      C                 *
*     P     P     F     L    O  O P     P       Y      C                 *
*     P     P     F     L    O  O P     P       Y  ..  C   C             *
*     P     P     F     LLLLL OOO P     P       Y  ..   CCC              *
*                                                                        *
*************************************************************************
```

-121-

THIS PAGE HAS INTENTIONALLY BEEN LEFT BLANK.

```
                                                              -122-
*******************************************************************
* User name:   MIN (27)               Queue:   FIRMWARE/LASER_P_QUEUE  *
* File name:   FLDFLASH.C             Server  FIRMWARE_PSERVER         *
* Directory:                                                           *
* Description: FLDFLASH.C                                              *
*              December 2, 92                   12:15pm                *
*******************************************************************
*                                                                      *
*                        M   M  III  N   N                             *
*                        MM MM   I   NN  N                             *
*                        M M M   I   N N N                             *
*                        M M M   I   N N N                             *
*                        M   M   I   N N N                             *
*                        M   M   I   N  NN                             *
*                        M   M  III  N   N                             *
*                                                                      *
*******************************************************************
*                                                                      *
*     FFFFF L    DDDD  FFFFF L     A   SSS  H   H      CCC             *
*     F     L    D   D F     L    A A S   S H   H     C   C            *
*     F     L    D   D F     L    A A  S   H   H     C                 *
*     FFFF  L    D   D FFFF  L    A A   SSS HHHHH    C                 *
*     F     L    D   D F     L    AAAAA    S H   H   C                 *
*     F     L    D   D F     L    A   A S  S H   H ..  C   C           *
*     F     LLLLL DDDD F     LLLLL A   A SSS  H   H ..  CCC            *
*                                                                      *
*******************************************************************
```

```
*********************************************************************
* User name:    MIN (27)           Queue:  FIRMWARE/LASER_P_QUEUE    *
* File name:    FPPINTEL.C         Server  FIRMWARE_PSERVER          *
* Directory:                                                         *
* Description: FPPINTEL.C                                            *
*              December 2, 92                    12:17pm             *
*********************************************************************
*                                                                    *
*                     M   M  III  N   N                              *
*                     MM MM   I   NN  N                              *
*                     M M M   I   N N N                              *
*                     M M M   I   N N N                              *
*                     M   M   I   N N N                              *
*                     M   M   I   N  NN                              *
*                     M   M  III  N   N                              *
*                                                                    *
*********************************************************************
*                                                                    *
*    FFFFF PPPP  PPPP   III  N   N TTTTT EEEEE L           CCC       *
*    F     P   P P   P   I   NN  N   T   E     L         C   C      *
*    F     P   P P   P   I   N N N   T   E     L         C          *
*    FFFF  PPPP  PPPP    I   N N N   T   EEEE  L         C          *
*    F     P     P       I   N N N   T   E     L         C          *
*    F     P     P       I   N  NN   T   E     L     .. C   C       *
*    F     P     P      III  N   N   T   EEEEE LLLLL ..  CCC        *
*                                                                    *
*********************************************************************
```

-124-

THIS PAGE HAS INTENTIONALLY BEEN LEFT BLANK.

```
                                                              -125-
***********************************************************************
* User name:   MIN (27)              Queue:  FIRMWARE/LASER_P_QUEUE    *
* File name:   PPBBINTF.ASM          Server  FIRMWARE_PSERVER          *
* Directory:                                                           *
* Description: PPBBINTF.ASM                                            *
*              December 2, 92                        12:17pm           *
***********************************************************************
*                                                                      *
*                       M   M  III  N   N                              *
*                       MM MM   I   NN  N                              *
*                       M M M   I   N N N                              *
*                       M M M   I   N N N                              *
*                       M   M   I   N N N                              *
*                       M   M   I   N  NN                              *
*                       M   M  III  N   N                              *
*                                                                      *
***********************************************************************
*                                                                      *
*  PPPP  PPPP  BBBB  BBBB   III  N   N TTTTT FFFFF      A   SSS  M   M *
*  P  P  P  P  P B   B B    I    NN  N   T   F        A A  S   S MM MM*
*  P  P  P  P  P B   B B    I    N N N   T   F        A A  S     M M M*
*  PPPP  PPPP  BBBB  BBBB   I    N N N   T   FFFF     A A   SSS  M M M*
*  P     P     B  B  B  B   I    N N N   T   F       AAAAA    S  M   M*
*  P     P     B  B  B  B   I    N  NN   T   F    .. A   A    S  M   M*
*  P     P     BBBB  BBBB  III   N   N   T   F    .. A   A  SSS  M   M*
*                                                                      *
***********************************************************************
```

```
                                                        -126-
/************************************************************/
/* File: PPFLOPPY.C                                          */
/*           Phoenix: Flash EEPROM Programming Utility       */
/*                                                           */
/* Purpose: This program programs the Flash EEProm in the system from a */
/*      disk file. This utility is a BIOS based version that can make   */
/*      use of all the BIOS services available. This utility is used to */
/*      update the Flash EEPROM contents from one release of BIOS ROM   */
/*      code to another. This utility must do ALL the disk work itself  */
/*      since the DOS services are not available. This utility is burned*/
/*      into an EPROM device and placed on the "PPROM" adaptor. It is   */
/*      used to install the BIOS ROM code into the Flash EEPROM when the*/
/*      Flash EEPROM checksum is invalid. (i.e., Manufacturing install) */
/*                                                           */
/************************************************************/ include "ascii.h"          /* Defines common ASCII chars */
include "ppdisk.h"         /* Structures for disk handling */
include "ppfloppy.h"       /* Constants/structures for pgm */ define FALSE   0
define TRUE    !(FALSE)

extern int  interf_read_sector(int, int, int, unsigned long);
extern void interf_disk_change(unsigned long);
extern void move_region(unsigned long, void *, int);
/************************************************************/
/*                  TITLE VARIABLES                          */
/*                                                           */
/*   Variables required/used by the main body of the LDFLASH program */
/************************************************************/
/* Messages to appear on the screen as part of the program title. */
char    version_message[]   = "         Revision #1.0, Jan. 17, 1992";
char    user_message[]  = "SYSTEM WILL AUTOMATICALLY REBOOT AFTER BIOS IS UPDATED";

char    default_filename[]  = "ROMIMAGE.BIN\0";
/************************************************************/
/*              Local Procedure Prototypes                   */
/************************************************************/
void    near    Setup_Environment();
int     near    Read_Disk(int, int, unsigned long);
int     near    Get_Next_FAT_Index(unsigned int *);
int     near    Compare_Names (char *, char *);
int     near    Check_abort();

/************************************************************/
/* PPFLOPPY.C           PPROM Update Initialization          */
/*                                                           */
/* Purpose: This routine is the initialization section of the Floppy    */
/*      based utility program. Its function is to setup the environment */
/*      for the main body of the program. This file contains the 'Main' */
/*      section for the C program. The body is called as a function.    */
/*                                                           */
/* Parameters: filenam.ext (optional, file containing the ROM image)    */
/*                                                           */
/* Inputs: The named file or the default file.               */
/*                                                           */
/* Outputs: BIOS ROM code to the Flash EEPROM.               */
/*                                                           */
/* Return Value: none.                                       */
```

```
                                                    -127-
                                                         */
/*                                                       */
/* Operation:                                            */
/*      - request buffer space for the BIOS ROM image (248K)  */
/*      - parse the filename from the command line, if given  */
/*      - call the program body                          */
/*      - return to the Monitor Prompt                   */
/*                                                       */
/********************************************************/ void far
Load_EEPROM ()
{
    char        *entry_string;
    int         index;          /* Loop control var         */

Setup_Environment ();

/******* Check for and parse the optional filename on the command line **/
    entry_string = &default_filename[0];    /* Make it point at default value */
    for (index=0; index < FNAME_SIZE+FEXT_SIZE; index++)
    { /* Clear & pad out the work space */
        globals.image_filename[index] = ' ';    /* Clear name buffer to blanks */
    }

/* Copy target name into global buffer */
    for (index=0; index < FNAME_SIZE; index++, entry_string++)
    {
        globals.image_filename[index] = *entry_string;
    }
        entry_string++;
    for (index=0; index < FEXT_SIZE; index++, entry_string++)
    {
        globals.image_filename[FNAME_SIZE+index] = *entry_string;
    }
    Load_Flash_EEPROM ();                   /* Call the main body of program*/
    Display_User_Msg (ERROR_ATTR, "Reboot the system and try again");
ppfail: goto ppfail;

} /* end Main */

/********************************************************/
/* PPFLOPPY.C      Setup Environment                     */
/*                                                       */
/* Purpose: This routine is the initialization section of the BIOS based*/
/*      utility program. Its function is to setup the environment for */
/*      the main body of the program. This file contains the 'Main'   */
/*      section for the C program. The body is called as a function.  */
/*                                                       */
/* Parameters: filenam.ext (optional, file containing the ROM image)  */
/*                                                       */
/* Inputs: The named file or the default file.           */
/*                                                       */
/* Outputs: BIOS ROM code to the Flash EEPROM.           */
/*                                                       */
/* Return Value: none.                                   */
/*                                                       */
/* Operation:                                            */
/*      - request buffer space for the BIOS ROM image (248K)  */
/*      - parse the filename from the command line, if given  */
/*      - call the program body                          */
```

-128-
```c
/*     - return to the Monitor Prompt                                  */
/*                                                                     */
/**********************************************************************/
void near
Setup_Environment ()
{
/***** Call the Machine specific routine to initialize the environment. */
    Mach_Entry_Init();

/******* Initialize some of the global variables and CPU registers ******/
    globals.disk.sectors_per_track = 9;   /* 3.5" FD default        */
    globals.disk.sector_size     = 512;   /* DOS standard value     */
    globals.disk.cluster_size    = 1;     /* one sector per cluster */
    globals.disk.num_heads       = 2;     /* 3.5" FD default        */

/******* Request memory blocks for the code image buffer ****************/
    globals.image_segment_1 = 0x30000UL;
    globals.image_segment_2 = 0x40000UL;
    globals.image_segment_3 = 0x50000UL;
    globals.image_segment_4 = 0x60000UL;
    globals.image_segment_41= 0x60000UL + MEM_48K;
    globals.image_segment_42= 0x60000UL + MEM_52K;
    globals.disk.FAT_address= 0x20000UL;       /* Area to hold the FAT in mem */
}
/**********************************************************************/
/* PPFLOPPY.C           Find Image File                              */
/*                                                                     */
/* Purpose: Locate and open the ROM image file as specified by the user.*/
/*      This is done by first reading the disk boot sector to locate the*/
/*      disk FAT table (File Allocation Table). Then...               */
/*                                                                     */
/* Inputs: filename (global var) - name of file to look for            */
/*                                                                     */
/* Outputs: file FAT entry (global var)                                */
/*                                                                     */
/* Return Values: 0 - file found and opened.                           */
/*                1 - file not found.                                  */
/*                2 - disk error.                                      */
/*                                                                     */
/**********************************************************************/
extern  struct s_disk_boot_sector   boot_sector;    /* temp buff */
extern  struct s_dir_entry          root_file[];   /* file entry in root dir */
int near
Find_Image_File ()
{
    unsigned long       locat_boot_sector; /* Location of boot sector */
    unsigned long       locat_root_file;   /* Location of root file */
    int                 index, i, num_entries;   /* Loop control var */
    int                 root_sector;   /* Logical sector of start of Root Dir */
    int                 root_size;     /* number of sectors used by root dir */ locat_boot_sector = globals.disk.FAT_address + 0x2000UL;
    /* Read the boot sector ****************************************/
    if (Read_Disk (0, 1, locat_boot_sector) )
    {
        Display_User_Msg (ERROR_ATTR, "ERROR, reading Boot Sector");
        return (DISK_ERROR);
    }
    move_region(locat_boot_sector, &boot_sector, 15);
    globals.disk.sector_size    = boot_sector.sector_size;
```

```
                                                             -129-
globals.disk.cluster_size   = boot_sector.cluster_size;
globals.disk.num_heads      = boot_sector.num_heads;
globals.disk.sectors_per_track = boot_sector.sectors_per_track;
/*** Load the FAT into memory *******************************/
if (Read_Disk (boot_sector.reserved_space, boot_sector.FAT_size, globals.disk.FAT_address) )
{
    Display_User_Msg (ERROR_ATTR, "ERROR, reading F.A.T.");
    return (DISK_ERROR);
}
/*** Load root directory into memory ************************/
root_sector = boot_sector.reserved_space +
              (boot_sector.FAT_copies * boot_sector.FAT_size);
root_size = (boot_sector.num_root_entries * DIR_ENTRY_SIZE)
            / boot_sector.sector_size;
                                /* Locate the start of the files area  */
globals.disk.starting_data_sector = root_sector + root_size;
                                /* Establish the buffer for the directory data */
locat_root_file = globals.image_segment_1;
num_entries = boot_sector.sector_size / DIR_ENTRY_SIZE;
                                /* Read Root dir into memory    */
while (root_size--)
{
if (Read_Disk (root_sector, 1, locat_root_file) )
{
    Display_User_Msg (ERROR_ATTR, "ERROR, reading Root Dir.");
    return (DISK_ERROR);
}
root_sector++;
move_region (locat_root_file, &(root_file[0]), boot_sector.sector_size/2);
/*** Search for file name ************************************/
i = 0;
for (index = num_entries ;
     index > 0; index--, i++)
{
    if (root_file[i].filename[0] == 0xE5U )
    { /* Entry has been deleted, skip it    */
        continue;
    }
    if (root_file[i].filename[0] == 0x00U )
    { /* Null entry indicates end of dir entries. File not found.  */
        Display_User_Msg (ERROR_ATTR, "Can't locate input file.");
        return (NO_FILE);                    /* Complain and exit    */
    }
    if (Compare_Names ((char *)&(root_file[i]), (char *)globals.image_filename) )
    { /* Match. Read the starting FAT entry from the dir entry.    */
        globals.disk.starting_FAT_entry = root_file[i].start_cluster;
        globals.disk.file_size          = root_file[i].file_size;
        return (GOOD_READ);
    }
} /* end for */
} /* end while */
/* File not found in root directory. Error  */
Display_User_Msg (ERROR_ATTR, "Can't locate input file.");
return (NO_FILE);                            /* Complain and exit    */

} /* end Find_Image_File () */

/*****************************************************************/
/* PPFLOPPY.C        Read Image File                             */
/*                                                               */
```

```
/* Purpose: This routine reads the BIOS ROM code file into the memory   */
/*      buffers.  The file is assumed to be in binary format and        */
/*      therefore requires no translation during the load.              */
/*                                                                      */
/* Inputs:      Starting FAT Index - (global Variable)                  */
/*              image buffer. - (global variables) memory buffer for code*/
/*                                                                      */
/* Outputs: file contents into memory buffers.                          */
/*                                                                      */
/* Return Values: 0 - file read OK                                      */
/*                1 - read error on disk                                */
/*                2 - file too short to fill buffers                    */
/*                3 - file too long for buffers                         */
/*                4 - wrong machine ID                                  */
/*                5 - image checksum error.                             */
/************************************************************************/
#define SIZE_OF_SECTOR  512                 /* Data bytes in sector     */
#define SIZE_OF_READ    SIZE_OF_SECTOR      /* Read one sector at a time */
extern int checksum_image(unsigned long, unsigned long);
unsigned int    fat_index;                  /* Points to the next cluster */ int near
Read_Image_File ()
{
    unsigned long   image_buffer;       /* Work pointer to block buffer */
    unsigned long   bytes_read;         /* Continuing count of # of byte read */
    unsigned int    file_sector;        /* Sector to read on disk       */
    int             j;

if (globals.disk.file_size > ROM_SIZE + HEADER_SIZE)
    {
        Display_User_Msg (ERROR_ATTR, "File too long for ROM");
        return (FILE2LONG);
    }
    if (globals.disk.file_size < ROM_SIZE + HEADER_SIZE)
    { /* Could not read a full block, file too short     */
        Display_User_Msg (ERROR_ATTR, "File too short for ROM.");
        return (FILE2SHORT);
    } fat_index = globals.disk.starting_FAT_entry;/* Load starting index */
    if(Verify_Machine(fat_index) != TRUE)
        return (WRONG_MACH_ID);
    Get_Next_FAT_Index(&fat_index);                 /* Get next cluster pointer */
    if (globals.disk.cluster_size == HEADER_SIZE/1024) /* if cluster size is 1 sector, */
        Get_Next_FAT_Index(&fat_index);             /* we need to read and discard another sector */
    bytes_read = 0;                                 /* Clear byte counter   */
    j = 0;
    Display_User_Msg (NORMAL_ATTR, "Reading ROM image");
    Set_Display_Start();
    do {
        if (bytes_read >= ROM_SIZE)
            { /* Have reached End_Of_File data, exit    */
                if (Checksum_Image(globals.image_segment_1, 3*MEM_64K+MEM_52K+MEM_4K) != TRUE)
                {
                    Display_User_Msg (ERROR_ATTR, "CHECKSUM ERROR! Bad image file.");
                    return (BAD_CHECKSUM);
                }
                Display_User_Msg (NORMAL_ATTR, "Checksum passed");
                return (GOOD_READ);
```

-131-

```c
        )
    image_buffer = globals.image_segment_1 + bytes_read;
    file_sector = ((fat_index-2) * globals.disk.cluster_size)
                    + globals.disk.starting_data_sector;
    if (Read_Disk (file_sector, globals.disk.cluster_size, image_buffer) )
    {
        Display_User_Msg (ERROR_ATTR, "ERROR, reading File");
        return (FILE_ERROR);
    }
    bytes_read += globals.disk.sector_size * globals.disk.cluster_size;   /* Increment byte count */
    j++;
    if (j == 4)
        j = 0;
    Display_Prog_Num(j);
    } while (Get_Next_FAT_Index(&fat_index));
    return (GOOD_READ);
} /* end Read_Image_File () */

/*****************************************************************/
/* PPFLOPPY.C        Verify_machine                              */
/*                                                                */
/* Purpose: Verify the machine ID with the disk header and determine */
/*      if we should go ahead and reprogram the flash.           */
/*      This code will only work with Floppy disk, because the cluster */
/*      size is restricted to be 1 or 2 sectors only, and header is */
/*      set as 2 sectors.                                        */
/*                                                                */
/* Parameters:                                                   */
/*      None.                                                    */
/* Return Values:                                                */
/*      TRUE - The machine ID is correct.                        */
/*      FALSE- This rom image is not for this machine.           */
/*                                                                */
/*****************************************************************/
#define MODEL_ID_LEN 8
extern struct header_format image_header;
extern char MODEL_ID;
int near
Verify_Machine(unsigned int fat_index)
{
   char *id_ptr;
   unsigned long header_buffer;
   unsigned int file_sector;         /* Sector to read on disk    */
   unsigned int index;

id_ptr = &MODEL_ID;
   header_buffer = globals.image_segment_1;
   file_sector = ((fat_index-2) * globals.disk.cluster_size)
                    + globals.disk.starting_data_sector;
   if (Read_Disk (file_sector, globals.disk.cluster_size, header_buffer) )
   {
       Display_User_Msg (ERROR_ATTR, "ERROR, reading File");
       return (FILE_ERROR);
   }
   move_region(header_buffer, &image_header, globals.disk.sector_size/2);
   for ( index = 0; index < MODEL_ID_LEN; ++index)
                    /* Start to verify if machine name is the same */
   {
       if (image_header.machine_id[index] != id_ptr[index])
       {
```

```
               -132-
       Display_User_Msg (ERROR_ATTR, "ERROR: Wrong image file");
       return (FALSE);
     }
   }
   Display_Firmware_Version(&image_header);
   return(TRUE);
 }

/*************************************************************/
 /* PPFLOPPY.C         Get_Next_FAT_Index                     */
 /*                                                           */
 /* Purpose: Using the current FAT index, determine the next cluster */
 /*     number to use for this file.                          */
 /*                                                           */
 /* Parameters:                                               */
 /*    *FAT_index - pointer to a variable that contains the current */
 /*             FAT index and which will be updated with the new index. */
 /*                                                           */
 /* Return Values:                                            */
 /*    TRUE - next cluster has been found.                    */
 /*    FALSE- no more clusters in this file. EOF              */
 /*                                                           */
 /*************************************************************/
 extern unsigned int FIND_NEXT_FAT_INDEX (unsigned int *, unsigned long);
 int near
 Get_Next_FAT_Index(unsigned int * fat_index)
 {
     if (*fat_index >= 0x0FF0)
     /* That was the last cluster in this file. */
         return (FALSE);

*fat_index = FIND_NEXT_FAT_INDEX (fat_index, globals.disk.FAT_address);
     return (TRUE);
 }

/*************************************************************/
 /* PPFLOPPY.C         Wait for the Floppy                    */
 /*                                                           */
 /* Purpose: Wait for the user to change diskettes. This is usually */
 /*     called after an error was detected on the disk or in the file. */
 /*                                                           */
 /* Inputs: status (parameter)                                */
 /*          = FALSE - wait for the floppy to be removed.     */
 /*          = TRUE  - wait for a floppy to be inserted.      */
 /*                                                           */
 /* Outputs: none                                             */
 /*                                                           */
 /*************************************************************/ int near
 Wait_Floppy (int status)
 {
     register int     count;         /* Work counter for timing delay*/ if (status)                     /* Look for new floppy to be inserted  */
     {
         while ( Read_Disk (1, 1,    /* Read til no error    */
             globals.image_segment_1))/* Buffer address to fill */
         {                           /* Wait for good read result  */
             if (Check_abort() == 0x01 ) /* Check if the user want to abort the operation */
```

```
                                                                    -133-
            return (FALSE);          /* 0x01 is the ESC key scan code */
        }
    }
    else
    {                                /* Wait for floppy to be removed*/
        interf_disk_change(globals.image_segment_1);
    } /* end if */
    return(TRUE);
} /* end Wait_Floppy () */

/****************************************************************/
/* PPFLOPPY.C          Check for floppy ready                   */
/*                                                              */
/* Purpose: Check the status of the floppy disk. Return the status. */
/*                                                              */
/* Inputs: none                                                 */
/*                                                              */
/* Return Values: FALSE - floppy not inserted.                  */
/*                TRUE  - disk is readable (ready)              */
/*                                                              */
/****************************************************************/
int near
Check_Disk_Ready ()
{
    return (!(Read_Disk (1, 1,        /* Test by reading a sector.  */
        globals.image_segment_1)));/*Buffer address to fill   */

} /* end Check_Disk_Ready () */

/****************************************************************/
/* PPFLOPPY.C          Read Disk Sectors                        */
/*                                                              */
/* Purpose: Read N sectors from the disk drive starting at the passed */
/*      logical sector number.                                  */
/*                                                              */
/* Parameters:                                                  */
/*      logical_sector  - logical sector number to read ( 0 - n ) */
/*      num_sectors     - number of sectors to read             */
/*      buffer          - pointer to buffer where to put data   */
/*                                                              */
/* Return Values:                                               */
/*      0 - read successful                                     */
/*      2 - disk device error                                   */
/*                                                              */
/****************************************************************/
int near
Read_Disk(int logical_sector, int num_sectors, unsigned long buffer)
{
    int     track;          /* Current track to read on disk*/
    int     head;           /* Head/side to read on disk   */
    int     result, sector;    /* Sector to read. 1 - n       */ track   = logical_sector / globals.disk.sectors_per_track;
    sector  = (logical_sector % globals.disk.sectors_per_track) + 1;
    head    = track % globals.disk.num_heads;
    track   = track / globals.disk.num_heads;

while (num_sectors-- > 0)
```

-134-

```c
{
    result = interf_read_sector(track, sector, head, buffer);
    if (result != 0)
                            /* Check for disk error */
        return (DISK_ERROR);
    buffer += globals.disk.sector_size;    /* Increment buff ptr */
    if (++sector > globals.disk.sectors_per_track)
    { /* Wrap sectors to next head */
        sector = 1;
        if (++head == globals.disk.num_heads)
        { /* wrap head to next track */
            head = 0;
            track++;
        }
    }
} /* end while */
    return (GOOD_READ);
}

/*******************************************************************/
/* PPFLOPPY.C         Compare Filenames                             */
/*                                                                  */
/* Purpose: This routine compares the filename in the directory entry */
/*     with the target string to test for a match.                  */
/*                                                                  */
/* Parameters:                                                      */
/*           dir_name - pointer to directory entry (11 bytes long)  */
/*           target name - pointer to string to match.              */
/*                                                                  */
/* Return Values:                                                   */
/*           FALSE - names don't match                              */
/*           TRUE  - names match in content and length              */
/*                                                                  */
/*******************************************************************/
int near
Compare_Names (char *dir_name, char *target_name)
{
    int     index;              /* loop control variable */

/* Compare the two padded, truncated name strings. All 11 chars. */
    for (index=0; index < FNAME_SIZE+FEXT_SIZE; index++)
    {
        if (*(dir_name++) != *(target_name++))
        { /* Name characters do not match    */
            return (FALSE);
        }
    }
    return (TRUE);              /* Names match */
} extern int far SCP_RECV_FAR();

/*******************************************************************/
/* PPFLOPPY.C         Display Firmware Version                      */
/*                                                                  */
/* Purpose: Display firmware date and version number                */
/*                                                                  */
/* Parameters:                                                      */
```

```
/*      None.                                                     */
/* Return Values:                                                 */
/*      None                                                      */
/****************************************************************/
char Header_message[]=("Firmware Date:        , Version:");

void near
Display_Firmware_Version(struct header_format *image_hdr)
{
    int temp_ptr_storage;

image_hdr->space = 0;                               /* To write a null character for proper display */
    temp_ptr_storage = globals.video_msg_pointer;       /* Keep a temparay copy */
    Display_User_Msg(NORMAL_ATTR, Header_message);      /* Display header */
    globals.video_msg_pointer -= (SCREEN_WIDTH - 15);   /* Point to the starting address of date message */
    Display_User_Msg(NORMAL_ATTR, image_hdr->fw_date);  /* Display header */
    globals.video_msg_pointer -= (SCREEN_WIDTH - 20);   /* Point to the starting address of date message */
    Display_User_Msg(NORMAL_ATTR, image_hdr->fw_version);/* Diplay FW version number */
    globals.video_msg_pointer = (temp_ptr_storage + SCREEN_WIDTH);
}

/****************************************************************/
/* PPFLOPPY.C              Check_abort()                          */
/*                                                                */
/*      Check_abort is called to receive a byte from the SCP      */
/* command execution of an SCP command which returns a result byte.*/
/* The difference between this routine and the SCP_RECV in scp.asm is */
/* that we don't want a long wait here, we need a quick return.   */
/*                                                                */
/* Output:                                                        */
/*      AL: Byte read from the SCP                                */
/*                                                                */
/* Note:    This routine must work in protected mode.             */
/*                                                                */
/****************************************************************/ define SCP_STATUS      0x64        /* System Control Processor Status */
define SCP_RESULT      0x01        /* SCP has a result byte */
#define SCP_BUSY        0x02        /* SCP has not yet read command */
#define SCP_DATA_IN     0x60        /* SCP's input-data port */
define SCP_DATA_OUT    0x60        /* SCP's OUTput-data port */ int
Check_abort()
{
    register int index;
    _AX = 0;                        /* Clear AX register. */
    for (index = 0 ; index < 250; ++index )
    {
        asm IN  AL,SCP_STATUS;      /* Read the SCP's status register */
        asm AND AL,SCP_RESULT;      /* Does the SCP have a byte waiting? */
        asm JNZ SR3;                /* Yes - get the byte from the SCP*/
    }
    return;
SR3:;
    asm IN      AL,SCP_DATA_IN;     /* Yes - flush the byte from the SCP */
    return;
}
```

```
/******************************************************************/
/*    Define the manufacturer index codes for the available parts  */
/******************************************************************/ define SEEQ            0         /* Index code for the SEEQ 48C010 part */
define INTEL           1         /* Index code for the INTEL 28F010 part */
define MAX_MFGR_INDEX  1         /* Set upper limit on index    */ ifndef MFGR                      /* Check for alternate part selection */
define MFGR    INTEL             /* Set the default part index  */
endif /******************************************************************/
/*    Now include the machine specific code                        */
/******************************************************************/
#include "machine.c"

#if MFGR > MAX_MFGR_INDEX          /* Verify the manufacturer index*/
#error "Unknown device type, Aborting"
#error " Current types are : 'INTEL' 'SEEQ'"
#undef MFGR
#endif                             /* Flag fatal error & exit     */

/******************************************************************/
/*    Now include the common code for programming the FLASH part   */
/******************************************************************/
#include "fldflash.c"

/******************************************************************/
/*    Pull in the appropriate device handling routines             */
/******************************************************************/
#if (MFGR == SEEQ)

#include "ppseeq.c"

#elif (MFGR == INTEL)

#include "fppintel.c"

#endif

/*::::::::::::::::::::::::::End of File::::::::::::::::::::::::::::*/
```

```
                                                              -137-
#pragma inline                       /* Flag use of inline asm code */
/********************************************************************/
/*                                                                   */
/* File: FLDFLASH.C                                                  */
/*          Phoenix: Flash EEPROM Programming Utility                */
/*                                                                   */
/*                                                                   */
/* Purpose: This program programs the Flash EEProm inthe system from a */
/*     disk file. This utility has two incarnations. First, there is a */
/*     DOS based version that can make use of all the DOS services   */
/*     available. This version is used to update the Flash EEPROM    */
/*     contents from one release of BIOS ROM code to another. Second, */
/*     there is the standalone version that must do ALL the work     */
/*     itself. This version is burned into a EPROM device and placed */
/*     on the "PPROM" adaptor. It is used to install the BIOS ROM code */
/*     into the Flash EEPROM when the Flash EEPROM checksum is invalid.*/
/*     (i.e., Manufacturing install)                                 */
/********************************************************************/

/********************************************************************/
/*                                                                   */
/* Modified on 2/20/91   by VSJ                                      */
/*        Added   Clear_Display_Ram()    in phase III, after         */
/*                  Press Enter key to reboot                        */
/*                                                                   */
/*                                                                   */
/* 03/26/91 BDW - added call to machine dependent routine to setup the */
/*           machine environment for programming. Stabilizes the two */
/*           disk drives (floppy & winchester) before programming.   */
/* 09/27/91 MEL - revised the program to serve 28F001-BX with 28F010 */
/* 01/17/92 MEL - revised the code for recovering BIOS disaster during */
/*           the booting time.                                       */
/********************************************************************/

/********************************************************************/
/*                                                                   */
/* FLDFLASH.C        Load Flash EEPROM                               */
/*                                                                   */
/* Purpose: This routine is the body section of the Flash EEPROM     */
/*     utility program. Its function is to control the operation of  */
/*     the programming of the Flash EEPROM.                          */
/*                                                                   */
/*                                                                   */
/* Inputs:                                                           */
/*                                                                   */
/* Outputs:                                                          */
/*                                                                   */
/* Return Value: none.                                               */
/*                                                                   */
/* Operation:                                                        */
/*      Phase-I)   Locate the file to load.                          */
/*      Phase-II)  Read the file into memory buffers.                */
/*      Phase-III) Write the memory buffers to the Flash EEPROM device. */
/*                                                                   */
/********************************************************************/
#define TEN_MS  0x2E7C  /* timer counter for 10 ms, base on 1/1.19Mhz */
extern void cold_reset();
extern void near SEND_ROW(int);
extern void near SEND_CHARACTER(int);
void near
Load_Flash_EEPROM ()
    {
                                /* Numbers of errors to absorb before restarting */
    int retries;                /* Result of function return */
    int result;
```

```
                                                      -138-
       while (TRUE)                           /* Start/restart of process        */
       {
           Clear_Display_Ram ();              /* Initialize the video RAM content  */
           Display_Program_Banner ();         /* Place Program title on screen     */
           set_delay_constant();              /* Get delay for byte program in flash */

/* Phase - I: Locate the BIOS ROM code image file on disk    */ retries = 3;                       /* Numbers of errors to absorb before restarting */
           while (retries--)
           {
               if ( !Check_Disk_Ready() )
               {
                   Display_User_Msg (NORMAL_ATTR, "Please insert ROM image floppy in drive A:");
                   if (Wait_Floppy (TRUE) == FALSE)
                   {
                       Display_User_Msg (ERROR_ATTR, "User Aborted!");
                       return;
                   }
               }
               Display_User_Msg (NORMAL_ATTR, "Looking for code file...");
               if (Find_Image_File() == 0)   /* attempt to locate file */
                   /* file found, proceed */
                   break;                     /* leave while loop */
               else
               { /* file NOT found */
                   if ( retries == 0 )
                   { /* retries exhausted, display error and restart.   */
                       Display_User_Msg (ERROR_ATTR, "Retries exhausted, Please remove diskette.");
                       Wait_Floppy (FALSE);   /* Wait for floppy removed.   */
                       return;                /* Return to MAIN             */
                   }
                   Display_User_Msg (ERROR_ATTR, "File not found, Try another diskette.");
                   Wait_Floppy (FALSE);       /* Wait for floppy to be removed   */
               }
           } /* endwhile */

/* Phase - II: Read the file into the memory buffers.    */ retries = 3;
           while (retries--)
           {
               result = Read_Image_File ();
               if (result == 0)
               { /* File read correctly, proceed. */
                   break;                     /* OK, go write EEPROM device. */
               }
               else
               { /* File or Disk error, attempt retry.   */
                   if ( (retries == 0) || (result == WRONG_MACH_ID) || (result == BAD_CHECKSUM) )
                   { /* retries exhausted, display error and restart.   */
                       Display_User_Msg (ERROR_ATTR, "Retries exhausted, Try another diskette.");
                       Wait_Floppy (FALSE);   /* Wait for floppy removed.   */
                       return;                /* Return to MAIN             */
                   }
               }
           } /* endwhile */

/* Phase - III: Update the Flash EEPROM contents with memory buffer contents.   */
```

```
                                                -139-
                                       /* Stabilize the environment   */ /* BDW 3/26/91*/
    Mach_Program_Setup();
    retries = 2;
    while (retries--)
    {
        result = Write_EEPROM_Data ();
        if (result == 0)
        { /* Device successfully programmed, return to 'Main' pgm. */
            Display_User_Msg (NORMAL_ATTR, "Programming succeeds. Reboot system ...");
            Clear_Display_Ram ();         /* Initialize the video RAM content */
            cold_reset();   /* we need a cold reset to reslush flash ROM to RAM */
            return;         /* returns to the MAIN procedure.     */
        }
        else
        { /* Programming error, attempt retry.     */
            if (retries > 0)
            { /* Give message on all but last retry */
                Display_User_Msg (ERROR_ATTR, "Error programming FLASH Device. Retrying...");
            }
        }
    } /* endwhile */
    Display_User_Msg (ERROR_ATTR, "FLASH Device failure! Device content has been corrupted.");
    Display_User_Msg (ERROR_ATTR, "  Remove floppy and re-insert to try again, else reboot.");
    Wait_Floppy (FALSE);                  /* Delay a while, then restart */

} /* end while(true) */

} /* end Load_Flash_EEPROM */           /* Returns to MAIN        */

/*********************************************************************/
/* FLDFLASH.C          Display User Msg                              */
/*                                                                   */
/* Purpose: This routine has the responsability of placing messages  */
/*     on the user's display screen. It is assumed that the video is */
/*     in a state equivilent to video mode 3 (alphanumeric 80 x 24). */
/*     This means the video buffer is at B800:0 and each word contains */
/*     a character byte and an attribute byte.                       */
/*                                                                   */
/* Inputs: msg_string - pointer to the string of chatacters to display. */
/*                  The string is terminated with a NULL char.       */
/*         char_attribute - The color attribute to associate with this */
/*                  text on the screen. Matches the EGA definition.  */
/*         screen_msg_pointer (global var) - points to loc of next msg. */
/*                                                                   */
/* Outputs: The message string is placed into the video memory with the */
/*          given color attribute. The first message is placed on    */
/*          screen line 3. Each display request after that is placed */
/*          on the next available line on the screen. No special     */
/*          checking is done for line or screen wrapping, that is    */
/*          left up to the caller.                                   */
/*                                                                   */
/* Return Values: none.                                              */
/*                                                                   */
/*********************************************************************/
void near
Display_User_Msg (char char_attribute, char msg_string[])
{
    int              cell_index;
    union video_ram  cell_value;
```

-140-

```
    Set_Display_Start();                          /* Load starting loaction*/ cell_index = globals.video_msg_pointer;
    cell_value.byte.attribute = char_attribute;   /* Set the attribute value    */
    while (*msg_string != 0)
    { /* copy till null terminator     */
        cell_value.byte.character = *(msg_string++);   /* Set the next data byte    */
        screen_image[cell_index].cell = cell_value.cell;
        cell_index++;
    }
    send_row (globals.video_msg_pointer, cell_index-globals.video_msg_pointer);
    globals.video_msg_pointer += SCREEN_WIDTH;    /* Move to the next line    */
} /* end Display_User_Msg () */

/***************************************************************/
/* FLDFLASH.C        Clear Display RAM                         */
/*                                                             */
/* Purpose: This routine is used to initialize the video display buffer */
/*     to a constant value in preparation for display of messages to  */
/*     the user. The video RAM is accessed directly with the assumption*/
/*     that the video susb-section of hardware has been setup for    */
/*     operating in video mode 3.                              */
/*                                                             */
/* Inputs: screen_buffer (global variable) - points to the video RAM */
/*                                                             */
/* Outputs: Constant value to all storage locations in video RAM */
/*                                                             */
/***************************************************************/
void near
Clear_Display_Ram ()          /* Initialize the video RAM content   */
{
    register unsigned int     video_cell_index;
    union video_ram           cell_value;         /* used to build cell value */
    int                       i;

cell_value.byte.character  = BLANK;
    cell_value.byte.attribute  = NORMAL_ATTR;
    for (video_cell_index=0;
         video_cell_index < (SCREEN_WIDTH*SCREEN_LENGTH);
         video_cell_index++)
    {
        screen_image[video_cell_index].cell = cell_value.cell;
    }
    for (i=0; i < SCREEN_LENGTH; i++)
    {
        send_row(i*SCREEN_WIDTH, SCREEN_WIDTH);
    }

}

/***************************************************************/
/* FLDFLASH.C        Display Program Banner                    */
/*                                                             */
/* Purpose: Assuming a presently blank screen, this routine writes a */
/*     border pattern and the program herrald to the video RAM.  */
/*                                                             */
/* Inputs: screen_buffer (global variable) - points to the video RAM */
/*         screen_msg_pointer (global var) - points to next message loc */
/*                                                             */
```

-141-

```c
/* Outputs: Banner to screen_buffer & initialized screen values    */
/*                                                                 */
/*****************************************************************/
void near
Display_Program_Banner ()              /* Place Program title on screen    */
{
    register unsigned int    video_cell_index;   /* selects video cell   */
    union video_ram          cell_value;         /* used to build cell value */
    int                      i;

/* place border around the screen                              */
    /* First, place the four corners                               */
    cell_value.byte.attribute = 0x1F;        /* Blue background,bright white char  */
    cell_value.byte.character = DBL_ASTERISK;  /* place the asterisk */
    screen_image[0].cell = cell_value.cell;
    screen_image[SCREEN_WIDTH-1].cell = cell_value.cell;
    screen_image[SCREEN_WIDTH*(SCREEN_LENGTH-1)].cell = cell_value.cell;
    screen_image[SCREEN_WIDTH*(SCREEN_LENGTH-1)+79].cell = cell_value.cell;

/* Second, place the top edge border                           */
    for (video_cell_index=1; video_cell_index < SCREEN_WIDTH-1; video_cell_index++)
        screen_image[video_cell_index].cell = cell_value.cell;

/* Third, place the left and right vertical edges.             */
    for (video_cell_index=SCREEN_WIDTH;                       /* initializer */
         video_cell_index < SCREEN_WIDTH*(SCREEN_LENGTH-1);   /* conditional */
         video_cell_index+=SCREEN_WIDTH)                      /* incrementer */
    {
        screen_image[video_cell_index].cell             = cell_value.cell;   /* left */
        screen_image[video_cell_index+SCREEN_WIDTH-1].cell = cell_value.cell;   /* right*/
    }

/* Fourth, place the bottom edge border                        */
    for (video_cell_index=SCREEN_WIDTH*(SCREEN_LENGTH-1)+1;   /* initializer */
         video_cell_index < (SCREEN_WIDTH*SCREEN_LENGTH)-1;   /* conditional */
         video_cell_index++)                                  /* incrementer */
    {
        screen_image[video_cell_index].cell = cell_value.cell;
    }
    for (i=0; i < SCREEN_LENGTH; i++)
    {
        send_row(i*SCREEN_WIDTH, SCREEN_WIDTH);
    }

/* Last, Place the program title on the screen                 */
    globals.video_msg_pointer = (SCREEN_WIDTH * 3) + 15;/* init msg location pointer */
    Display_User_Msg(HIGHLT_ATTR, "       Flash EEPROM Programming Utility");
    globals.video_msg_pointer += SCREEN_WIDTH;            /* Place a blank lines */
    Display_User_Msg(NORMAL_ATTR, version_message);
    globals.video_msg_pointer += (SCREEN_WIDTH - 3);      /* Place a blank lines */
    Display_User_Msg(NORMAL_ATTR, user_message);
    globals.video_msg_pointer = (SCREEN_WIDTH * 9) + 10;/* Set the msg pointer   */
                                                          /* and include 2 blank lines */
} /* end Display_Program_Banner () */

/*****************************************************************/
/* FLDFLASH.C         Display Progressing Number                  */
/*                                                                */
/* Purpose: This routine has the responsability of placing progressing */
```

```
-142-
/*      dots on the user's screen. It is assumed that the video is     */
/*      in a state equivilant to video mode 3 (alphanumeric 80 x 24).   */
/*      This means the video buffer is at B800:0 and each word contains */
/*      a character byte and an attribute byte.                         */
/*                                                                      */
/* Inputs: msg_string - pointer to the string of chatacters to display. */
/*                    The string is terminated with a NULL char.        */
/*         char_attribute - The color attribute to associate with this  */
/*                    text on the screen. Matches the EGA definition.   */
/*         screen_msg_pointer (global var) - points to loc of next msg. */
/*                                                                      */
/* Outputs: The message string is placed into the video memory with the */
/*          given color attribute. The first message is placed on       */
/*          screen line 3. Each display request after that is placed    */
/*          on the next available line on the screen. No special        */
/*          checking is done for line or screen wrapping, that is       */
/*          left up to the caller.                                      */
/*                                                                      */
/* Return Values: none.                                                 */
/*                                                                      */
/************************************************************************/
void near
Display_Prog_Num (int k)
{
    union video_ram         cell_value;

cell_value.byte.attribute = NORMAL_ATTR;    /* Set the attribute value  */
    switch (k)
    {
      case 0:   cell_value.byte.character = '-';    /* Set the data byte */
                break;
      case 1:   cell_value.byte.character = '/';    /* Set the data byte */
                break;
      case 2:   cell_value.byte.character = '|';    /* Set the data byte */
                break;
      case 3:   cell_value.byte.character = '\\';   /* Set the data byte */
    }

/* Set the data byte    */
    screen_image[globals.video_msg_pointer].cell = cell_value.cell;
    send_character(globals.video_msg_pointer);

} /* end Display_Prog_Num (k) */

/************************************************************************/
/* FLDFLASH.C       Set Display Starting Position                       */
/*                                                                      */
/* Purpose: This routine has the responsability of setting display      */
/*      starting position. It is assumed that the video is              */
/*      in a state equivilant to video mode 3 (alphanumeric 80 x 24).   */
/*      This means the video buffer is at B800:0 and each word contains */
/*      a character byte and an attribute byte.                         */
/*                                                                      */
/* Inputs:                                                              */
/*         screen_msg_pointer (global var) - points to loc of next msg. */
/*                                                                      */
/* Outputs: The message string is placed into the video memory with the */
/*          given color attribute.                                      */
/*                                                                      */
/* Return Values: none.                                                 */
```

```
/*                                                                    */
/********************************************************************/
void near
Set_Display_Start ()
{
   int i, j;
   union video_ram       cell_value;        /* used to build cell value */ cell_value.byte.character  = BLANK;
   cell_value.byte.attribute  = NORMAL_ATTR;
   if (globals.video_msg_pointer >= SCREEN_WIDTH*(SCREEN_LENGTH-1))
   {
      for (i = 10; i < (SCREEN_LENGTH-1); i++)
      {
        for (j = 10; j < (SCREEN_WIDTH-1); j++)
        {
          screen_image[SCREEN_WIDTH*(i-1)+j].cell =
              screen_image[SCREEN_WIDTH*i+j].cell;
        }
        send_row ((i-1)*SCREEN_WIDTH+10, SCREEN_WIDTH-12);
      }
      for (j = 10; j < (SCREEN_WIDTH-1); j++)
      {
           screen_image[(SCREEN_LENGTH-2)*SCREEN_WIDTH+j].cell = cell_value.cell;
      }
      send_row ((SCREEN_LENGTH-2)*SCREEN_WIDTH+10, SCREEN_WIDTH-12);
      globals.video_msg_pointer = (SCREEN_LENGTH-2)*SCREEN_WIDTH+10;
   }
}
/********************************************************************/
/* FLDFLASH.C        Write buffer data to Flash EEPROM              */
/*                                                                  */
/* Purpose: Copy the memory buffer contents to the Flash EEPROM.    */
/*     A special programming process/sequence must be followed to   */
/*     properly program the device. Refer to the device specification */
/*     data sheet for more deatils.                                 */
/*                                                                  */
/* Inputs: image_segment_1 (global var) - points to first 64K of data  */
/*         image_segment_2 (global var) - points to second 64K of data */
/*         image_segment_3 (global var) - points to third 64K of data  */
/*         image_segment_4 (global var) - points to fourth 48K of data */
/*         image_segment_41 (global var) - points to fifth 4K of data  */
/*         image_segment_42 (global var) - points to sixth 4K of data  */
/*                                                                  */
/* Outputs: data to EEPROM device.                                  */
/*                                                                  */
/* Return Values: 0 - Device programmed correctly.                  */
/*                other - Error specified by the error message.     */
/*                                                                  */
/* Operation:                                                       */
/*     1) Erase phase. Proceed through the device's erasure process. */
/*     2) Programming phase. Write buffer contents to device.       */
/*           Then verify device contents with buffer contents.      */
/*                                                                  */
/* Note: This routine defaults to programming two INTEL parts -- 28F010 */
/*     and 28F001BX. The part type can be changed by using the      */
/*            "-DMFGR=string"                                       */
/*     option on the compiling command line. "string" is one of the */
/*     device manufaturers names (i.e., "SEEQ", "INTEL", "INTEL2",  */
/*     etc.)                                                        */
```

-144-
```c
/*                                                                    */
/*   To add a new manufacturer's part:                                */
/*      1) add a "#define" for the manufacturer, below, use the next  */
/*             available index number in sequence.                    */
/*      2) increment the MAX_MFGR_INDEX definition to account for the */
/*             new manufacturer's part.                               */
/*      3) add the Erase and Program procedure addresses to the two   */
/*             call tables.                                           */
/*      4) write the routines into a separate file (ie. PPSEEQ.C)     */
/*      5) "#include" the new device file into the PPROM.C file.      */
/*      6) include the procedures' prototypes in the PPROM.H file.    */
/*                                                                    */
/********************************************************************/ int near
Write_EEPROM_Data ()
{
    int results, i;    /* Hold response values of device routine    */ results = MFGR;                 /* line to force compiler error */
                                    /* in case of invalid MFGR      */
    /* Phase I: Erase the entire device, then verify it's erased.   */ if (MFGR == SEEQ)
    Display_User_Msg (HIGHLT_ATTR, "       Part type is a SEEQ 48F010");
    results = SEEQ_Erase();         /* Erase the SEEQ 48F010 part   */
    results |= SEEQ_Program(globals.image_segment_1, globals.image_segment_2)
    return(results);
#elif (MFGR == INTEL)
    Set_VPP(VPP_HIGH);              /* Raise the VPP voltage        */
    for (i = 0; i < 100; i++)
            HW_Delay(TEN_MS);       /* Allow the chip to complete erasure */
    Display_User_Msg (HIGHLT_ATTR, "Erasing Low ROM");
    results = Intel_Erase();        /* Erase the INTEL 28F010 part  */
    if (results != 0)
    {
            Display_User_Msg (ERROR_ATTR, "Device error");
            goto finish;
    }
    Display_User_Msg (HIGHLT_ATTR, "Programming Low ROM");
                                    /* Program the INTEL 28F010 part */
    results = Intel_Program(globals.image_segment_1);
    if (results != 0)
    {
            Display_User_Msg (ERROR_ATTR, "Device error");
            goto finish;
    }
/*  switch (MODEL)
    {
      case 'A':
         goto finish;
      case 'B':
         ;
    }
*/
    Display_User_Msg (HIGHLT_ATTR, "Erasing High ROM");
    results = Intel_Erase2();       /* Erase the second part        */
    if (results != 0)
    {
            Program_Err_Msg(results);
```

-145-
```
        goto finish;
   }
   /* Phase II: Attempt to program the device, includes verify.    */

Display_User_Msg (HIGHLT_ATTR, "Programming High ROM");
                            /* Program INTEL 28F001BX-T */
    results = Intel_Program2(globals.image_segment_3,
                            globals.image_segment_41, globals.image_segment_42);
    if (results != 0)
      Program_Err_Msg(results);

finish:
     Set_VPP(VPP_LOW);        /* Lower the VPP voltage       */
     for (i = 0; i < 20; i++)
            Hw_Delay(TEN_MS);      /* Allow the chip to complete erasure  */
     return(results);
endif } /* end Write_EEPROM_Data () */ void near
Program_Err_Msg (int results)
{
       if (results & 0x0001)
           Display_User_Msg (ERROR_ATTR, "Programming error.");
       if (results & 0x0002)
           Display_User_Msg (ERROR_ATTR, "Vpp low detected.");
       if (results & 0x0004)
           Display_User_Msg (ERROR_ATTR, "Erasing error.");
       if (results & 0x0008)
           Display_User_Msg (ERROR_ATTR, "Command sequence error.");
       return;
}
extern int    ONE_MS_DELAY;
/*******************************************************************/
/* FLDFLASH.C              Set_VPP                                 */
/*                                                                 */
/* Purpose: Set the VPP line to the Flash device to either the low (0V) */
/*     state or the high (+12V) state.                             */
/*                                                                 */
/* Parameters:                                                     */
/*     direction    - specifies new state of VPP line              */
/*              1 = VPP low state desired.                         */
/*              0 = VPP high state desired.                        */
/*                                                                 */
/* Return Values: none                                             */
/*                                                                 */
/*******************************************************************/
#define SCP_STATUS      0x64       /* Latch address for SCP status */
#define SCP_CMD         0x64       /* Latch address for SCP cmds   */
#define SCP_DATA        0x60       /* Latch address for SCP data   */
#define SCP_CMD_READY   0x02       /* Bit to indicate ready for cmd*/
#define SCP_NOOP        0xFF       /* SCP cmd to do nothing        */
#define SCP_ZCMD        0xBF       /* SCP cmd leading all Zenith cmds */
#define SCP_VPP_OFF     0x01       /* SCP cmd to make VPP or PWD low  */
#define SCP_VPP_ON      0x00       /* SCP cmd to make VPP or PWD high */
define SCP_PWD_EN      0x56       /* SCP cmd to enable PWD to be raised high */ void near
Set_VPP(int direction)
```

-146-

```c
{
    direction = (direction == VPP_LOW) ? SCP_VPP_OFF : SCP_VPP_ON;
        /* Now delay appropriate time for VPP voltage to settle.    */
l1:
    asm IN      AL,SCP_STATUS;          /* Read SCP status              */
    asm TEST    AL,SCP_CMD_READY;       /* Wait for SCP ready for cmd   */
    asm JNZ     l1;
    asm MOV     AL,SCP_ZCMD;            /* Load SCP Zenith command      */
    asm OUT     SCP_CMD,AL;             /* Send cmd to SCP              */
l2:
    asm IN      AL,SCP_STATUS;          /* Read SCP status              */
    asm TEST    AL,SCP_CMD_READY;       /* Wait for SCP ready for cmd   */
    asm JNZ     l2;
    asm MOV     AX,direction;               /* Load SCP VPP command     */
    asm OUT     SCP_DATA,AL;            /* Send cmd parameter to SCP    */
                                        /* Wait for SCP to take the cmd */
l3:
    asm IN      AL,SCP_STATUS;
    asm TEST    AL,SCP_CMD_READY;       /* Wait for SCP to process cmd  */
    asm JNZ     l3;
    asm MOV     AL,SCP_NOOP;            /* Cmd taken, wait for processing to finish */
    asm OUT     SCP_CMD,AL;             /* Write a dummy cmd, then      */
l4:
    asm IN      AL,SCP_STATUS;          /* wait for it to be taken      */
    asm TEST    AL,SCP_CMD_READY;       /* by the SCP.                  */
    asm JNZ     l4;
    Delay_10us();
}

/*::::::::::::::::::::::::::End of File::::::::::::::::::::::::::::::*/
```

```
                                                            -147-
#pragma inline                                 /* will be using inline asm code*/
/*******************************************************************/
/* PPINTEL.C          Intel 28F010 Flash EEPROM Tools             */
/*                                                                 */
/* This file contains the tools routines to erase and program the Intel */
/* Flash EEPROM device (number 28F010, 128K x 8). This part will be used*/
/* to hold the ROM BIOS code for some of the new machines.         */
/*                                                                 */
/*   This Intel part uses a command register approach to controlling */
/* the internal activities of the part. When the Vpp line is at TTL */
/* levels, the device operates exactly like any standard UVEPROM in its */
/* read mode. When the Vpp line is raised to the 12V level, the write */
/* and erase capabilities are enabled. The following table shows the */
/* commands available for this part.                               */
/*                                                                 */
/*                    |    First Bus Cycle    ||    Second Bus Cycle   */
/* Command            | Operation| Address| Data|| Operation| Address| Data */
/* --------------------------------------------------------------- */
/* Read Memory        | Write    |    X   | 00H ||          |        |     */
/* Read ID Bytes      | Write    |    X   | 90H || Read     |   IA   | ID  */
/* Erase              | Write    |    X   | 20H || Write    |    X   | 20H */
/* Erase Verify       | Write    |   EA   | A0H || Read     |    X   | EVD */
/* Program            | Write    |    X   | 40H || Write    |   PA   | PD  */
/* Program Verify     | Write    |    X   | C0H || Read     |    X   | PVD */
/* Reset              | Write    |    X   | FFH || Write    |    X   | FFH */
/*      IA = Indentifier Address: 00H manufacturer, 01H for device code */
/*      EA = Address of memory location to be read during erase verify */
/*      PA = Address of memory location to be programmed.          */
/*      ID = Data read from identifier latches (mfgr=89H, device=B4H) */
/*      EVD= Data read from latch during erase verify.             */
/*      PD = Data to be programmed at addredd PA.                  */
/*      PVD= Data read from latch during program verify.           */
/*                                                                 */
/*******************************************************************/
/*      Define the commands used to control accesses to the memory chip */
#define READ_MODE      0x0000      /* INTEL command to establish normal read mode */
#define ERASE_SETUP    0x0020      /* INTEL command to prep for erase       */
#define ERASE_ALL      0x0020      /* INTEL command to initiate erase       */
#define ERASE_VERIFY   0x00A0      /* INTEL command to check byte for eraseure */
#define PGM_SETUP      0x0040      /* INTEL command to prep for programming */
#define PGM_VERIFY     0x00C0      /* INTEL command to check programmed byte */
define RESET_MODE     0x00FF      /* INTEL command to reset the command status */ define TEN_US   0x000C  /* timer counter for 10 us, base on 1/1.19Mhz */
define SIX_US   0x0007  /* timer counter for 6 us, base on 1/1.19Mhz */
#define TEN_MS   0x2E7C  /* timer counter for 10 ms, base on 1/1.19Mhz */

/*******************************************************************/
/* FPPINTEL.C         Intel 28F001BX Flash EEPROM Tools           */
/*                                                                 */
/* This file contains the tools routines to erase and program the Intel */
/* Flash EEPROM device (number 28F001, 128K x 8). This part will be used*/
/* to hold the ROM BIOS code for some of the new machines.         */
/*                                                                 */
/*   This Intel part uses a command register approach to controlling */
/* the internal activities of the part. When the Vpp line is at TTL */
/* levels, the device operates exactly like any standard UVEPROM in its */
/* read mode. When the Vpp line is raised to the 12V level, the write */
/* and erase capabilities of the main block and two parameter blocks */
```

```
                                                                    -148-
/* are enabled. To enable erasing and programming the boot block, either*/
/* PWD or OE must be raised to 12V in addition that Vpp is raised to    */
/* the 12V level. The following table shows the commands available for  */
/* this part.                                                           */
/*                                                                      */
/*                  |     First Bus Cycle    ||    Second Bus Cycle     */
/* Command          | Operation| Address| Data|| Operation| Address| Data */
/* ---------------------------------------------------------------------*/
/* Read Memory      |  Write  |   X    | FFH ||          |        |     */
/* Read ID Bytes    |  Write  |   X    | 90H ||   Read   |   IA   | ID  */
/* Read Status      |  Write  | 00000H | 70H ||   Read   | 00000H | SRD */
/* Clear Status     |  Write  | 00000H | 50H ||          |        |     */
/* Erase            |  Write  |   BA   | 20H ||   Write  |   BA   | D0H */
/* Program          |  Write  |   PA   | 40H ||   Write  |   PA   | PD  */
/*      IA = Indentifier Address: 00H manufacturer, 01H for device code */
/*      BA = Address within the block being erased.                     */
/*      PA = Address of memory location to be programmed.               */
/*      ID = Data read from identifier latches (mfgr=89H, device=B4H)   */
/*      PD = Data to be programmed at addressed PA.                     */
/*      SRD= Data read from status register.                            */
/*                                                                      */
/************************************************************************/
/*      Define the commands used to control accesses to the memory chip */
#define READ_MODE2      0x00FF      /* INTEL command to establish normal read mode */
#define READ_STATUS     0x0070      /* INTEL command to read status register */
#define CLEAR_STATUS    0x0050      /* INTEL command to clear status register */
#define ERASE_CONFIRM   0x00D0      /* INTEL command to initiate erase       */
/************************************************************************/
/* Return codes:                                                        */ define SUCCESS             0
define DEVICE_ERROR        1
#define VPP_RANGE_ERROR     2
#define COMM_SEQ_ERROR      8
#define ERASE_ERROR         4
#define PROG_ERROR          1
/*                                                                      */
/************************************************************************/

/************************************************************************/
/*      Function Prototypes...                                          */
int near        Check_Device_Erased(unsigned long, unsigned long);
int near        Verify_Erasure(unsigned long, unsigned long);
int near        Program_Byte(unsigned long, unsigned char);
extern int      Check_Block_Erased(unsigned long, unsigned long);
int near        Verify_Blcok_Erasure(unsigned long);
int near        Program_Block(unsigned long, unsigned long, unsigned long, unsigned long);
int near        Program_Byte2(unsigned long, unsigned long, unsigned char);
/* void         Hw_Delay(int); */
int near        set_delay_constant();

/************************************************************************/
/* FPPINTEL.C          Set Delay Constants                              */
/*                                                                      */
/* Purpose: This routine divides ONE_MS_DELAY constant to get program   */
/*      delay constants. For the Intel part, the programming delay      */
/*      constant of 10 us is required.                                  */
/*                                                                      */
/************************************************************************/
```

-149-

```c
extern unsigned int one_ms_delay;

int near
set_delay_constant()
{
        globals.program_delay_constant = one_ms_delay/100U;
}

/****************************************************************/
/* FPPINTEL.C              Intel Erase2                        */
/*                                                              */
/* Purpose: This routine is responsible for erasing the entire 28F001BX */
/*     memory device.                                           */
/* Parameters: none.                                            */
/*                                                              */
/* Return Values:                                               */
/*     0 - Success. Device has been completely erased.          */
/*     2 - Vpp low detected.                                    */
/*     4 - Erasing error.                                       */
/*     8 - Command sequence error.                              */
/****************************************************************/
extern void send_two_bytes (unsigned long, int, int);
extern void send_one_byte(unsigned long, int);
extern unsigned char get_byte (unsigned long);
int near
Intel_Erase2()
{
    unsigned long base, flash1, flash3, flash4;
    int  cresult, vresult;           /* Temp hold return values  */ flash1 = globals.flash_seg_1;
    flash3 = globals.flash_seg_3;
    flash4 = globals.flash_seg_4;
    base = flash1;
/*   send_one_byte (base, CLEAR_STATUS); */
    vresult = 0;
    /* Check if the device is already erased, else prep the device.  */
    cresult = Check_Block_Erased(flash1, (MEM_64K+MEM_48K)/2);
    if (cresult)
    { /* Device is not erased, proceed with erasure process.     */
        send_two_bytes (flash1, ERASE_SETUP, ERASE_CONFIRM);
        vresult = Verify_Block_Erasure(base);
        if (vresult != 0)
           goto exit_erase;
    }
    cresult = Check_Block_Erased(flash3, MEM_4K/2);
    if (cresult)
    { /* Device is not erased, proceed with erasure process.     */
        send_two_bytes (flash3, ERASE_SETUP, ERASE_CONFIRM);
        vresult = Verify_Block_Erasure(base);
        if (vresult != 0)
           goto exit_erase;
    }
    cresult = Check_Block_Erased(flash4, MEM_4K/2);
    if (cresult)
    { /* Device is not erased, proceed with erasure process.     */
        send_two_bytes (flash4, ERASE_SETUP, ERASE_CONFIRM);
```

-150-

```c
        vresult = Verify_Block_Erasure(base);
    }
exit_erase:                             /* Return the device to normal mode   */
    send_one_byte (base, READ_MODE2);
    return (vresult);
}
/*********************************************************************/
/* FPPINTEL.C        Verify Erasure                                  */
/*                                                                   */
/* Purpose: This routine checks the device under VPP=HIGH to see if the */
/*    device block has been erased. This routine expects VPP = HIGH.  */
/*                                                                   */
/* Return Values:                                                    */
/*    0 - Success. Device has been completely erased.                */
/*    2 - Vpp low detected.                                          */
/*    4 - Erasing error.                                             */
/*    8 - Command sequence error.                                    */
/*                                                                   */
/*********************************************************************/
extern unsigned char get_status (unsigned long);
int near
Verify_Block_Erasure(unsigned long base)
{
        unsigned char srd;
        int i,j,result;
    /* Check if device is already erased.                        */
        Set_Display_Start ();
        i = 0;
        j = 0;
        send_one_byte(base, READ_STATUS);
        Hw_Delay(TEN_MS);
        srd = get_byte(base);
        while (srd < 0x80U)           /* Check the Write Machine's status */
        {
                    /* If busy, continue to read status */
            j++;
            if (j == 16)
              {
                    j = 0;
                    i++;
                    if (i == 4)
                      i = 0;
                    Display_Prog_Num(i);
              }
            send_one_byte(base, READ_STATUS);
            Hw_Delay(TEN_MS);
            srd = get_byte(base);
        } /* end while */
        if (srd & 0x08U)
        { /* Vpp range error */
            result = VPP_RANGE_ERROR;
        }
        else if ((srd & 0x30U) == 0x30U)
        { /* Command sequence error */
            result = COMM_SEQ_ERROR;
        }
        else if (srd & 0x40U)
        { /* Block erase error */
            result = ERASE_ERROR;
```

-151-

```c
    )
    else
    { /* Successful erasure */
        result = SUCCESS;
    }
    send_one_byte (base, CLEAR_STATUS);
    return(result);
}

/******************************************************************/
/* FPPINTEL.C              Intel Program2                         */
/*                                                                 */
/* Purpose: This routine programs the 120K data buffer into the FLASH */
/*      EPROM device 28F001BX.                                     */
/*                                                                 */
/* Parameters:                                                     */
/*      data_block_1 - ptr to the first 64K data block to be programed. */
/*      data_block_2 - ptr to the second 48K data block to be programed.*/
/*      data_block_3 - ptr to the third 4K parameter block.        */
/*      data_block_4 - ptr to the fourth 4K parameter block.       */
/*                                                                 */
/* Return Values:                                                  */
/*      0 - Success. Device has been successfully programmed.      */
/*      2 - Vpp low detected.                                      */
/*      4 - Program error.                                         */
/******************************************************************/
int near
Intel_Program2(unsigned long data_block_1, \
               unsigned long data_block_3, unsigned long data_block_4)
{
    int             results;    /* Temp holds return values    */
    unsigned long   flash;      /* Pointer to flash device     */
    unsigned long   base;       /* Pointer to flash base address*/
    unsigned long   byte_count; /* Counter of device block size */
    unsigned long   prog_data;  /* Pointer to data buffer      */ base = globals.flash_seg_1;
    send_one_byte (base, CLEAR_STATUS);

/***** Work on the main block of 112K  *********************/
    flash = globals.flash_seg_1;
    prog_data = data_block_1;
    byte_count = MEM_64K + MEM_48K;
    results = Program_Block(flash, base, byte_count, prog_data);
        /***** Work on the first parameter block of 4K *************/
                                /* Establish descriptors for the Flash & Data */
    if (results == SUCCESS)
    {
        flash = globals.flash_seg_3;
        prog_data = data_block_3;
        byte_count = MEM_4K;
        results = Program_Block(flash, base, byte_count, prog_data);
    }
        /***** Work on the fouth block of 4K   *********************/
                                /* Establish descriptors for the Flash & Data */
    if (results == SUCCESS)
    {
        flash = globals.flash_seg_4;
        prog_data = data_block_4;
        byte_count = MEM_4K;
```

-152-
```
    results = Program_Block(flash, base, byte_count, prog_data);
}
/***** Finish up and exit to caller *****************************/
                                /* Return the device to normal mode    */
    send_one_byte (base, READ_MODE2);

return (results);
}
/*****************************************************************/
/* FPPINTEL.C            Program Block                           */
/*                                                               */
/* Purpose: This routine programs a single block of the flash device  */
/*      with the data passed into the block addressed by the passed   */
/*      pointer.  This routine expects the VPP line to be in its high */
/*      state.                                                   */
/*                                                               */
/* Parameters:                                                   */
/*      flash    - Pointer to the byte to program in the device. */
/*      data_byte - the data value to program in the device.     */
/*                                                               */
/* Return Values:                                                */
/*      0 - Success. Device has been successfully programmed.    */
/*      2 - Vpp low detected.                                    */
/*      4 - Program error.                                       */
/*****************************************************************/ int near
Program_Block(unsigned long flash, unsigned long base, unsigned long size, unsigned long prog_data)
{
    int result, i, j;              /* Temp holds return values */
    unsigned long byte_count = size;
    result = PROG_ERROR;
    Set_Display_Start ();
    i = 0;
    j = 0;
    while (byte_count-- != 0)       /* Program all bytes of block  */
    {
        result = Program_Byte2(flash, base, get_byte(prog_data));
        if (result != SUCCESS)
        { /* Error in programming the byte.    */
            break;                 /* Abort with device error     */
        }
        j++;
        if (j == 16)
        {
            j = 0;
            i++;
            if (i == 4)
                i = 0;
            Display_Prog_Num(i);
        }
        flash++;                   /* Advance flash pointer       */
        prog_data++;               /* Advance program data pointer */
    } /* end while */
    return(result);
}

/*****************************************************************/
```

```
/* FPPINTEL.C              Program Byte2                         */
/*                                                                */
/* Purpose: This routine programs a single byte of the flash device */
/*       with the data passed into the addressed by the passed pointer. */
/*       This routine expects the VPP line to be in its high state.   */
/*                                                                */
/* Parameters:                                                    */
/*       flash    - Pointer to the byte to program in the device.  */
/*       data_byte - the data value to program in the device.      */
/*                                                                */
/* Return Values:                                                 */
/*       0 - Success. Device has been successfully programmed.    */
/*       2 - Vpp low detected.                                    */
/*       4 - Program error.                                       */
/****************************************************************/ int near
Program_Byte2(unsigned long flash, unsigned long base, unsigned char data_byte)
{
        unsigned char srd;

int result, temp;              /* Temp holds return values */
        temp = data_byte;
        send_two_bytes (flash, PGM_SETUP, temp);
        Delay_10us();
        /* Allow the chip to complete programming    */
    /* Check if device is already programed.                    */
        send_one_byte(base, READ_STATUS);
        Delay_10us();
        srd = get_byte(base);
          while (srd < 0x80U )       /* Check if programming has finished */
          {
        send_one_byte(base, READ_STATUS);
        Delay_10us();
        srd = get_byte(base);
        } /* end while */
        if (srd & 0x08U)
        { /* Vpp range error */
            result = VPP_RANGE_ERROR;
        }
        else if (srd & 0x10U)
        { /* Program error */
            result = PROG_ERROR;
        }
        else
        { /* Successful erasure */
            result = SUCCESS;
        }
                            /* Clear Status Register */
        send_one_byte (base, CLEAR_STATUS);
    return(result);
}
/****************************************************************/
/* FPPINTEL.C              Intel Erase                            */
/*                                                                */
/* Purpose: This routine is responsible for erasing the entire FLASH */
/*       memory device. For this Intel part, the erasure process is a */
/*       two part process. First the part must be programmed to all 0's, */
/*       then the erase command is used to clear the part.         */
/*                                                                */
```

-154-
```
/* Parameters: none.                                                     */
/*                                                                       */
/* Return Values:                                                        */
/*      0 - Success. Device has been completely erased.                  */
/*      1 - Device Error. The device still failed after all retries.     */
/*                                                                       */
/*************************************************************************/
int near
Intel_Erase()
{
    int     results, vresult, vresult1, vresult2;    /* Temp holds return values */
    int     erase_retries;          /* Number of times to try erasure  */

/* Check if the device is already erased, else prep the device.     */
    results = Check_Device_Erased(globals.flash_seg_low, MEM_64K);
    results |= Check_Device_Erased(globals.flash_seg_high, MEM_64K);
/*      for (i = 0; i < 100; i++)
                Hw_Delay(TEN_MS);       /* Allow the chip to complete erasure  */
*/   if (results)
        { /* Device is not erased, proceed with erasure process.         */
            erase_retries = 1000;       /* Load upper limit of attempts */
            while (erase_retries--)     /* Attempt to erase device.     */
            {
        send_two_bytes (globals.flash_seg_low, ERASE_SETUP, ERASE_ALL);
                Hw_Delay(TEN_MS);       /* Allow the chip to complete erasure  */
            vresult1 = Verify_Erasure(globals.flash_seg_low, MEM_64K);
            vresult2 = Verify_Erasure(globals.flash_seg_high, MEM_64K);
            vresult = vresult1 && vresult2;
            if (vresult)
                { /* Device has been completely erased. Finish up & exit */
                    results = SUCCESS;  /* Record erasure status        */
                    break;              /* Leave the while loop         */
                }
            } /* end while */
                                        /* Return the device to normal mode */
        }
        send_one_byte (globals.flash_seg_low, READ_MODE);
    return (results);
}

/*************************************************************************/
/* FPPINTEL.C          Check Device Erased                               */
/*                                                                       */
/* Purpose: This routine checks a block of the flash device to see if    */
/*      it is erased. If it is, a return code is passed back indicating  */
/*      this condition. If the block is NOT erase, then all bytes in     */
/*      the block are programmed to zero (0) in preparation for a device */
/*      erasure command cycle. This routine expects VPP to be LOW.       */
/*                                                                       */
/* Parameters:                                                           */
/*      flash   - far pointer to the block to be tested.                 */
/*      size    - size (in bytes) of the block to be tested. Max 65535   */
/*                                                                       */
/* Return Values:                                                        */
/*      FALSE   - Block tested to be fully erased.                       */
/*      TRUE    - Block had at least one non-erased byte.                */
/*                                                                       */
/*************************************************************************/
int near
Check_Device_Erased(unsigned long flash, unsigned long size)
```

-155-

```c
{
  int             result, i, j;
  /* Check if device is already erased.                           */
  result = Check_Block_Erased (flash, size/2);
  if (result == 0)
  { /* Above loop completed with no error    */
      return (FALSE);              /* Device block is erased.     */
  }
  /* Set all memory locations to zero prior to erasure command.   */
  Set_Display_Start ();
  i = 0;
  j = 0;
  for ( ; size > 0 ; size--, flash++)
  {
      if (get_byte(flash) != 0)
        { /* Force all bytes to zero in prep for programming  */
          if (Program_Byte(flash, (unsigned char)0x00))
          { /* Error in programming the byte. */
              return (TRUE);       /* return the error.           */
          }
          j++;
          if (j == 16)
          {
              j = 0;
              i++;
              if (i == 4)
                 i = 0;
              Display_Prog_Num(i);
          }
      }
  } /* end for */
  return (TRUE);                   /* return with an error.       */
}

/**************************************************************/
/* FPPINTEL.C        Verify Erasure                            */
/*                                                             */
/* Purpose: This routine checks the device under VPP=HIGH to see if the */
/*     device block has been erased. This routine expects VPP = HIGH.   */
/*                                                             */
/* Parameters:                                                 */
/*     flash   - far pointer to the flash device block to be tested.   */
/*     size    - size (in bytes) of the block to test. Max 65535.      */
/*                                                             */
/* Return Values:                                              */
/*     TRUE    - Device block is fully erased.                 */
/*     FALSE   - At least one byte in the block was NOT erased. */
/*                                                             */
/**************************************************************/
int near
Verify_Erasure(unsigned long flash, unsigned long size)
{
    int i, j;
    /* Check if device is already erased.                       */
    Set_Display_Start ();
    i = 0;
    j = 0;
    for ( ; size > 0; size--, flash++)
    {
        send_one_byte (flash, ERASE_VERIFY);
```

```
                                                            -156-
        Delay_10us();                  /* Minimum of 6 us are required */
        if (get_byte (flash) != 0xFF)
        { /* Device didn't erase fully. */
            return (FALSE);
        }
        j++;
        if (j == 16)
        {
            j = 0;
            i++;
            if (i == 4)
                i = 0;
            Display_Prog_Num(i);
        }
    } /* end for */
    return(TRUE);
}

/**************************************************************/
/* FPPINTEL.C           Intel Program                         */
/*                                                            */
/* Purpose: This routine programs the 128K data buffer into the FLASH */
/*      EPROM device. The programming loop is repeated upto 25 times  */
/*      to program the device, after which a device error is returned.*/
/*                                                            */
/* Parameters:                                                */
/*      data_block_low  - ptr to low 64K data block to be programmed. */
/*      data_block_high - ptr to high 64K data block to be programmed */
/*                                                            */
/* Return Values:                                             */
/*      0 - Success. Device has been completely programmed.   */
/*      1 - Device Error. The device still failed after all retries. */
/*                                                            */
/**************************************************************/
int near
Intel_Program(unsigned long data_block_low)
{
    int             results, i, j;  /* Temp holds return values   */
    unsigned long   flash;           /* Pointer to flash device    */
    unsigned long   byte_count;      /* Counter of device block size */
    unsigned long   prog_data;       /* Pointer to data buffer     */ results = DEVICE_ERROR;          /* Assume error unitl good end */

/*** Work on the whole block of 128K **********************/
    flash = globals.flash_seg_low;
    prog_data = data_block_low;
    byte_count = 2*MEM_64K;

Set_Display_Start ();
    i = 0;
    j = 0;
    while (byte_count-- != 0)        /* Program all bytes of block */
    {
        results = Program_Byte(flash, get_byte(prog_data));
        if (results != SUCCESS)
        { /* Error in programming the byte.  */
            break;                   /* Abort with device error    */
```

-157-

```c
        }
        flash++;                        /* Advance flash pointer      */
        prog_data++;                    /* Advance program data pointer */
        j++;
        if (j == 16)
        {
              j = 0;
              i++;
              if (i == 4)
                 i = 0;
              Display_Prog_Num(i);
        }
     } /* end while */

/***** Finish up and exit to caller ****************************/
                                        /* Return the device to normal mode  */
        send_one_byte (globals.flash_seg_low, READ_MODE);

return (results);
}

/***************************************************************/
/* FPPINTEL.C              Program Byte                         */
/*                                                              */
/* Purpose: This routine programs a single byte of the flash device */
/*      with the data passed into the addressed by the passed pointer. */
/*      This routine expects the VPP line to be in its high state.    */
/*                                                              */
/* Parameters:                                                  */
/*      flash   - Pointer to the byte to program in the device. */
/*      data_byte - the data value to program in the device.    */
/*                                                              */
/* Return Values:                                               */
/*      0 - Success. Device has been completely erased.         */
/*      1 - Device Error. The device still failed after all retries. */
/*                                                              */
/***************************************************************/ int near
Program_Byte(unsigned long flash, unsigned char data_byte)
{
     int      prog_retries;           /* Number of times to try erasure   */ prog_retries = 25;               /* Load upper limit of attempts */
     while (prog_retries--)
     { /* Attempt to prog device.    */
          send_two_bytes (flash, PGM_SETUP, data_byte);

Delay_10us();
                            /* Allow the chip to complete programming */
          send_one_byte (flash, PGM_VERIFY);
          Delay_10us();               /*Minimum of 6 microseconds are required */ if (get_byte(flash) == data_byte)    /* Check the location to see... */
          { /* Programmed correctly. */
               send_one_byte (flash, READ_MODE);
               return (SUCCESS);      /*  if written data is correct */
          }
     } /* end while */
```

-158-

```c
    send_one_byte (flash, READ_MODE);
    return (DEVICE_ERROR);
}

/********************** for debug ***************************/
#define TIMER_CMD_REG    0x43
#define TIMER2_LATCH     0x42
#define PL_PROG_PORT     0x61     /* Peripheral Interface port */
#define    TIMER2_ENABLE 0x01 /* Bit 0 */
#define    TIMER2_OUT    0x20 /* Bit 5 */

Hw_Delay(int timeout)
{
        asm    MOV     AL, 10110010B;
        asm    OUT     TIMER_CMD_REG, AL;    /* Program channel 2 to mode 1 and use binary */
        _AX = timeout;
        asm    OUT     TIMER2_LATCH, AL;             /* LSB of timeout value, granuity = 1/1.19MHz */
        asm    OUT     TIMER2_LATCH, AX;             /* MSB of timeout value */
        asm    IN      AL, PL_PROG_PORT;
        asm    AND     AL, 11111100B;                /* Disable speaker */
        asm    OR      AL, TIMER2_ENABLE;            /* Enable and start Timer 2 */
        asm    OUT     PL_PROG_PORT, AL;             /* Do it */
DLY10:;
        asm    IN      AL, PL_PROG_PORT;             /* Monitor timer2 output */
        asm    TEST    AL, TIMER2_OUT;
        asm    JNZ     DLY10;                        /* wait for time2 output got stablized */
DLY20:;
        asm    IN      AL, PL_PROG_PORT;             /* Monitor timer2 output */
        asm    TEST    AL, TIMER2_OUT;
        asm    JZ      DLY20;                        /* Not time out yet */
        asm    IN      AL, PL_PROG_PORT;
        asm    AND     AL, 11111110B;                /* Stop timer 2 counting */
        asm    OUT     PL_PROG_PORT, AL;     /* Do it */
} define US_DELAY         0x1
define UTILITY_DATA_GDT 0x38
int near Delay_10us()
{
        asm    MOV     AX,UTILITY_DATA_GDT; /*routine is in protectect mode */
        asm    MOV     DS,AX;
        asm    MOV     BX,OFFSET globals.program_delay_constant;
        asm    MOV     CX,[BX];

DLY10:;
        asm    LOOP    DLY10;
}

/::::::::::::::::::::::End of File::::::::::::::::::::::::::*/
```

```
        PAGE    60,132
            .386P
;********************************************************************
;       This routine is the interface between Flash Programming Utility
; and Boot Block Disk Entry.  This routine must be called in the
; protected mode.
;
; Input: track, sector, head, buffer address.
;
; Output: read status.
;********************************************************************
DGROUP          GROUP           LOADER_SEGMENT, LOADER_DATA
LOADER_DATA     SEGMENT WORD PUBLIC USE16
                PUBLIC MODEL_ID
                PUBLIC GLOBALS
                PUBLIC BOOT_SECTOR
                PUBLIC ROOT_FILE
                PUBLIC SCREEN_IMAGE
                PUBLIC IMAGE_HEADER
                PUBLIC ONE_MS_DELAY
MODEL_ID                DB      "GODZILLA"      ;Machine ID
GLOBALS                 DB      100 DUP (?)     ;Vars for GLOBAL
BOOT_SECTOR             DB      512 DUP (?)     ;Vars for BOOT SECTOR
ROOT_FILE               DB      1024 DUP (?)    ;Vars for ROOT FILE
SCREEN_IMAGE            DB      4000 DUP (?)    ;Vars for SCREEN IMAGE
IMAGE_HEADER            DB      1024 DUP (?)    ;Vars for IMAGE_HEADER
ONE_MS_DELAY            DW      780H            ;Var for ONE_MS_DELAY
LOADER_DATA     ENDS BBLOCK_CS_ENTRY         EQU     0008H
BBLOCK_DISK_OFFSET      EQU     0FFF8H
BB_RESET                EQU     0FFF0H
PPFLOPPY_ENTRY          EQU     0000H
DISK_CONTROL_PORT       EQU     03F2H
DISK_IO_ENABLE          EQU     0CH
CHANGE_ERROR            EQU     06H
READ_STATUS             EQU     70H
SCP_STATUS              EQU     64H
SCP_CMD                 EQU     64H
SCP_DATA                EQU     60H
SCP_CMD_READY           EQU     02H
SCP_NOOP                EQU     0FFH
SCP_ZCMD                EQU     0BFH
SCP_HARD_RESET          EQU     40H LOADER_SEGMENT  SEGMENT BYTE PUBLIC USE16
        ASSUME  CS:LOADER_SEGMENT, DS:DGROUP
.xlist
        include MACRO.LIT       ;ROM macros definitions
        include PROTECT.LIT     ;ROM macros definitions
        include ..\..\genesis\gencpu.lit
        include ..\..\genesis\pm_genio.lit
        include ..\..\genesis\io_genio.lit
.list FIND_NEXT_FAT_INDEX     PROC    NEAR
        PUBLIC  FIND_NEXT_FAT_INDEX
        PUSH    BP
        MOV     BP,SP                   ;Point into stack
```

-160-

```
        PUSHREG <ES, EBX, CX, DX>
        MOV     AX, BBLOCK_DATA_GDT
        MOV     ES, AX
        MOV     EAX, 0
        MOV     BX, WORD PTR [BP+4]      ;Get current index and save in AX
        MOV     AX, WORD PTR [BX]
        MOV     EBX, DWORD PTR [BP+6]        ;Load FAT address
        MOV     CX, AX
        SHL     AX, 1                    ;AX = cluster * 2
        ADD     AX, CX                   ;AX = cluster * 3
        TEST    AX, 01H                  ;Whole or fraction?
        PUSHF                            ;Save status
        SHR     AX, 1                    ;AX = cluster * 1.5
        ADD     EBX, EAX                 ;Point to next entry
        MOV     AX, WORD PTR ES:[EBX]    ;Load next entry
        POPF                             ;If (Whole number)
        JNZ     GETFAT1                  ;Then
        AND     AX, 0FFFH                ;take low 12 bits
        JMP     GETFAT2                  ;
GETFAT1:                                 ;Else
        MOV     CX, 4                    ;take upper 12 bits
        SHR     AX, CL                   ;
GETFAT2:                                 ;Endif
        POPREG  <DX, CX, EBX, ES>
        POP     BP
        RET
FIND_NEXT_FAT_INDEX     ENDP ;****************************************************************
; PPBBINTF.ASM          Checksum Image                           *
;                                                                *
; Purpose: Checksum the image file before it continue to program the *
;       flash. This is to prevent excessive flash programming which  *
;       may shorten the life of flash as well as to prevent corrupting *
;       the good code which is already in flash.                 *
;                                                                *
; Parameters:                                                    *
;       None.                                                    *
; Return Values:                                                 *
;       TRUE - Checksum is OK.                                   *
;       FALSE- This rom image is bad.                            *
;                                                                *
;****************************************************************

CHECKSUM_IMAGE  PROC    NEAR
        PUBLIC  CHECKSUM_IMAGE
        PUSH    BP
        MOV     BP,SP                    ;Point into stack
        PUSHREG <ES, EBX, ECX, DX>
        MOV     AX, BBLOCK_DATA_GDT
        MOV     ES, AX
        MOV     EBX, DWORD PTR [BP+4]    ;EBX: starting address
        MOV     ECX, DWORD PTR [BP+8]
        SHR     ECX, 1                   ;ECX: flash size in word
        XOR     AX, AX                   ;Clear checksum
CZR_10:;
        ADD     AX, WORD PTR ES:[EBX]    ;Add a word into the checksum
        ADC     AX, 0                    ;Add carrys back into checksum
        ADD     EBX, 2                   ;Point to the next word
        AD32
```

```
                                                    -161-
        LOOP    CZR_10              ;Repeat for every word of the ROM
        CMP     AX,1                ;Is the ROM OK?
        JE      CZR_30              ;Yes, return TRUE
CZR_20:;
        MOV     AX, 0               ;No, return FALSE
CZR_30:;
        POPREG  <DX, ECX, EBX, ES>
        POP     BP
        RET
CHECKSUM_IMAGE  ENDP INTERF_READ_SECTOR      PROC    NEAR
        PUBLIC  INTERF_READ_SECTOR
        PUSH    BP
        MOV     BP,SP               ;Point into stack
        PUSHREG <DS, ES, ESI, EDI, EBX, ECX, EDX>
;
; Read the sector
;
        MOV     AX, [BP+4]          ;Load current track number
        MOV     CL, 8               ;Times for bit shift
        SHL     AX, CL
        MOV     CH, AH              ;CH = current track number
        MOV     DX, [BP+8]          ;Load current head number
        SHL     DX, CL              ;DH = current head number
        MOV     AX, [BP+6]          ;Load current sector number
        MOV     CL, AL              ;CL = current sector number
        MOV     EBX, DWORD PTR [BP+10]      ;EBX = buffer address
        MOV     AX, OFFSET BRET
        PUSH    CS                  ;Push segment onto stack
        PUSH    AX                  ;Push offset onto stack
        MOV     AX, 0201H           ;Read one sector from disk
        JMPF    BBLOCK_DISK_OFFSET, BBLOCK_CS_ENTRY   ;Access boot block disk utility
BRET:;
        MOV     AX, 0
        JNC     PRET
        MOV     AX, 1
PRET:;
        POPREG  <EDX, ECX, EBX, EDI, ESI, ES, DS>
        POP     BP
        RET
INTERF_READ_SECTOR      ENDP PAGE
;************************************************************
;
; INTERF_DISK_CHANGE:
;
; This routine is called by Flash Programming Utility to check the
; status of disk change.
;
; Input:
;       None
;
; Output:
;       Status of disk change stored in AH
;
; Usage:
;       ???????
;************************************************************
INTERF_DISK_CHANGE      PROC    NEAR
```

-162-

```
        PUBLIC  INTERF_DISK_CHANGE

PUSH    BP
        MOV     BP,SP                   ;Point into stack
        PUSHREG <DS, ES, ESI, EDI, EBX, ECX, EDX>
;
; Read the sector
;
AGAIN:  MOV     DX, 0                   ;Head 0, drive 0
        MOV     CX, 0002H               ;Track 0, sector 2
        MOV     EBX, DWORD PTR [BP+4]           ;Load image buffer
;
; Try to read the status of disk change
;
        MOV     AX, OFFSET CRET
        PUSH    CS                      ;Push segment onto stack
        PUSH    AX                      ;Push offset onto stack
        MOV     AX, 0201H               ;Read one sector from disk
        JMPF    BBLOCK_DISK_OFFSET, BBLOCK_CS_ENTRY   ;Access boot block disk utility
CRET:   CMP     AH, CHANGE_ERROR
        JNE     AGAIN
        POPREG  <EDX, ECX, EBX, EDI, ESI, ES, DS>
        POP     BP
        RET

INTERF_DISK_CHANGE      ENDP

;****************************************************************
;                       Mach_Program_Setup                       *
;                                                                *
; Purpose: This routine is called just prior to invoking the Flash *
;       programming algorithm. It is responsible for establishing the *
;       machine to a stable state for the programming function.  *
;                                                                *
; Parameters: none.                                              *
;                                                                *
; Return value: none.                                            *
;                                                                *
; Function: This routine stabilizes the disk systems by issuing a disk *
;       BIOS function call to 'reset_disk_system'. The INT 13, sub- *
;       function 00H (drive number > 80H) will reset both the hard disk *
;       and floppy disk controllers, recalibrate the attached drives and*
;       prepare the disks for I/O. For the floppy disk system the dirve *
;       motors are stopped. For the hard disk system, the command should*
;       reset the drive timeout value in the controller and give the *
;       programming algorithm a 60 second period in which to complete. *
;           Finally, the SPRAT device must be configured to place the *
;       Flash device in the FFFE0000 - FFFFFFFF address space.   *
;                                                                *
;****************************************************************

MACH_PROGRAM_SETUP      PROC    NEAR
        PUBLIC  MACH_PROGRAM_SETUP

PUSHREG <DS, ES, EBP, ESI, EDI, EAX, EBX, ECX, EDX>
;
; Try to read the status of disk change
;
        MOV     AX, OFFSET MRET
        PUSH    CS                      ;Push segment onto stack
```

```
                                                        -163-
        PUSH    AX                      ;Push offset onto stack
        MOV     AH, 00H                 ;Reset disk status
        JMPF    BBLOCK_DISK_OFFSET, BBLOCK_CS_ENTRY   ;Access boot block disk utility
MRET:;
        MOV     DX,DISK_CONTROL_PORT;   /* Point to disk hardware port */
        MOV     AL,DISK_IO_ENABLE;      /* Get the command to shut down */
        OUT     DX,AL;                  /* Turn the motors off         */
        POPREG  <EDX, ECX, EBX, EAX, EDI, ESI, EBP, ES, DS>
        RET

MACH_PROGRAM_SETUP    ENDP

;**********************************************************************
;       This routine is to move the contents in the far region into the
; near region of Flash code. This routine must be called in the
; protected mode.
;
; Input: starting address of far region, poiter to near region, number
; of bytes to be moved.
;
; Output: contents into the near region.
;**********************************************************************

MOVE_REGION    PROC    NEAR
        PUBLIC  MOVE_REGION
        PUSH    BP
        MOV     BP,SP                   ;Point into stack
        PUSHREG <ES, EAX, BX, CX, DX>
        MOV     AX, BBLOCK_DATA_GDT
        MOV     ES, AX
        MOV     EAX, DWORD PTR [BP+4]           ;Load starting address of far region
        MOV     BX, WORD PTR [BP+8]     ;Load pointer of near region
        MOV     CX, [BP+10]             ;Load number of words to be moved
BMOVE:;
        MOV     DX, WORD PTR ES:[EAX]
        MOV     WORD PTR [BX], DX
        ADD     EAX, 2
        ADD     BX, 2
        LOOP    BMOVE
        POPREG  <DX, CX, BX, EAX, ES>
        POP     BP
        RET
MOVE_REGION ENDP ;**********************************************************************
;       This routine is to move one row of SCREEN IMAGE into the video
; buffer. This routine must be called in the protected mode.
;
; Input: starting position of SCREEN IMAGE
;
; Output: contents into the video buffer.
;**********************************************************************

SEND_ROW       PROC    NEAR
        PUBLIC  SEND_ROW
        PUSH    BP
        MOV     BP,SP                   ;Point into stack
        PUSHREG <ES, EDI, EAX, BX, CX, DX>
        MOV     AX, BBLOCK_DATA_GDT
        MOV     ES, AX
```

-164-

```
        MOV     EAX, 0008B000H      ;Load starting address of video buffer
        MOV     EDI, 0
        MOV     DI, WORD PTR [BP+4]             ;Load position of starting video cell
        SHL     DI, 1               ;Times 2
        ADD     EAX, EDI                        ;Calculate starting position for receiving image
        MOV     CX, WORD PTR [BP+6]             ;Move 80 video cells
        MOV     BX, OFFSET DGROUP:SCREEN_IMAGE
VMOVE:;
        MOV     DX, WORD PTR [BX + DI] ;Move screen image into video buffer
        MOV     WORD PTR ES:[EAX], DX
        ADD     EAX, 2
        ADD     DI, 2
        LOOP    VMOVE
        POPREG  <DX, CX, BX, EAX, EDI, ES>
        POP     BP
        RET
SEND_ROW ENDP ;******************************************************************
;       This routine is to move one cell of SCREEN IMAGE into the video
; buffer.  This routine must be called in the protected mode.
;
; Input: position of SCREEN IMAGE
;
; Output: contents into the video buffer.
;******************************************************************

SEND_CHARACTER PROC    NEAR
        PUBLIC  SEND_CHARACTER
        PUSH    BP
        MOV     BP,SP               ;Point into stack
        PUSHREG <ES, EDI, EAX, BX, DX>
        MOV     AX, BBLOCK_DATA_GDT
        MOV     ES, AX
        MOV     EAX, 0008B000H      ;Load starting address of video buffer
        MOV     EDI, 0
        MOV     DI, WORD PTR [BP+4]             ;Load position of starting video cell
        SHL     DI, 1               ;Times 2
        ADD     EAX, EDI                        ;Calculate starting position for receiving image
        MOV     BX, OFFSET DGROUP: SCREEN_IMAGE
        MOV     DX, WORD PTR [BX + DI] ;Move screen image into video buffer
        MOV     WORD PTR ES:[EAX], DX
        POPREG  <DX, BX, EAX, EDI, ES>
        POP     BP
        RET
SEND_CHARACTER ENDP ;******************************************************************
;       This routine is to check the erasure of one block of flash ROM.
; This routine must be called in the protected mode.
;
; Input: starting address and the size of the block.
;
; Output: status of erasure.
;******************************************************************

CHECK_BLOCK_ERASED      PROC    NEAR
        PUBLIC  CHECK_BLOCK_ERASED
        PUSH    BP
        MOV     BP,SP               ;Point into stack
```

-165-

```
        PUSHREG <ES, EBX, ECX, DX>
        MOV     AX, BBLOCK_DATA_GDT
        MOV     ES, AX
        MOV     EBX, DWORD PTR [BP+4]      ;Load starting address of the block
        MOV     ECX, DWORD PTR [BP+8]
CBERA:;
        MOV     AX, WORD PTR ES:[EBX]
        CMP     AX, 0FFFFH
        JNE     CERR
        ADD     EBX, 2
        AD32
        LOOP    CBERA
        MOV     AX, 0
        JMP     CEXIT
CERR:   MOV     AX, 1
CEXIT:;
        POPREG  <DX, ECX, EBX, ES>
        POP     BP
        RET
CHECK_BLOCK_ERASED ENDP ;**********************************************************************
;       This routine is to send two bytes to establish the erasing or
; programming sequence for Intel flash memory.
; It is running in the protected mode, using Boot Block GDT.
;
; Input: one address in the block and two sequence bytes.
;**********************************************************************

SEND_TWO_BYTES PROC   NEAR
        PUBLIC  SEND_TWO_BYTES
        PUSH    BP
        MOV     BP,SP                      ;Point into stack
        PUSHREG <ES, AX, EBX, DX>
        MOV     AX, BBLOCK_DATA_GDT
        MOV     ES, AX
        MOV     EBX, DWORD PTR [BP+4]      ;Load starting address of the block
        MOV     DX, WORD PTR [BP+8]
        MOV     AX, WORD PTR [BP+10]
        MOV     BYTE PTR ES:[EBX], DL
        MOV     BYTE PTR ES:[EBX], AL
        POPREG  <DX, EBX, AX, ES>
        POP     BP
        RET
SEND_TWO_BYTES ENDP ;**********************************************************************
;       This routine is to read the flash status during erasing or
; programming one block of Intel flash 28001BX. It is running in the
; protected mode, using Boot Block GDT.
;
; Input: base address of the flash.
; Output: status of the flash.
;**********************************************************************

GET_STATUS     PROC   NEAR
        PUBLIC  GET_STATUS
        PUSH    BP
        MOV     BP,SP                      ;Point into stack
        PUSHREG <ES, EBX>
```

-166-

```
        MOV     AX, BBLOCK_DATA_GDT
        MOV     ES, AX
        MOV     EBX, DWORD PTR [BP+4]        ;Load starting address of the block
        MOV     BYTE PTR ES:[EBX], READ_STATUS
        MOV     AL, BYTE PTR ES:[EBX]
        POPREG  <EBX, ES>
        POP     BP
        RET
GET_STATUS      ENDP
;*****************************************************************
;
;       This routine is to send one byte to the specific address of the
; ROM. It is running in the protected mode, using Boot Block GDT.
;
; Input: address of the flash.
;*****************************************************************

SEND_ONE_BYTE   PROC    NEAR
        PUBLIC  SEND_ONE_BYTE
        PUSH    BP
        MOV     BP,SP                ;Point into stack
        PUSHREG <ES, EBX>
        MOV     AX, BBLOCK_DATA_GDT
        MOV     ES, AX
        MOV     EBX, DWORD PTR [BP+4]        ;Load starting address of the block
        MOV     AX, WORD PTR [BP+8]
        MOV     BYTE PTR ES:[EBX], AL
        POPREG  <EBX, ES>
        POP     BP
        RET
SEND_ONE_BYTE   ENDP ;*****************************************************************
;       This routine is to read one byte of the flash rom at the specific
; address. It is running in the protected mode, using Boot Block GDT.
;
; Input: address of the rom.
; Output: content at that address.
;*****************************************************************

GET_BYTE        PROC    NEAR
        PUBLIC  GET_BYTE
        PUSH    BP
        MOV     BP,SP                ;Point into stack
        PUSHREG <ES, EBX>
        MOV     AX, BBLOCK_DATA_GDT
        MOV     ES, AX
        MOV     EBX, DWORD PTR [BP+4]        ;Load starting address of the block
        MOV     AL, BYTE PTR ES:[EBX]
        POPREG  <EBX, ES>
        POP     BP
        RET
GET_BYTE        ENDP PAGE
;*****************************************************************
; ENABLE_FLASH_ROM:
;       will enable the FLASH ROM (0FC0000H - 0FDFFFFH).
;
; NOTE! Problems have been seen with UNIX and the FLASH programming code
;       when ROM space has been left cacheable (cacheing the ROM makes it
```

```
                                                          -167-
;       look like read/write memory). The Genesis Chip Set only allows a
;       max. of 128k to be marked as non-cacheable. Therefore the FLASH ROM
;       is disabled during normally operation and only enabled when needed
;
; Input:
;       NONE
; Output:
;       NONE
;
; Usage:
;       AX,DX
;*********************************************************************
ENABLE_FLASH_ROM        PROC    NEAR
        PUBLIC  ENABLE_FLASH_ROM PUSHREG <AX, DX>
            IN      AL,CPUPWRMODE               ;
            AND     AL,NOT UNIT_SEL_MSK         ;
            OUT     CPUPWRMODE,AL               ;Close all units
            SET_GENIO_BIT ROMCS_DEC,ROM256KEN   ;Enable 256K ROM
            IN      AL,CPUPWRMODE               ;
            AND     AL,NOT UNIT_SEL_MSK         ;
            OR      AL,EXT_BUS_UNIT_SEL         ;
            OUT     CPUPWRMODE,AL               ;Open external bus unit
            MOV     DX,EBC1CR                   ;
            IN      AX,DX                       ;
            OR      AX,EBANK_2_1 OR FLASH_BIOS_WRITE_EN
            OUT     DX,AX                       ;Enable 2 ROM chip select
            MOV     DX,ATWINDOW                 ;
            IN      AX,DX                       ;
            OR      AX,BIOS256KEN               ;
            OUT     DX,AX                       ;Enable 256K ROM space
            CALL    MAKE_FLASH_NONCACHEABLE     ;Make FLASH ROM noncacheable
MEFR_10:
            POPREG  <DX, AX>
            RET                                 ;Return to caller

ENABLE_FLASH_ROM        ENDP

PAGE
;*********************************************************************
; MAKE_FLASH_NONCACHEABLE:
;
;       will make the FLASH ROM non-cacheable. This is needed
; because cacheing the FLASH ROM confuses the FLASH PROGRAMMING
; algorithm which does reads and writes to the FLASH ROM. If the flash
; is cached, a write cycle to the FLASH will update the cache and the
; next read will come from the cache not the FLASH ROM.
;
; NOTE! This routine assumes CPUPWRMODE is already unlocked
;
; Input:
;       NONE
; Output:
;       NONE
;
; Usage:
;       AX,DX
;*********************************************************************
MAKE_FLASH_NONCACHEABLE PROC NEAR
```

-168-

```
        PUBLIC MAKE_FLASH_NONCACHEABLE

PUSHREG <AX, DX>
        IN      AL,CPUPWRMODE           ;
        AND     AL,NOT UNIT_SEL_MSK     ;
        OR      AL,INT_BUS_UNIT_SEL     ;
        OUT     CPUPWRMODE,AL           ;Open internal bus unit
        MOV     DX,NCDCR                ;
        MOV     AX,03DF8H               ;
        OUT     DX,AX                   ;
        MOV     DX,NCECR                ;
        MOV     AX,03DF9H               ;
        OUT     DX,AX                   ;
        MOV     DX,NCFCR                ;
        MOV     AX,03DFAH               ;
        OUT     DX,AX                   ;
        MOV     DX,NCGCR                ;
        MOV     AX,03DFBH               ;
        OUT     DX,AX                   ;Make FLASH ROM non-cacheable
        IN      AL,CPUPWRMODE           ;
        AND     AL,NOT UNIT_SEL_MSK     ;
        OUT     CPUPWRMODE,AL           ;Close all units
        POPREG  <DX,AX>
        RET

MAKE_FLASH_NONCACHEABLE ENDP

CHANGE_GDT      PROC    NEAR
        PUBLIC  CHANGE_GDT
        PUSH    AX
        OP32                            ;Go into protected mode
        LGDT    CS:PP_GDT_GDTR ;
        MOV     AX,BBLOCK_DATA_GDT
        MOV     ES,AX                   ;Point ES to entire memory space
        MOV     DS,AX                   ;Point DS to BIG GDT
        MOV     AX, BBLOCK_VAR_GDT
        MOV     SS, AX
        JMPF    NSBHI_10,LOADER_CS_GDT  ;Clear instruction que
NSBHI_10:
;
        POP     AX
        RET
CHANGE_GDT      ENDP START_FLASH_CODE        PROC    NEAR
        PUBLIC  START_FLASH_CODE
;
; Execute the flash code
;
        PUSH    AX
        MOV     AX,BBLOCK_DATA_GDT
        MOV     ES,AX                   ;Point ES and DS to big GDT
        MOV     AX,UTILITY_DATA_GDT     ;Point DS to Utility GDT
        MOV     DS,AX
        POP     AX
        JMPF    PPFLOPPY_ENTRY,UTILITY_CS_GDT   ;Enter the loader
        JMP     $                       ;Should never reach here
START_FLASH_CODE ENDP

COLD_RESET      PROC NEAR
```

```
        PUBLIC  COLD_RESET
        PUSH    AX
ML1:
        IN      AL,SCP_STATUS
        TEST    AL,SCP_CMD_READY
        JNZ     ML1
        MOV     AL,SCP_ZCMD
        OUT     SCP_CMD,AL
ML2:
        IN      AL,SCP_STATUS
        TEST    AL,SCP_CMD_READY
        JNZ     ML2
        MOV     AX, SCP_HARD_RESET
        OUT     SCP_DATA,AL
ML3:
        IN      AL,SCP_STATUS
        TEST    AL,SCP_CMD_READY
        JNZ     ML3
        MOV     AL,SCP_NOOP
        OUT     SCP_CMD,AL
ML4:
        IN      AL,SCP_STATUS
        TEST    AL,SCP_CMD_READY
        JNZ     ML4
        POP     AX
        JMPF    BB_RESET, BBLOCK_CS_ENTRY     ;Cold reset
COLD_RESET      ENDP
;****************************************************************
;
; This GDT is used to access the OEM ROM which if present will be located
; at 0FFFE0000. The OEM ROM is copied to the slushware at 000E0000.
;
; This GDT is also used by the cache test.
;
;****************************************************************
PP_GDT_GDTR     LABEL   DWORD           ;GDTR image for POWER_UP_GDT
        PUBLIC  PP_GDT_GDTR
                DW      PP_GDT_LEN      ;Limit, 15..0
                DW      OFFSET PP_GDT   ;Base, 15..0
                DW      0000H           ;Base, 32..16

PP_GDT:
        PUBLIC  PP_GDT
;
; A null descriptor
;
PP_NUL_GDT      SEGMENT_DESCRIPTOR      <0,0,0,0,0>
;
; A descriptor for the boot block code segment (FFFFC000H to FFFFFFFFH)
;
BBLOCK_CS_GDT   EQU     $ - PP_GDT
        PUBLIC  BBLOCK_CS_GDT
                DW      0FFFFH          ;Seg. lmt. 15..0
                DW      00000H
                DB      0FFH
                DB      SDF_PRESENT+SDF_TYPE_EXEC+ESDF_READ_ENABLE+ESDF_ACCESSED
                DW      0FF00H
;
; A descriptor for the system BIOS ROM code segment (FFFD0000H to FFFDFFFFH)
;
```

-170-

```
SYSTEM_CS_GDT   EQU     $ - PP_GDT
        PUBLIC  SYSTEM_CS_GDT
                DW      -1              ;Seg. lmt. 15..0
                DW      0
                DB      0FDH
                DB      SDF_PRESENT+SDF_TYPE_EXEC+ESDF_READ_ENABLE+ESDF_ACCESSED
                DW      0FF00H
;
; A descriptor for a data segment between 0 and FFFFFFFFH
;
BBLOCK_DATA_GDT EQU     $ - PP_GDT
        PUBLIC  BBLOCK_DATA_GDT
                DW      -1              ;Seg. lmt. 15..0
                DW      0               ;Seg. base 15..0
                DB      0               ;Seg. base 23..16
                DB      SDF_PRESENT+SDF_TYPE_DATA+DSDF_WRITE_ENABLE+DSDF_ACCESSED
                DB      SDF_GRANULARITY OR 0FH ; 386 type bits and Seg. lmt. 19..16
                DB      0               ;Seg. base 31..24
;
; A descriptor for data segment between 09C000H and 09FFFFH
;
BBLOCK_VAR_GDT  EQU     $ - PP_GDT
        PUBLIC  BBLOCK_VAR_GDT
                DW      2000H           ;Seg lmt. 15..0
                DW      0C000H          ;Seg base 15..0
                DB      009H            ;Seg base 23..16
                DB      SDF_PRESENT+SDF_TYPE_DATA+DSDF_WRITE_ENABLE+DSDF_ACCESSED
                DW      0
;
; A descriptor for the loader read from disk
;
LOADER_CS_GDT   EQU     $ - PP_GDT
        PUBLIC  LOADER_CS_GDT
                DW      8000H           ;Seg limit 15..0
                DW      0000H           ;Seg base 15..0
                DB      000H            ;Seg base 23..16
                DB      SDF_PRESENT+SDF_TYPE_EXEC+ESDF_READ_ENABLE+ESDF_ACCESSED
                DW      0
;
; A descriptor for the utility the loader loads from disk
;
UTILITY_CS_GDT  EQU     $ - PP_GDT
        PUBLIC  UTILITY_CS_GDT
                DW      -1              ;Seg limit 15..0
                DW      8000H           ;Seg base 15..0
                DB      0               ;Seg base 23..16
                DB      SDF_PRESENT+SDF_TYPE_EXEC+ESDF_READ_ENABLE+ESDF_ACCESSED
                DW      0
UTILITY_DATA_GDT        EQU     $ - PP_GDT
        PUBLIC  UTILITY_DATA_GDT
                DW      -1              ;Seg limit 15..0
                DW      8000H           ;Seg base 15..0
                DB      0               ;Seg base 23..16
                DB      SDF_PRESENT+SDF_TYPE_DATA+DSDF_WRITE_ENABLE+DSDF_ACCESSED
                DW      0
PP_GDT_LEN      EQU     $ - PP_GDT

LOADER_SEGMENT  ENDS
```

-171-

END

What is claimed and desired to be secured by Letters Patent of the United States is:

1. A memory system for a computer that allows for updating multiple flash ROMs of different types, each of said different flash ROMs generally programmable using different flash RPM specific software, comprising:
   a first flash read-only-memory (ROM) of a first type, electrically connected in a predetermined circuit, for storing predetermined instruction;
   a second flash ROM of a second type electrically connected in a predetermined circuit, which includes a predetermined protected area for storing predetermined program instructions including a reprogramming utility to enable reprogramming of said first flash ROM and said second flash ROM in the event that their instructions become corrupt;
      means for automatically determining when the data in said first flash ROM and said second flash ROM becomes corrupt;
      means for programming said first and second flash ROMs using a single utility program, said utility program defining at least two user selectable commands that enable a user to select the flash ROM to be updated, each said command corresponding to a different flash ROM, said single utility program being upgradeable to enable different flash ROMs from different manufacturers to be programmed;
   a storage device having one or more ROM image files corresponding to said first and second flash ROMs for use by said utility program;
      means responsive to said predetermined instructions in said second flash ROM for enabling in-circuit reprogramming of said first flash ROM using said one or more ROM image files in the event that said first flash ROM becomes corrupt; and
      means responsive to said predetermined instructions in said second flash ROM for enabling in-circuit reprogramming of said second flash ROM in the event that said second flash ROM becomes corrupt.

2. A memory system as recited in claim 1, further including means for determining the validity of said BIOS instructions in said first flash ROM.

3. A memory system as recited in claim 2, wherein said determining means includes means for performing a checksum of said BIOS instructions in said first flash ROM.

4. A memory system as recited in claim 3, wherein said predetermined program instructions within said second flash ROM include said performing means.

5. A memory system as recited in claim 1, wherein said second flash ROM includes memory partitions defining a plurality of memory sections, each memory section being able to be individually block erased and reprogrammed.

6. A memory system as recited in claim 5, wherein one of said memory sections in said second flash ROM forms said predetermined protected area, said predetermined protected area being hardware protected against data corruption.

7. A memory system as recited in claim 6, further including means for determining the validity of said BIOS instructions in said first flash ROM.

8. A memory system as recited in claim 7, wherein said determining means is stored in said predetermined protected area of said second flash ROM.

9. A memory system as recited in claim 3, wherein BIOS ROM is selected to have a capacity of 128 kilobytes and further includes means for performing a single checksum on at least 128 kilobytes.

10. A memory system as recited in claim 1, wherein said programming means includes means for enabling said first ROM to be programmed from a floppy disc.

11. A memory system as recited in claim 1, wherein said programming means includes means for enabling a preselected portion of said second flash ROM to be programmed from a floppy disc.

12. A memory system for a computer, comprising:
   a first predetermined type of flash read-only-memory (ROM) for storing a first predetermined group of instructions;
   a second predetermined type of flash ROM for storing a second group of predetermined program instructions, wherein said first type and said second type of ROMs are different and each of said types of flash ROMs generally requires different ROM specific programming software;
   first means resident in said second predetermined type of flash ROM for selectably enabling said first and second types of flash ROMs to be programmed using a single utility program, said utility program enabling programming of said flash ROMS by way of one or more ROM image files provided on a storage device, each of said one or more image files compatible with a corresponding one of said first and second types of flash ROMs, said single utility program being upgradeable to enable different flash ROMs from different manufacturers to be programmed; and
   second means for automatically enabling said first type of flash ROM to be reprogrammed in the event it becomes corrupt, said second means executing said second group of predetermined program instructions to reprogram said first type of flash ROM upon first determining that data in said first type of flash ROM is corrupt.

13. A memory system as recited in claim 12, wherein said enabling means includes a second flash ROM with predetermined program instructions.

14. A memory system as recited in claim 12, further including means for determining the validity of said BIOS instructions in said first flash ROM.

15. A memory system as recited in claim 14, wherein said determining means includes means for performing a checksum of the data in said first flash ROM.

16. A memory system as recited in claim 13, wherein said second flash ROM includes a hardware protected area for protecting the data therewithin from becoming corrupt.

17. A memory system for a computer, comprising:
   a first type of flash read only memory (ROM);
   a second type of flash read only memory (ROM) wherein said first flash ROM and said second flash ROM may be of different types, each of said different types of flash ROMs being programmable using different flash ROM specific programming software; and
   means for enabling said first and second flash ROMs to be programmed from a single utility program adapted to read a ROM image file present on a storage device and to program said ROMs with said image file, said single utility program further adapted to be upgradeable to enable different flash ROMs from different manufacturers to be programmed.

18. A memory system as recited in claim 12, further including third means for enabling said second flash ROM to be reprogrammed in the event it becomes corrupt, said third means further executing said utility program to reprogram said second type of flash ROM immediately upon first detecting corruption of said second type of flash ROM.

19. A memory system as recited in claim 17 wherein said storage device is a floppy disc.

20. A method for updating multiple flash ROMs in a computer system, comprising the steps of:

storing a first predetermined group of instructions in a first flash ROM;

storing a second predetermined group of instructions in a predetermined protected area in a second flash ROM, said second flash ROM of a different type than said first flash ROM and generally requiring programming software different than that of said first flash ROM, said second flash ROM partially booting the computer system by initializing predetermined basic hardware components and a storage device during boot-up of said computer and said first flash ROM completing booting the computer, said second predetermined group of instructions further enabling in-circuit reprogramming of both said first flash ROM and said second flash ROM using a single programming utility;

providing data on a storage device for reprogramming said first flash ROM and said second flash ROM; and executing said second group of instructions, said second group of instructions including a program for displaying on-screen prompts prompting for said reprogramming data.

21. The method of claim 20, wherein said first predetermined group of instructions includes instructions for selectably executing flash ROM updates.

22. The method of claim 20, wherein said basic hardware components includes said storage device, video display, and RAM.

23. A memory system in a personal computer system for updating multiple flash ROMs, each of said flash ROMs generally programmable using flash ROM specific programming software, comprising:

a first flash ROM for storing system BIOS instructions;

a second flash ROM, that may be of a different type than said first flash ROM, for partially booting the personal computer system, said second flash ROM further storing miscellaneous system instructions, said second flash ROM including a protected area containing BIOS instructions wherein basic system hardware and a storage device are initialized during said partial boot-up of said personal computer, said first flash ROM BIOS for completing the boot-up of said personal computer; and a first program stored in said first flash ROM for selectably enabling in-circuit reprogramming of said first flash ROM and said second flash ROM using a single utility program, said utility program adapted to use data provided on the storage device.

24. A method in a personal computer having a central processing unit (CPU), random access memory (RAM), a keyboard, and two or more flash ROMs of different types, each said flash ROM generally requiring flash ROM specific programming software for programming, the method comprising the steps of:

storing a single programming utility in one of said flash ROMs, said utility defining at least two user selectable commands that enable a user to select the flash ROM to be updated, wherein said two or more flash ROMs may be programmed using said single programming utility, each said command corresponding to a different flash ROM, said single programming utility being upgradeable to enable different flash ROMs from different manufacturers to be programmed;

monitoring which of said user selectable commands is input to said keyboard;

providing a storage device to update the data in said flash ROMs, said storage device containing an image file corresponding to said flash ROMS to be updated;

parsing the name of said image file and copying said name into a buffer;

reading said image file from said storage device and copying said image file into the RAM; and erasing the existing contents of said selected flash ROM and programming said selected flash ROM with said image file stored in the RAM.

25. The method of claim 24, wherein said step of reading said image file further includes determining the validity of said image file by performing a checksum of said image file.

26. A method in a personal computer having a central processing unit (CPU), random access memory (RAM), a keyboard, and two or more flash ROMs of different types generally requiring flash ROM specific programming software for programming each of said flash ROMs, the method comprising the steps of:

storing a first predetermined group of instructions in a predetermined protected area in one of the flash ROMs, said first group of instructions used to initialize basic hardware systems and a storage device during boot-up of said computer;

storing a second predetermined group of instructions in another of said for completing booting of said computer;

providing a single programming utility in said second flash ROM for providing one or more predetermined commands for selecting which flash ROM is to be updated and for selectably in-circuit reprogramming said selected flash ROM, said single programming utility capable of programming all of said flash ROMs, said programming utility further capable of programming of different flash ROMs from different manufacturers;

providing a storage device to update the data in said flash ROMs, the storage device containing an image file corresponding to said two or more flash ROMS to be updated;

parsing the name of said image file and storing said name in a buffer;

reading said image file from said storage device and copying said image file into RAM; and programming said selected flash ROM with said image file stored in said RAM.

27. The method of claim 20 wherein said data on said storage device is a ROM image file.

28. A personal computer having a central processing unit (CPU), random access memory (RAM), a keyboard, two or more flash ROMs of different types, wherein each of said different type of flash ROM is programmable using different flash ROM specific software, comprising:

a single programming utility stored in one of said flash ROMs, said utility defining at least two user selectable commands that enable a user to select the flash ROM to be updated, each said command corresponding to a different flash ROM and each of said different flash ROMs programmable by way of said single programming utility, said single programming utility adapted to being upgraded to program different flash ROMs from different manufacturers;

means for monitoring which of said user selectable commands is input to said keyboard;

means for updating the data in said flash ROMs by way of a storage device, said storage device containing an image file corresponding to said flash ROMS to be updated;

means for reading said image file from said storage and copying said image file into RAM; and means for erasing the existing contents of said selected flash ROM and programming said selected flash ROM with said image file stored in said RAM.

29. A personal computer having a central processing unit (CPU), random access memory (RAM), and a keyboard, comprising:

a first flash ROM having a protected area, said protected area storing a first predetermined group of instructions, said group of instructions used to initialize basic hardware components during boot-up of said computer;

a second flash ROM of a different type than said first flash ROM, said second flash ROM being programmable using different programming software than said first flash ROM, said second flash ROM for storing a second predetermined group of instructions, said instructions including means for selectably enabling in-circuit reprogramming of said first flash ROM and said second flash ROM;

a utility in said second flash ROM that displays on a screen at least two user-selectable commands which enable a user to select the flash ROM to be updated, said utility enabling both first and second flash ROMs to be updated using only said single programming utility, each said command corresponding to a different flash ROM, said single programming utility adapted to being upgraded to program different flash ROMs from different manufacturers;

a storage device to update the data in said flash ROMs, said storage device containing an image file corresponding to said flash ROM to be updated;

means for parsing the name of said image file, and copying said name into a buffer;

means for reading said image file from said storage device and copying said image file into RAM; and means for programming said selected flash ROM with said image file stored in said RAM.

\* \* \* \* \*

UNITED STATES PATENT AND TRADEMARK OFFICE
CERTIFICATE OF CORRECTION

PATENT NO. : 5,870,520
DATED : February 9, 1999
INVENTOR(S) : Lee et al.

It is certified that error appears in the above-identified patent and that said Letters Patent is hereby corrected as shown below:

IN THE CLAIMS:

Col. 312, line 36; delete "with predetermined program instructions."

Signed and Sealed this

Thirteenth Day of July, 1999

Attest:

Attesting Officer

Q. TODD DICKINSON

Acting Commissioner of Patents and Trademarks